(12) United States Patent
Jo et al.

(10) Patent No.: US 12,096,684 B2
(45) Date of Patent: Sep. 17, 2024

(54) COMPOSITION FOR ORGANIC OPTOELECTRONIC DEVICE, ORGANIC OPTOELECTRONIC DEVICE AND DISPLAY DEVICE

(71) Applicant: SAMSUNG SDI CO., LTD., Yongin-si (KR)

(72) Inventors: Youngkyoung Jo, Suwon-si (KR); Namheon Lee, Suwon-si (KR); Kipo Jang, Suwon-si (KR); Sung-Hyun Jung, Suwon-si (KR); Ho Kuk Jung, Suwon-si (KR); Dong Min Kang, Suwon-si (KR); Jonghoon Ko, Suwon-si (KR); Dongyeong Kim, Suwon-si (KR); Byungku Kim, Suwon-si (KR); Mijin Lee, Suwon-si (KR); Byoungkwan Lee, Suwon-si (KR); Sangshin Lee, Suwon-si (KR); Eunjeong Choi, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 584 days.

(21) Appl. No.: 17/389,591

(22) Filed: Jul. 30, 2021

(65) Prior Publication Data
US 2022/0045282 A1    Feb. 10, 2022

(30) Foreign Application Priority Data

Aug. 10, 2020  (KR) .................. 10-2020-0100006

(51) Int. Cl.
*H01L 51/50*     (2006.01)
*H10K 85/40*     (2023.01)
(Continued)

(52) U.S. Cl.
CPC ......... *H10K 85/6572* (2023.02); *H10K 85/40* (2023.02); *H10K 85/633* (2023.02);
(Continued)

(58) Field of Classification Search
None
See application file for complete search history.

(56) References Cited

U.S. PATENT DOCUMENTS

| 5,061,569 A | 10/1991 | VanSlyke et al. |
| 2020/0111967 A1 | 4/2020 | Lee et al. |

(Continued)

FOREIGN PATENT DOCUMENTS

| CN | 111009612 A | 4/2020 |
| CN | 111320612 A | 6/2020 |

(Continued)

OTHER PUBLICATIONS

Korean Office Action dated Nov. 27, 2023, of the corresponding Korean Patent Application No. 10-2020-0100006.
(Continued)

*Primary Examiner* — Gregory D Clark
(74) *Attorney, Agent, or Firm* — Lee IP Law, P.C.

(57) ABSTRACT

A composition for an organic optoelectronic device, an organic optoelectronic device including the same, and a display device, the composition including a first compound
(Continued)

represented by Chemical Formula 1 and a second compound represented by a combination of Chemical Formula 2 and Chemical Formula 3,

[Chemical Formula 1]

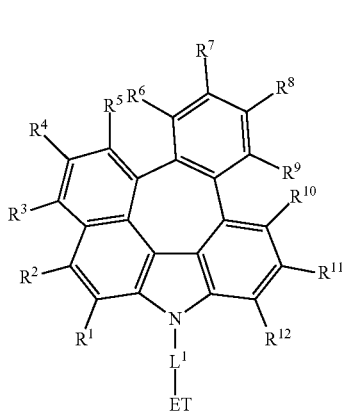

[Chemical Formula 2]

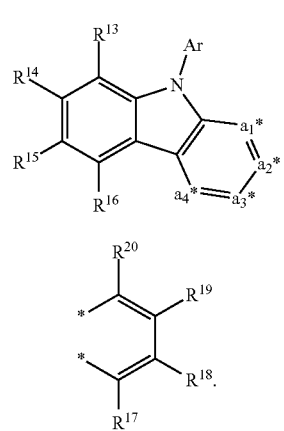

[Chemical Formula 3]

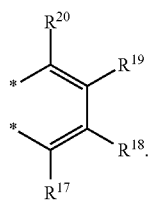

13 Claims, 1 Drawing Sheet

(51) Int. Cl.
 *H10K 85/60* (2023.01)
 *H10K 50/11* (2023.01)
 *H10K 101/10* (2023.01)

(52) U.S. Cl.
 CPC ....... *H10K 85/636* (2023.02); *H10K 85/6574* (2023.02); *H10K 85/6576* (2023.02); *H10K 50/11* (2023.02); *H10K 2101/10* (2023.02)

(56) References Cited

U.S. PATENT DOCUMENTS

| | | | |
|---|---|---|---|
| 2021/0028369 A1* | 1/2021 | Kim | C07D 487/16 |
| 2021/0043848 A1 | 2/2021 | Kim et al. | |
| 2021/0119136 A1 | 4/2021 | Won et al. | |
| 2022/0069226 A1 | 3/2022 | Lee et al. | |

FOREIGN PATENT DOCUMENTS

| | | |
|---|---|---|
| JP | 1993-009471 A | 1/1993 |
| JP | 1995-126615 A | 5/1995 |
| JP | 1998-095973 A | 4/1998 |
| KR | 10-2018-0099510 A | 9/2018 |
| KR | 10-2019-0109261 A | 9/2019 |
| KR | 10-2019-0113589 A | 10/2019 |
| KR | 10-2019-0123138 A | 10/2019 |
| KR | 10-2020-0004253 A | 1/2020 |
| KR | 10-2020-0035769 A | 6/2020 |
| KR | 10-2020-0096174 A | 8/2020 |
| WO | WO 1995/009147 A1 | 4/1995 |

OTHER PUBLICATIONS

Chinese Office Action (including a search report) dated Feb. 7, 2024, of the corresponding Chinese Patent Application No. 202110900918.1.
Korean Notice of Allowance dated May 14, 2024.

\* cited by examiner

COMPOSITION FOR ORGANIC OPTOELECTRONIC DEVICE, ORGANIC OPTOELECTRONIC DEVICE AND DISPLAY DEVICE

CROSS-REFERENCE TO RELATED APPLICATION

This application claims priority to and the benefit of Korean Patent Application No. 10-2020-0100006 filed in the Korean Intellectual Property Office on Aug. 10, 2020, the entire contents of which are incorporated herein by reference.

BACKGROUND

1. Field

Embodiments relate to a composition for an organic optoelectronic device, an organic optoelectronic device, and a display device.

2. Description of the Related Art

An organic optoelectronic device (e.g., organic optoelectronic diode) is a device capable of converting electrical energy and optical energy to each other.

Organic optoelectronic devices may be largely divided into two types according to a principle of operation. One includes a photoelectric device that generates electrical energy by separating excitons formed by light energy into electrons and holes, and transferring the electrons and holes to different electrodes, respectively and another includes a light emitting device that generates light energy from electrical energy by supplying voltage or current to the electrodes.

Examples of the organic optoelectronic device may include an organic photoelectric device, an organic light emitting diode, an organic solar cell, and an organic photoconductor drum.

Among them, organic light emitting diodes (OLEDs) are attracting much attention in recent years due to increasing demands for flat panel display devices. The organic light emitting diode is a device that converts electrical energy into light, and the performance of the organic light emitting diode may be influenced by an organic material between electrodes.

SUMMARY

The embodiments may be realized by providing a composition for an organic optoelectronic device, the composition including a first compound represented by Chemical Formula 1, and a second compound represented by a combination of Chemical Formula 2 and Chemical Formula 3,

[Chemical Formula 1]

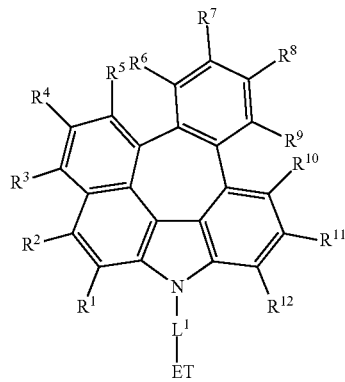

wherein, in Chemical Formula 1, $R^1$ to $R^{12}$ are each independently hydrogen, deuterium, a cyano group, a halogen, a substituted or unsubstituted C1 to C30 alkyl group, or a substituted or unsubstituted C6 to C30 aryl group, $L^1$ is a single bond or a substituted or unsubstituted C6 to C30 arylene group, and ET is a substituted or unsubstituted pyridinyl group, a substituted or unsubstituted pyrimidinyl group, a substituted or unsubstituted triazinyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzofuranpyrimidinyl group, or a substituted or unsubstituted benzothiophenepyrimidinyl group;

[Chemical Formula 2]

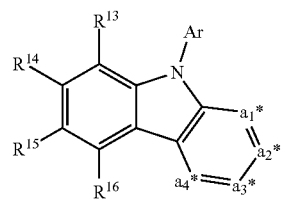

[Chemical Formula 3]

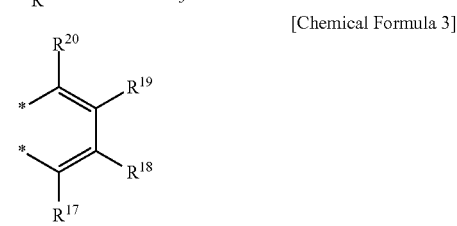

wherein, in Chemical Formula 2 and Chemical Formula 3, Ar is a substituted or unsubstituted C6 to C30 aryl group or a substituted or unsubstituted C2 to C30 heterocyclic group, two adjacent ones of a1* to a4* of Chemical Formula 2 are linking carbons linked at * of Chemical Formula 3, the remaining two of a1* to a4* of Chemical Formula 2, not linked at * of Chemical Formula 3, are $CR^a$, $R^a$ and $R^{13}$ to $R^{20}$ are each independently hydrogen, deuterium, a cyano group, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, and at least one of $R^{17}$ to $R^{20}$ is a group represented by Chemical Formula a,

[Chemical Formula a]

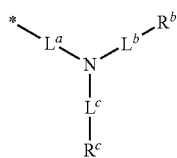

wherein, in Chemical Formula a, $L^a$, $L^b$, and $L^c$ are each independently a single bond, a substituted or unsubstituted C6 to C20 arylene group, or a substituted or unsubstituted C2 to C20 heterocyclic group, $R^b$ and $R^c$ are each independently a substituted or unsubstituted C6 to C30 aryl group or a substituted or unsubstituted C2 to C30 heterocyclic group, and * is a linking point.

The embodiments may be realized by providing an organic optoelectronic device including an anode and a cathode facing each other, and at least one organic layer between the anode and the cathode, wherein the at least one organic layer includes a light emitting layer, and the light emitting layer includes the composition for an organic optoelectronic device according to an embodiment.

The embodiments may be realized by providing a display device including the organic optoelectronic device according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
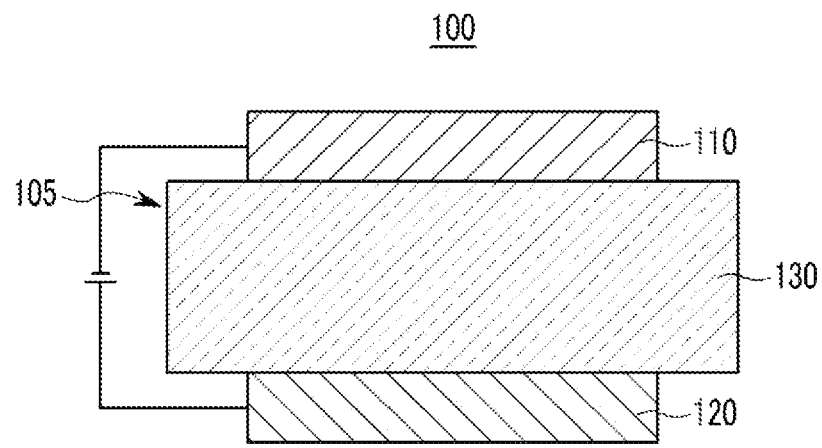
FIGS. 1 and 2 are cross-sectional views each illustrating an organic light emitting diode according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

In one example of the present disclosure, "substituted" refers to replacement of at least one hydrogen of a substituent or a compound by deuterium, a halogen, a hydroxyl group, an amino group, a substituted or unsubstituted C1 to C30 amine group, a nitro group, a substituted or unsubstituted C1 to C40 silyl group, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, a C1 to C20 alkoxy group, a C1 to C10 trifluoroalkyl group, a cyano group, or a combination thereof.

In specific example of the present disclosure, "substituted" refers to replacement of at least one hydrogen of a substituent or a compound by deuterium, a C1 to C30 alkyl group, a C1 to C10 alkylsilyl group, a C6 to C30 arylsilyl group, a C3 to C30 cycloalkyl group, a C3 to C30 heterocycloalkyl group, a C6 to C30 aryl group, a C2 to C30 heteroaryl group, or a cyano group. In specific example of the present disclosure, "substituted" refers to replacement of at least one hydrogen of a substituent or a compound by deuterium, a C1 to C20 alkyl group, a C6 to C30 aryl group, or a cyano group. In specific example of the present disclosure, "substituted" refers to replacement of at least one hydrogen of a substituent or a compound by deuterium, a C1 to C5 alkyl group, a C6 to C18 aryl group, or a cyano group. In specific example of the present disclosure, the "substituted" refers to replacement of at least one hydrogen of a substituent or a compound by deuterium, a cyano group, a methyl group, an ethyl group, a propyl group, a butyl group, a phenyl group, a biphenyl group, a terphenyl group, or a naphthyl group.

As used herein, when a definition is not otherwise provided, "hetero" refers to one including one to three heteroatoms selected from N, O, S, P, and Si, and remaining carbons in one functional group.

As used herein, "an aryl group" refers to a group including at least one hydrocarbon aromatic moiety, and all elements of the hydrocarbon aromatic moiety have p-orbitals which form conjugation, for example a phenyl group, a naphthyl group, and the like, two or more hydrocarbon aromatic moieties may be linked by a sigma bond and may be, for example a biphenyl group, a terphenyl group, a quarterphenyl group, and the like, and two or more hydrocarbon aromatic moieties are fused directly or indirectly to provide a non-aromatic fused ring, for example a fluorenyl group.

The aryl group may include a monocyclic, polycyclic, or fused ring polycyclic (i.e., rings sharing adjacent pairs of carbon atoms) functional group.

As used herein, "a heterocyclic group" is a generic concept of a heteroaryl group, and may include at least one heteroatom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

For example, "a heteroaryl group" may refer to an aryl group including at least one heteroatom selected from N, O, S, P, and Si. Two or more heteroaryl groups are linked by a sigma bond directly, or when the heteroaryl group includes two or more rings, the two or more rings may be fused. When the heteroaryl group is a fused ring, each ring may include one to three heteroatoms.

More specifically, the substituted or unsubstituted C6 to C30 aryl group may be a substituted or unsubstituted phenyl group, a substituted or unsubstituted naphthyl group, a substituted or unsubstituted anthracenyl group, a substituted or unsubstituted phenanthrenyl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted o-terphenyl group, a substituted or unsubstituted chrysenyl group, a substituted or unsubstituted triphenylene group, a substituted or unsubstituted perylenyl group, a substituted or unsubstituted fluorenyl group, a substituted or unsubstituted indenyl group, a substituted or unsubstituted furanyl group, or a combination thereof, but is not limited thereto.

More specifically, the substituted or unsubstituted C2 to C30 heterocyclic group may be a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzofuranpyrimidinyl group, a substituted or unsubstituted benzothiophenepyrimidinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted carbazolyl group, a substituted or unsubstituted dibenzofuranyl group, or a substituted or unsubstituted dibenzothiophenyl group, or a combination thereof, but is not limited thereto.

In the present specification, hole characteristics refer to an ability to donate an electron to form a hole when an electric field is applied and that a hole formed in the anode may be easily injected into the light emitting layer and transported in the light emitting layer due to conductive characteristics according to a highest occupied molecular orbital (HOMO) level.

In addition, electron characteristics refer to an ability to accept an electron when an electric field is applied and that electron formed in the cathode may be easily injected into the light emitting layer and transported in the light emitting layer due to conductive characteristics according to a lowest unoccupied molecular orbital (LUMO) level.

Hereinafter, a composition for an organic optoelectronic device according to an embodiment is described.

A composition for an organic optoelectronic device according to an embodiment may include, e.g., a first compound represented by Chemical Formula 1, and a second compound represented by a combination of Chemical Formula 2 and Chemical Formula 3 (e.g., a mixture of the first compound and the second compound).

[Chemical Formula 1]

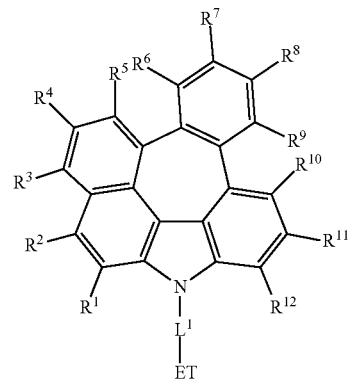

In Chemical Formula 1, $R^1$ to $R^{12}$ may each independently be or include, e.g., hydrogen, deuterium, a cyano group, a halogen, a substituted or unsubstituted C1 to C30 alkyl group, or a substituted or unsubstituted C6 to C30 aryl group. As used herein, the term "or" is not an exclusive term, e.g., "A or B" would include A, B, or A and B.

$L^1$ may be or include, e.g., a single bond or a substituted or unsubstituted C6 to C30 arylene group.

ET may be or include, e.g., a substituted or unsubstituted pyridinyl group, a substituted or unsubstituted pyrimidinyl group, a substituted or unsubstituted triazinyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzofuranpyrimidinyl group, or a substituted or unsubstituted benzothiophenepyrimidinyl group.

[Chemical Formula 2]

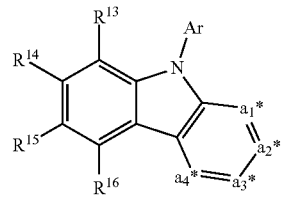

[Chemical Formula 3]

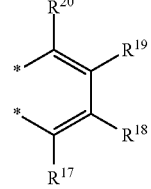

In Chemical Formula 2 and Chemical Formula 3, Ar may be or include, e.g., a substituted or unsubstituted C6 to C30 aryl group or a substituted or unsubstituted C2 to C30 heterocyclic group.

Two adjacent ones of a1* to a4* of Chemical Formula 2 may be linking carbons linked at * of Chemical Formula 3, and the remaining two of a1* to a4* of Chemical Formula 2, not linked at * of Chemical Formula 3, may be $CR^a$. As used herein, the term "linking carbon" refers to a shared carbon at which fused rings are linked.

$R^a$ and $R^{13}$ to $R^{20}$ may each independently be or include, e.g., hydrogen, deuterium, a cyano group, a substituted or unsubstituted amine group, a substituted or unsubstituted C1 to C30 alkyl group, a substituted or unsubstituted C6 to C30 aryl group, or a substituted or unsubstituted C2 to C30 heterocyclic group.

In an implementation, at least one of $R^{17}$ to $R^{20}$ may be, e.g., a group represented by Chemical Formula a.

[Chemical Formula a]

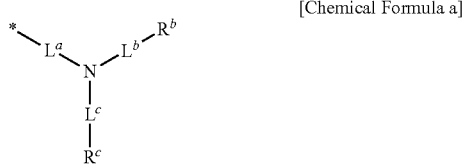

In Chemical Formula a, $L^a$, $L^b$, and $L^c$ may each independently be or include, e.g., a single bond, a substituted or unsubstituted C6 to C20 arylene group, or a substituted or unsubstituted C2 to C20 heterocyclic group.

$R^b$ and $R^c$ may each independently be or include, e.g., a substituted or unsubstituted C6 to C30 aryl group, or a substituted or unsubstituted C2 to C30 heterocyclic group.

* is a linking point.

The first compound represented by Chemical Formula 1 may have a structure advantageous for pi-pi stacking by including a planar core, and thus has a high glass transition temperature relative to its molecular weight, and improved thermal stability.

In an implementation, when applied to an organic light emitting device together with the second compound represented by Chemical Formula 2, charge balance may be achieved to realize a long life-span.

The second compound may have a high HOMO energy by extending the HOMO electron cloud from the amine to the benzocarbazole due to a structure in which benzocarbazole is substituted with an amine, and thus may have excellent hole injection and transport properties.

In addition, benzocarbazole may have a relatively high HOMO energy compared with bicarbazole and indolocarbazole, and a device having a low driving voltage may be implemented by applying the structure in which benzocarbazole is substituted with amine.

In addition, bicarbazole and indolocarbazole may have a high T1 energy, and they may not be suitable as a red host, whereas a structure in which benzocarbazole is substituted with an amine may have a suitable T1 energy as a red host.

In an implementation, ET of Chemical Formula 1 may be, e.g., a substituted or unsubstituted pyrimidinyl group, a substituted or unsubstituted triazinyl group, a substituted or unsubstituted quinazolinyl group, a substituted or unsubstituted quinoxalinyl group, a substituted or unsubstituted benzofuranpyrimidinyl group, or a substituted or unsubstituted benzothiophenepyrimidinyl group.

In an implementation, ET may be, e.g., a substituted or unsubstituted pyrimidinyl group, a substituted or unsubstituted triazinyl group, a substituted or unsubstituted quinazolinyl group, or a substituted or unsubstituted quinoxalinyl group.

In an implementation, when ET is substituted, the substituent may be, e.g., a phenyl group that is substituted or unsubstituted with a C6 to C12 aryl group, a biphenyl group that is substituted or unsubstituted with a C6 to C12 aryl group, a naphthyl group that is substituted or unsubstituted with a C6 to C12 aryl group, an anthracenyl group that is substituted or unsubstituted with a C6 to C12 aryl group, a fluorenyl group that is substituted or unsubstituted with a C6 to C12 aryl group, a dibenzofuranyl group that is substituted or unsubstituted with a C6 to C12 aryl group, a dibenzothiophenyl group that is substituted or unsubstituted with a C6 to C12 aryl group, or a dibenzosilolyl group that is substituted or unsubstituted with a C6 to C12 aryl group.

In an implementation, ET may be a group of Group I.

[Group I]

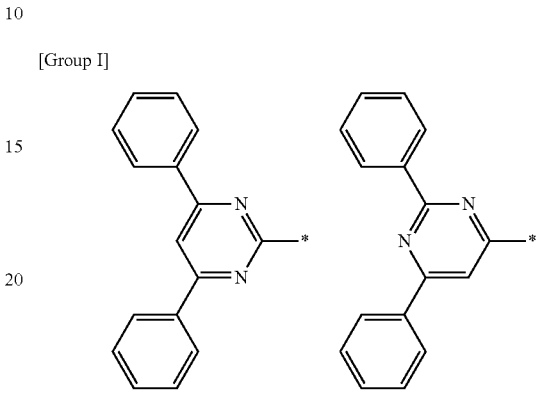

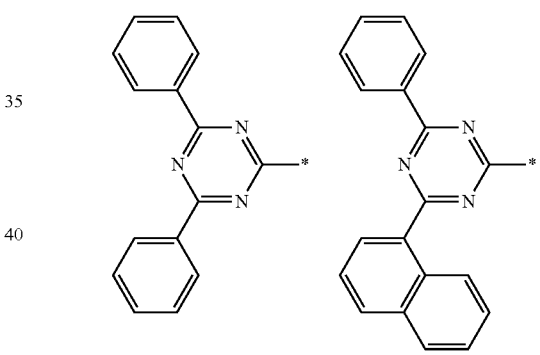

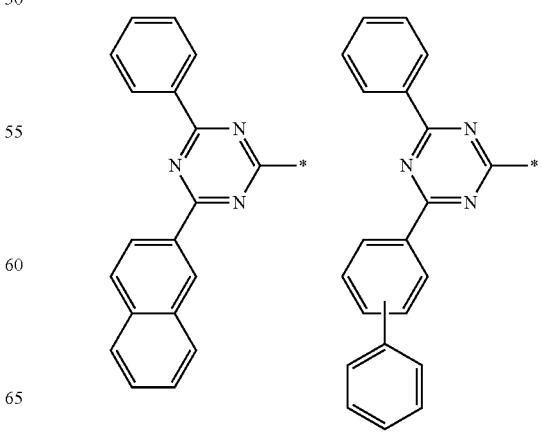

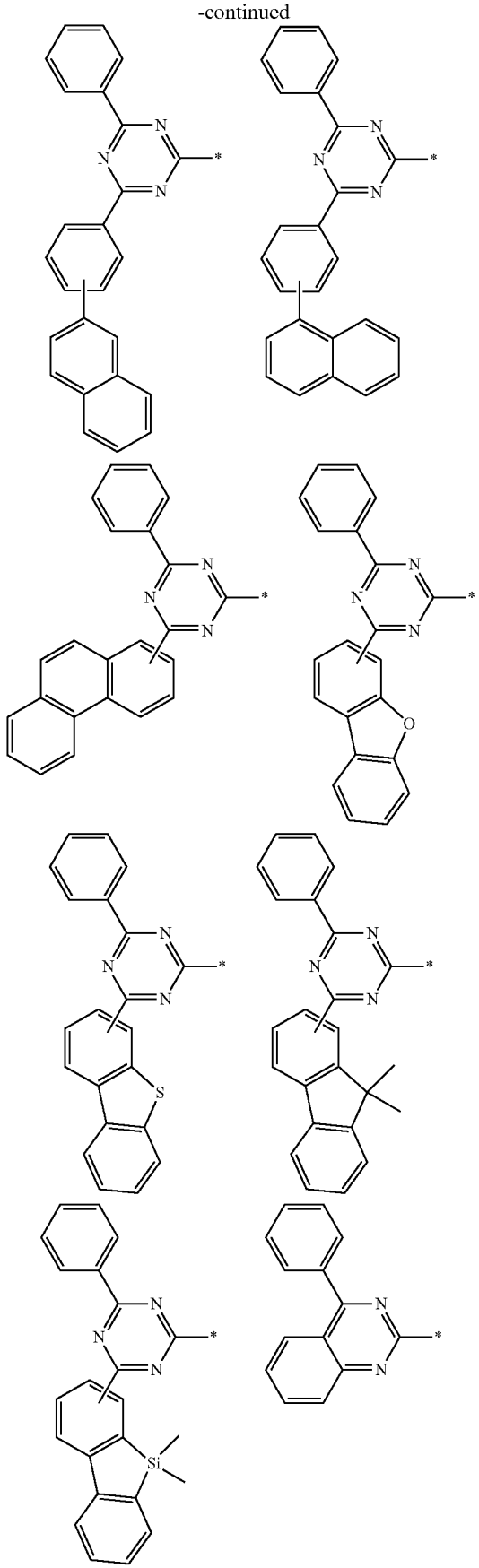
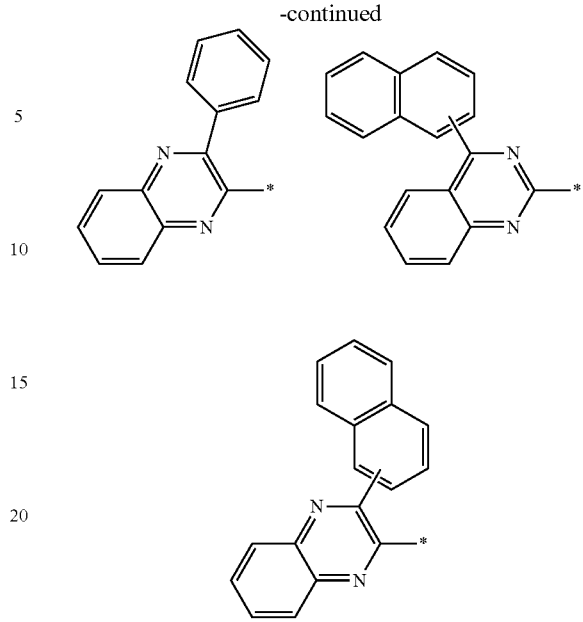

In Group I, * is a linking point.

In an implementation, $L^1$ of Chemical Formula 1 may be, e.g., a single bond, a substituted or unsubstituted phenylene group, or a substituted or unsubstituted biphenylene group.

In an implementation, $L^1$ of Chemical Formula 1 may be, e.g., a single bond or an ortho-phenylene group.

In an implementation, $R^1$ to $R^{12}$ of Chemical Formula 1 may each independently be, e.g., hydrogen, deuterium, a cyano group, a halogen, a substituted or unsubstituted C1 to C10 alkyl group, a substituted or unsubstituted phenyl group, a substituted or unsubstituted naphthyl group, or a substituted or unsubstituted biphenyl group.

In an implementation, $R^1$ to $R^{12}$ of Chemical Formula 1 may each independently be, e.g., hydrogen, deuterium, a cyano group, a halogen, or a substituted or unsubstituted phenyl group.

In an implementation, the first compound may be, e.g., a compound of Group 1.

[Group 1]

[1-1]

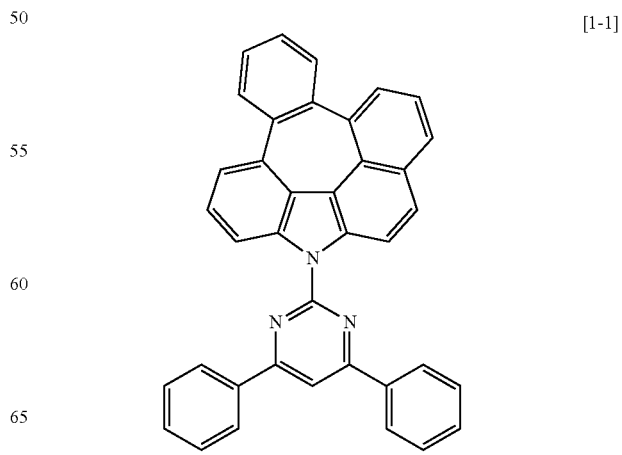

[1-2]
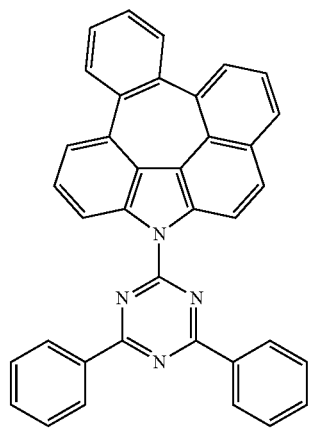
[1-3]
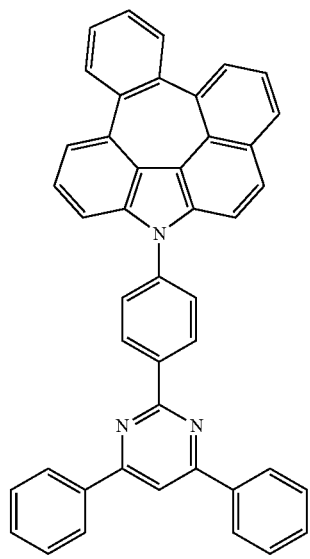
[1-4]
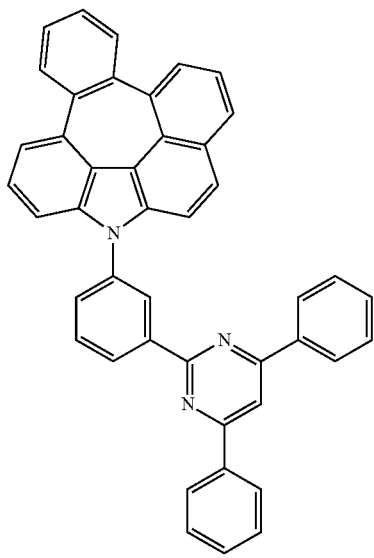
[1-5]
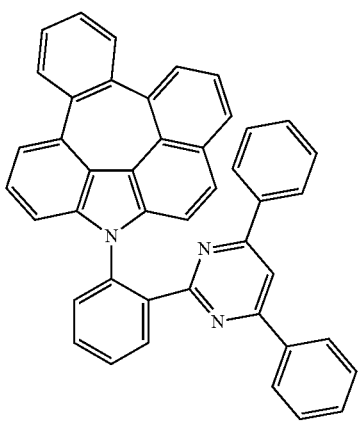
[1-6]
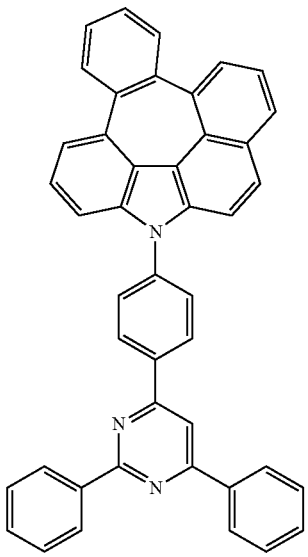
[1-7]
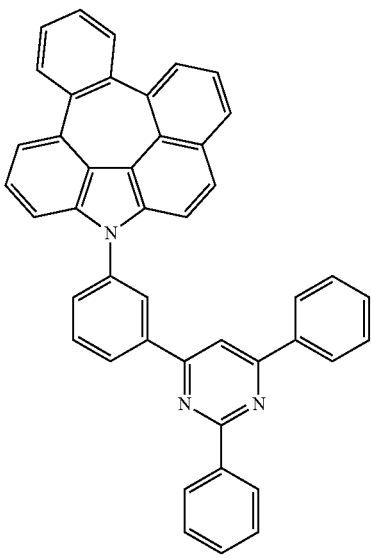

[1-8]
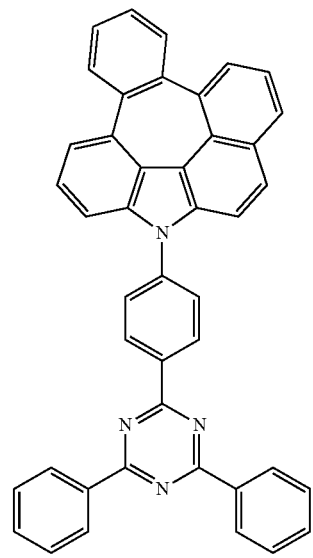
[1-9]
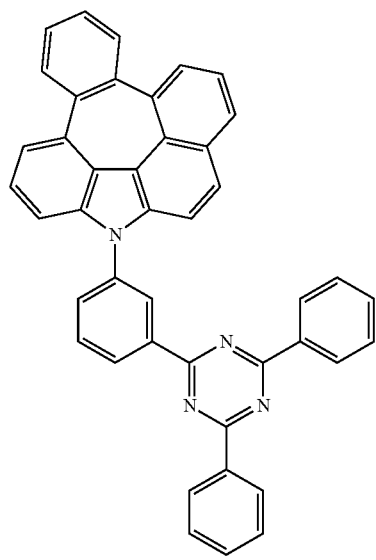
[1-10]
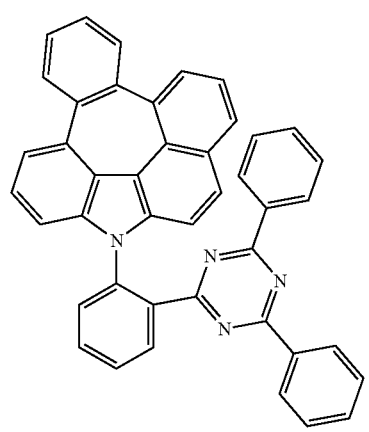
[1-11]
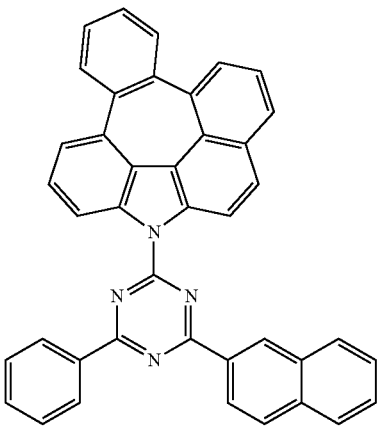
[1-12]
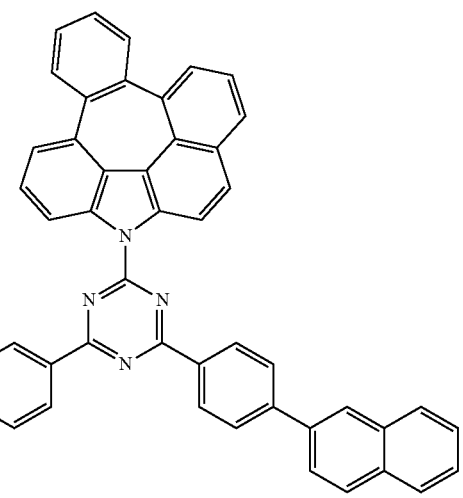
[1-13]
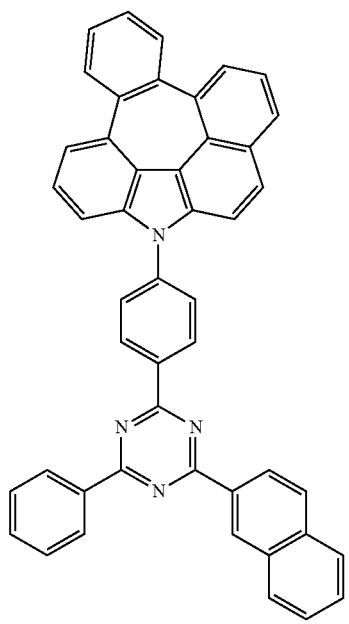

[1-14]
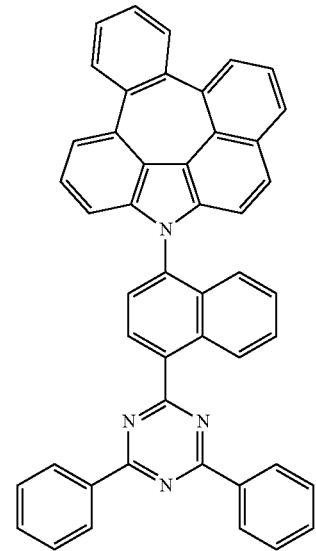
[1-15]
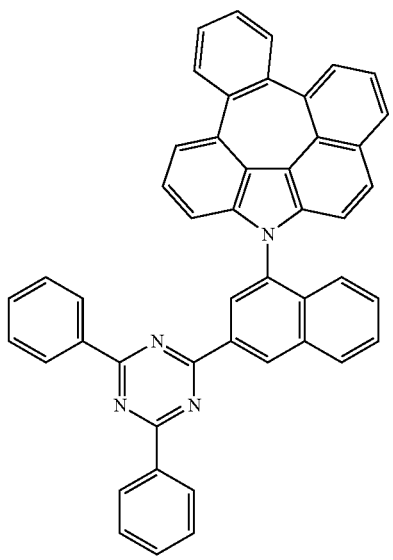
[1-16]
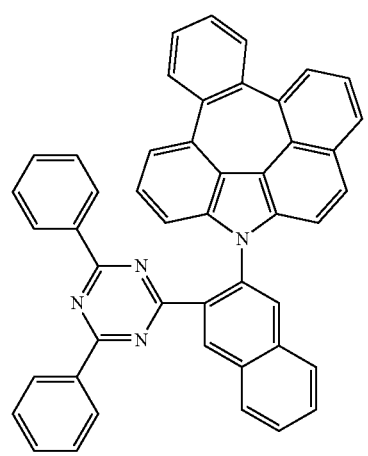
[1-17]
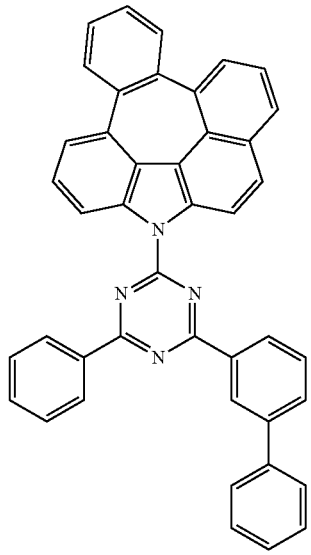
[1-18]
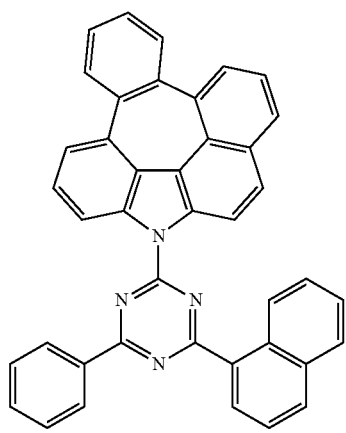
[1-19]
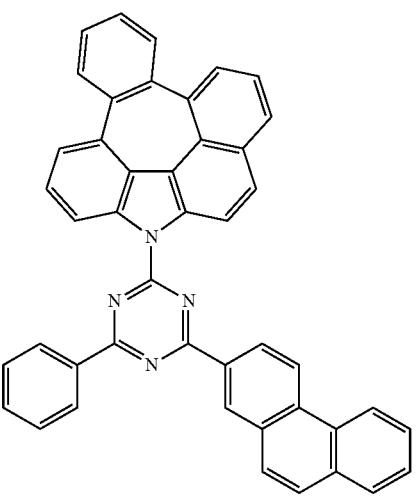

[1-20]
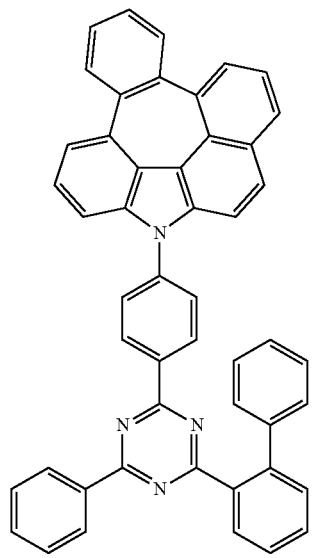
[1-21]
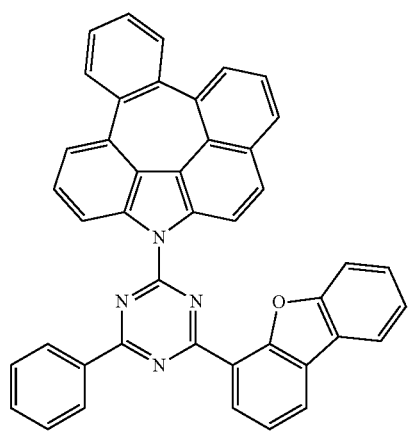
[1-22]
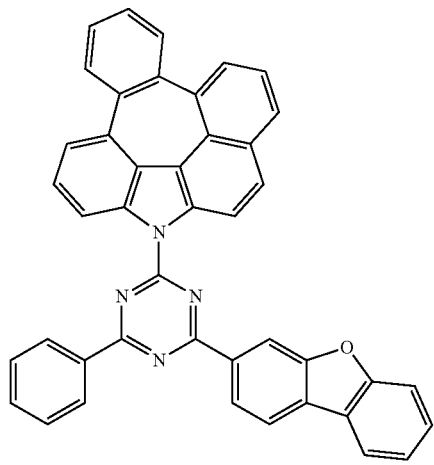
[1-23]
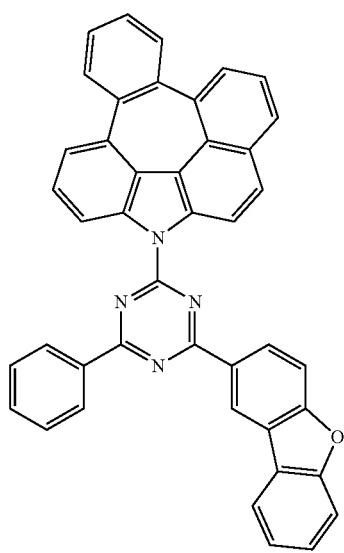
[1-24]
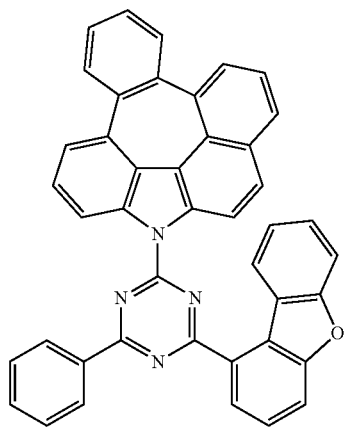
[1-25]
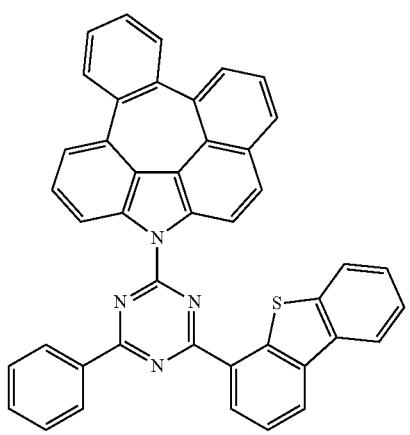

-continued
[1-26]
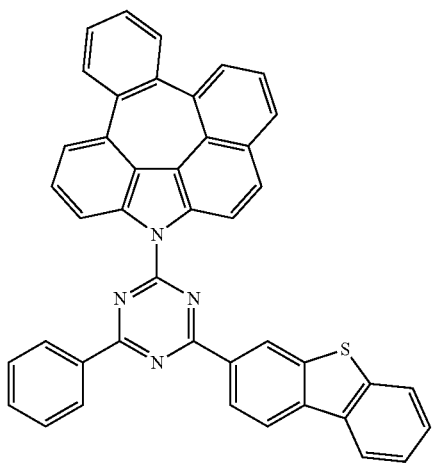
[1-27]
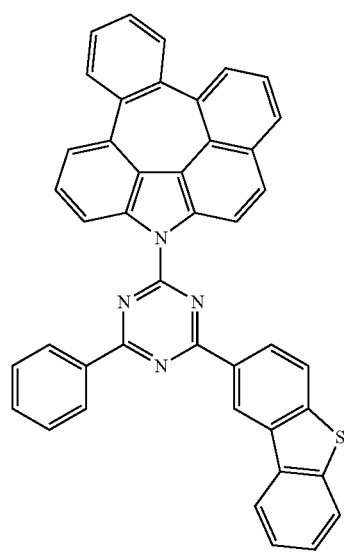
[1-28]
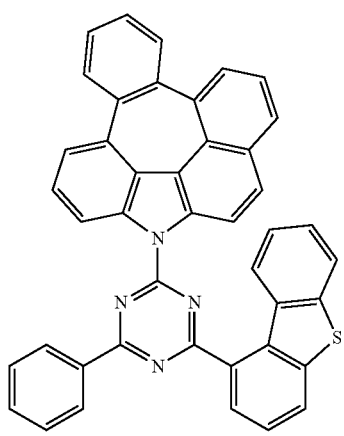
-continued
[1-29]
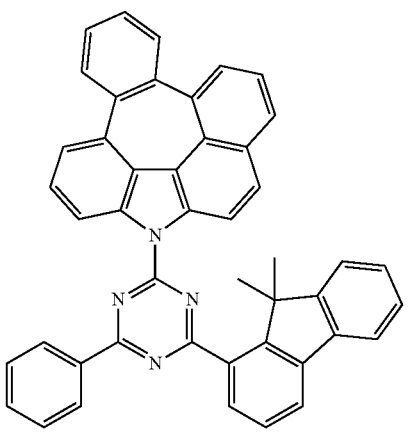
[1-30]
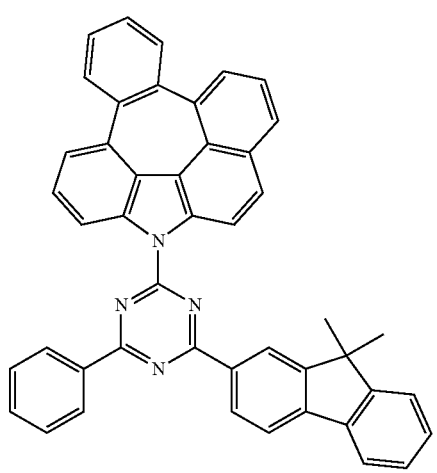
[1-31]
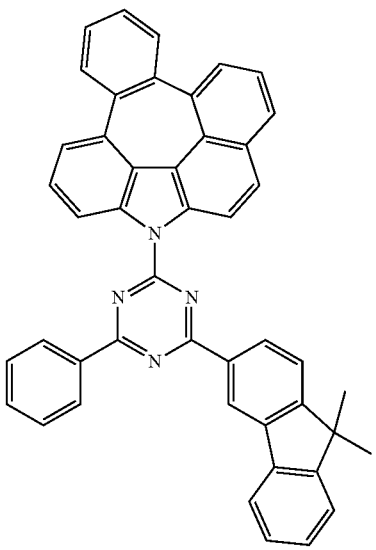

[1-32]
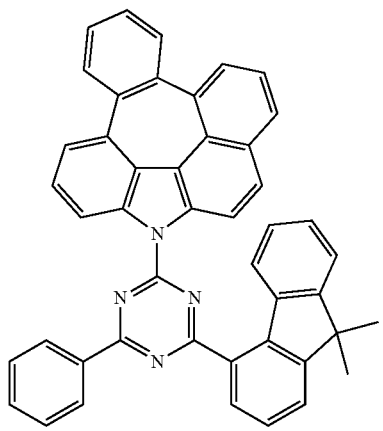
[1-33]
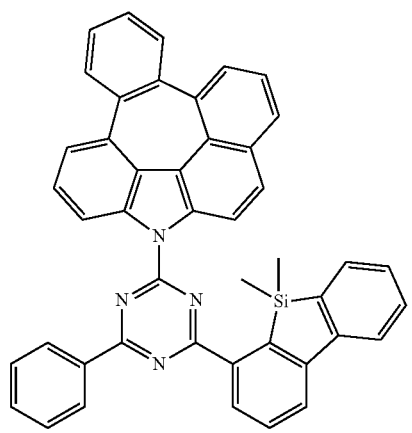
[1-34]
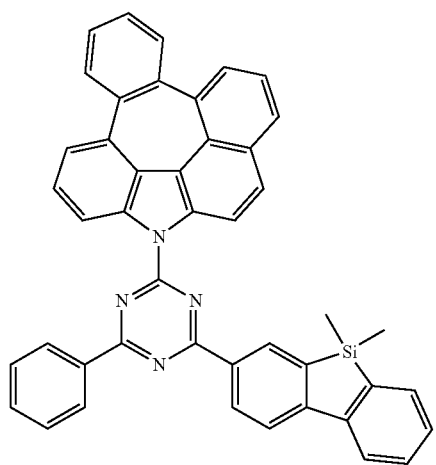
[1-35]
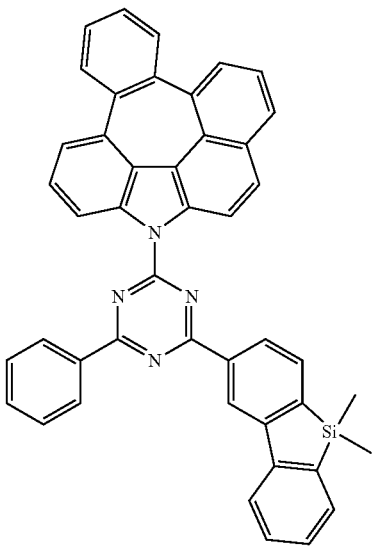
[1-36]
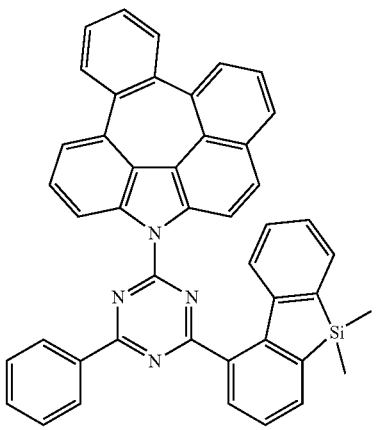
[1-37]
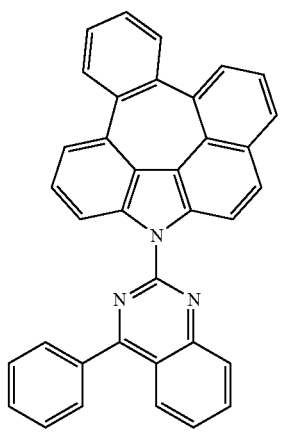

[1-38]

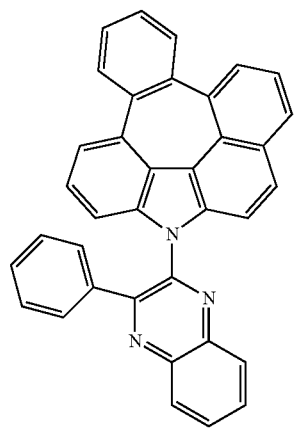

[1-39]

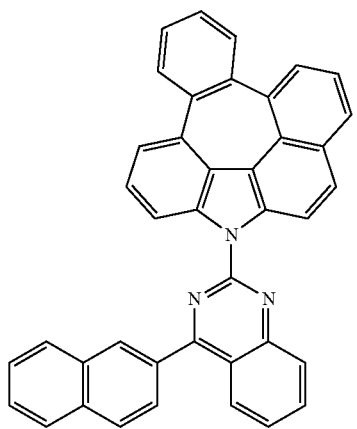

[1-40]

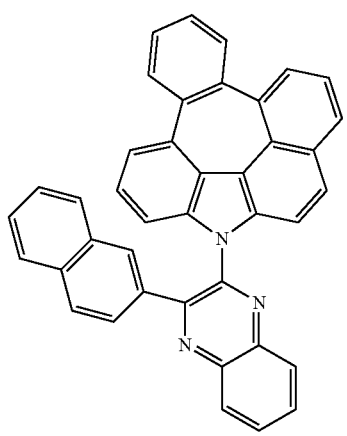

In an implementation, the second compound may be represented by, e.g., Chemical Formula 2A, Chemical Formula 2B, or Chemical Formula 2C according to the fusion direction of Chemical Formula 2 and Chemical Formula 3.

[Chemical Formula 2A]

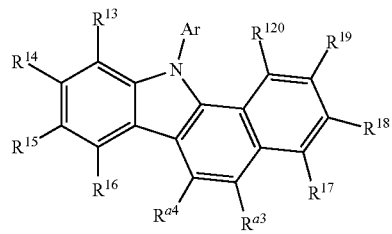

[Chemical Formula 2B]

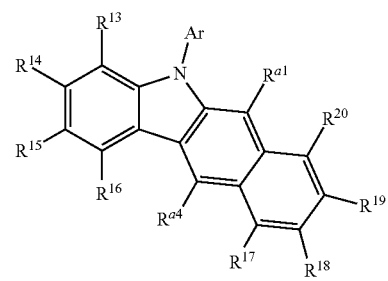

[Chemical Formula 2C]

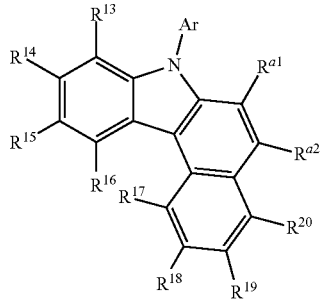

In Chemical Formula 2A to Chemical Formula 2C, Ar and $R^{13}$ to $R^{20}$ may be defined the same as those described above, and $R^{a1}$ to $R^{a4}$ may each independently be defined the same as $R^a$.

In an implementation, Chemical Formula 2A may be represented by, e.g., one of Chemical Formula 2A-1 to Chemical Formula 2A-4, according to a specific substitution position of the group represented by Chemical Formula a.

[Chemical Formula 2A-1]

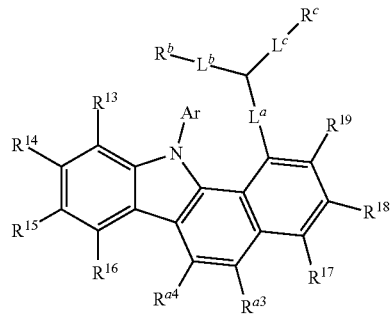

[Chemical Formula 2A-2]

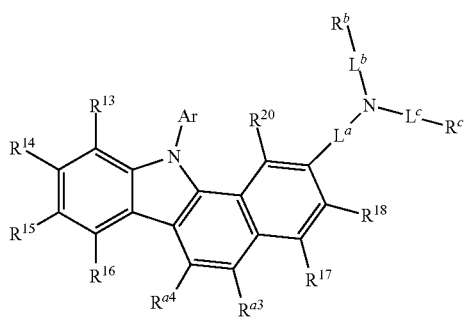

[Chemical Formula 2B-2]

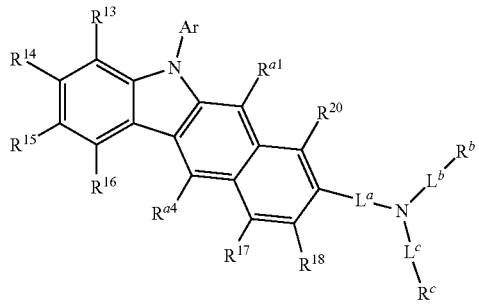

[Chemical Formula 2A-3]

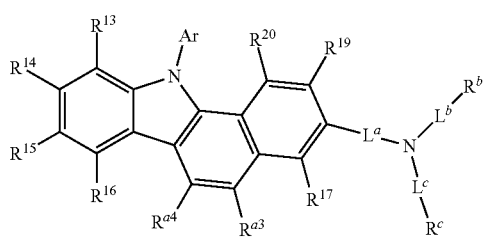

[Chemical Formula 2B-3]

[Chemical Formula 2A-4]

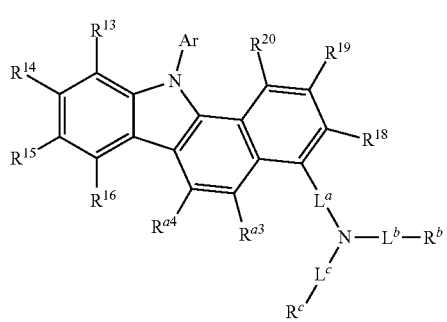

In Chemical Formula 2A-1 to Chemical Formula 2A-4, Ar, $R^{a3}$, $R^{a4}$, $R^{13}$ to $R^{20}$, $L^a$, $L^b$, $L^c$, $R^b$, and $R^c$ may be defined the same as those described above.

In an implementation, Chemical Formula 2B may be represented by, e.g., one of Chemical Formula 2B-1 to Chemical Formula 2B-4, according to a specific substitution position of the group represented by Chemical Formula a.

[Chemical Formula 2B-1]

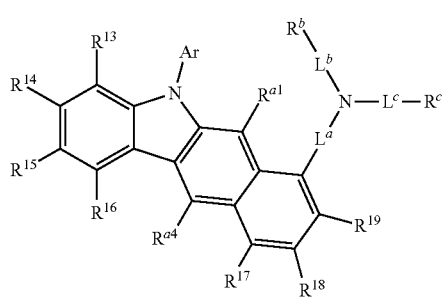

[Chemical Formula 2B-4]

In Chemical Formula 2B-1 to Chemical Formula 2B-4, Ar, $R^{a3}$, $R^{a4}$, $R^{13}$ to $R^{20}$, $L^a$, $L^b$, $L^c$, $R^b$, and $R^c$ may be defined the same as those described above.

For example, Chemical Formula 2C may be represented by, e.g., one of Chemical Formula 2C-1 to Chemical Formula 2C-4 according to a specific substitution position of the group represented by Chemical Formula a.

[Chemical Formula 2C-1]

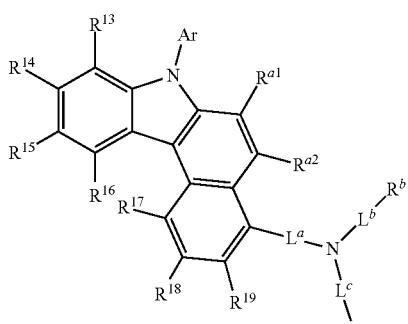

[Chemical Formula 2C-2]

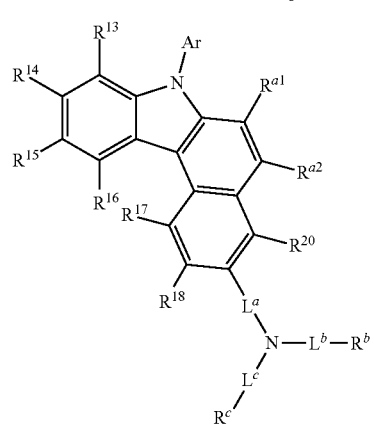

[Chemical Formula 2C-3]

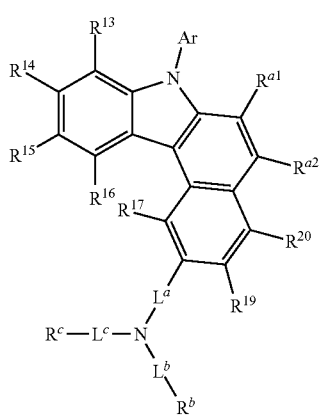

[Chemical Formula 2C-4]

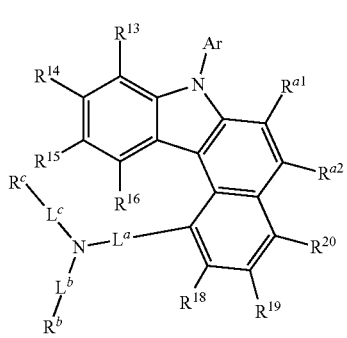

In Chemical Formula 2B-1 to Chemical Formula 2B-4, Ar, $R^{a1}$, $R^{a2}$, $R^{13}$ to $R^{20}$, $L^a$, $L^b$, $L^c$, $R^b$, and $R^c$ may be defined the same as those described above.

In an implementation, Ar may be, e.g., a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted phenanthrenyl group, a substituted or unsubstituted triphenylenyl group, a substituted or unsubstituted fluorenyl group, a substituted or unsubstituted dibenzofuranyl group, a substituted or unsubstituted dibenzothiphenyl group, or a substituted or unsubstituted carbazolyl group.

In an implementation, Ar may be, e.g., a substituted or unsubstituted phenyl group or a substituted or unsubstituted biphenyl group.

In an implementation, $R^{a1}$ to $R^{a4}$ and $R^{13}$ to $R^{20}$ of Chemical Formula 2A-1 to Chemical Formula 2A-4, Chemical Formula 2B-1 to Chemical Formula 2B-4, Chemical Formula 2C-1 to Chemical Formula 2C-4 may each independently be, e.g., hydrogen, deuterium, a cyano group, a substituted or unsubstituted C1 to C10 alkyl group, or a substituted or unsubstituted C6 to C12 aryl group.

In an implementation, $R^{a1}$ to $R^{a4}$ and $R^{13}$ to $R^{20}$ of Chemical Formula 2A-1 to Chemical Formula 2A-4, Chemical Formula 2B-1 to Chemical Formula 2B-4, Chemical Formula 2C-1 to Chemical Formula 2C-4 may each independently be, e.g., hydrogen, deuterium, a cyano group, or a substituted or unsubstituted phenyl group.

In an implementation, $L^a$ may be, e.g., a single bond, a substituted or unsubstituted phenylene group, a substituted or unsubstituted biphenylene group, a substituted or unsubstituted terphenylene group, a substituted or unsubstituted naphthylene group, a substituted or unsubstituted dibenzofuranylene group, or a substituted or unsubstituted dibenzothiophenylene group.

In an implementation, $L^a$ may be, e.g., a single bond, a substituted or unsubstituted m-phenylene group, a substituted or unsubstituted p-phenylene group, or a substituted or unsubstituted o-phenylene group.

In an implementation, $L^b$ and $L^c$ may each independently be, e.g., a single bond or a substituted or unsubstituted C6 to C12 arylene group.

In an implementation, $L^b$ and $L^c$ may each independently be, e.g., a single bond, a substituted or unsubstituted phenylene group, or a substituted or unsubstituted biphenylene group.

In an implementation, $R^b$ and $R^c$ may each independently be, e.g., a substituted or unsubstituted phenyl group, a substituted or unsubstituted biphenyl group, a substituted or unsubstituted naphthyl group, a substituted or unsubstituted anthracenyl group, a substituted or unsubstituted phenanthrenyl group, a substituted or unsubstituted triphenylene group, a substituted or unsubstituted fluorenyl group, a substituted or unsubstituted arylamine group, a substituted or unsubstituted carbazolyl group, a substituted or unsubstituted dibenzofuranyl group, a substituted or unsubstituted dibenzothiophenyl group, or a substituted or unsubstituted dibenzosilolyl group.

In an implementation, $R^b$ and $R^c$ may each independently be, e.g., a substituted or unsubstituted phenyl group, a substituted or unsubstituted biphenyl group, a substituted or unsubstituted naphthyl group, a substituted or unsubstituted fluorenyl group, a substituted or unsubstituted dibenzofuranyl group, or a substituted or unsubstituted dibenzothiophenyl group.

In an implementation, the group represented by Chemical Formula a may be a group of Group II.

[Group II]
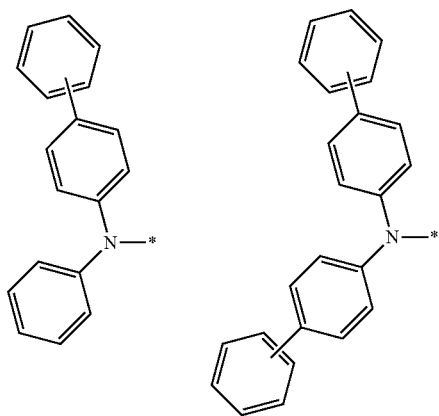
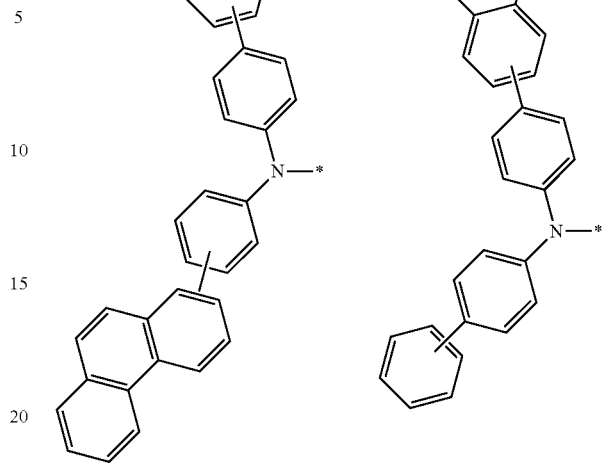
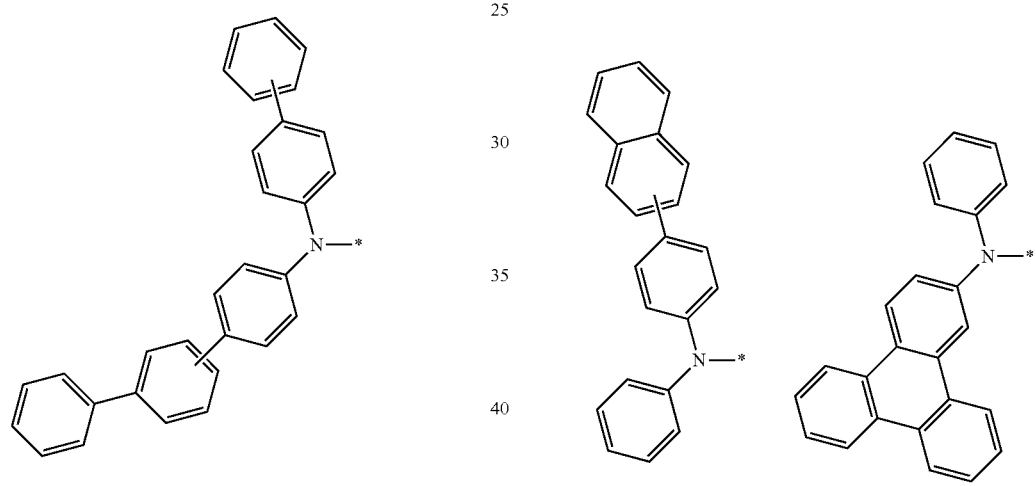
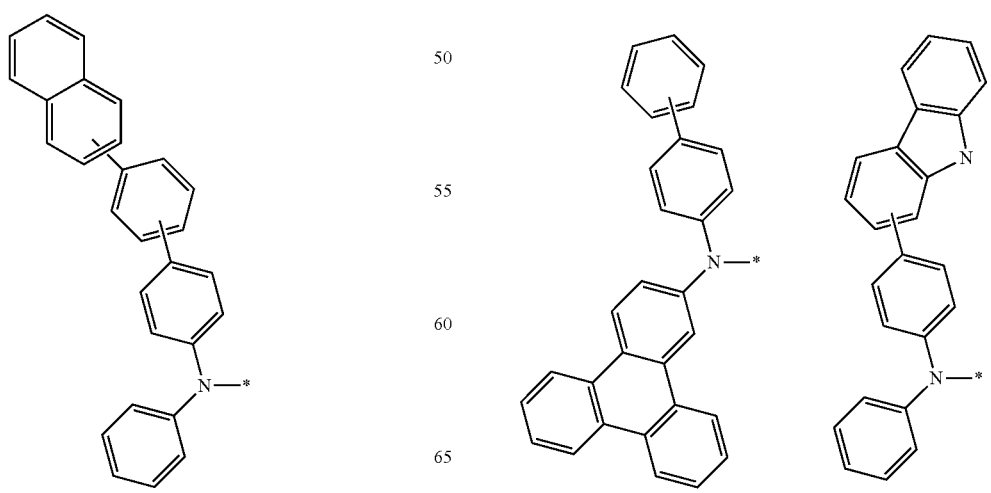

-continued
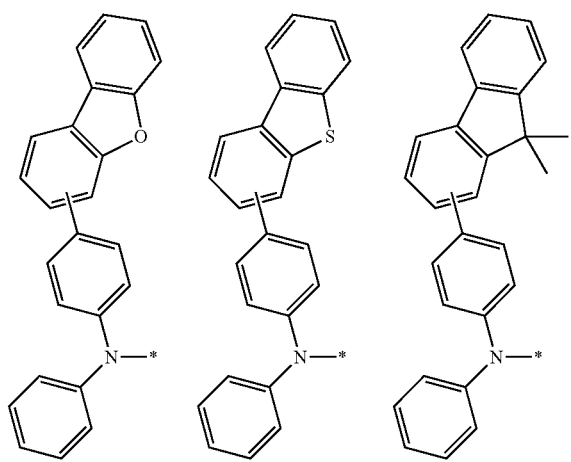
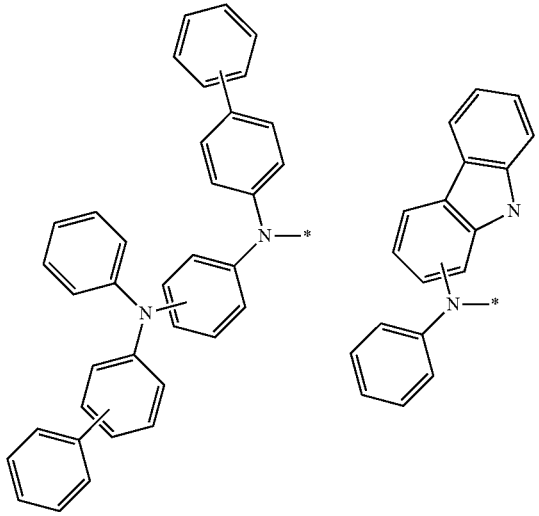
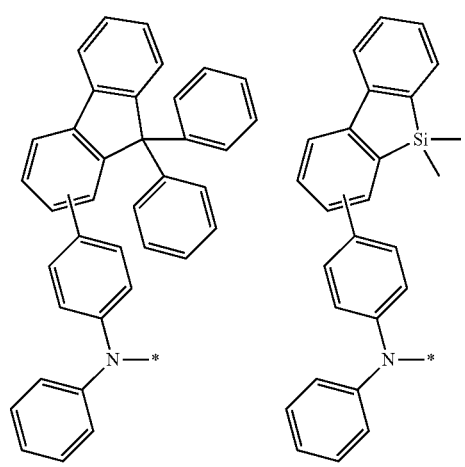
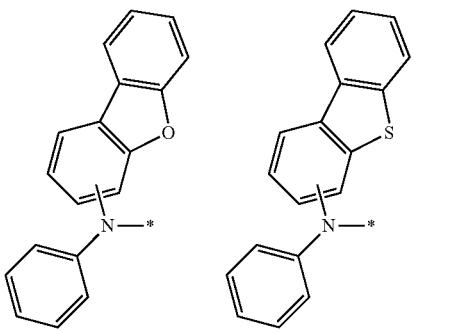
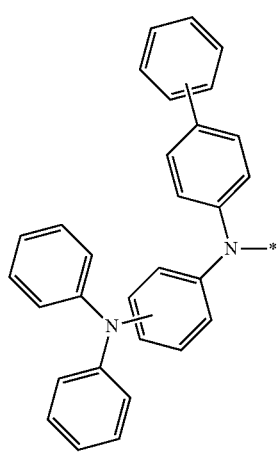
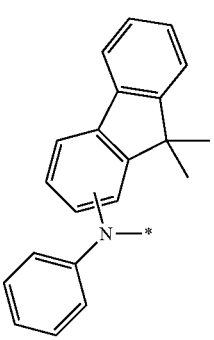
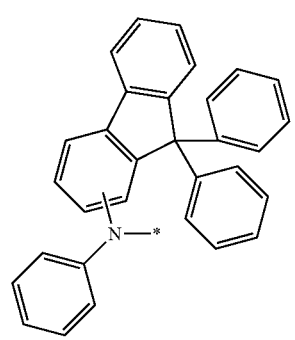
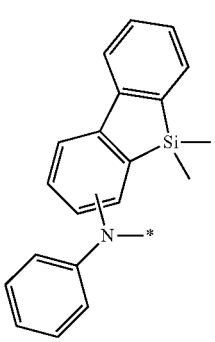
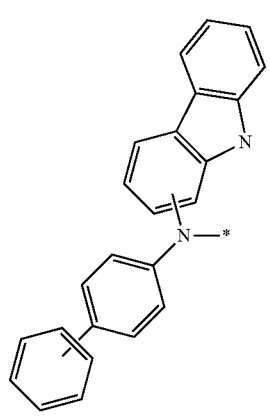

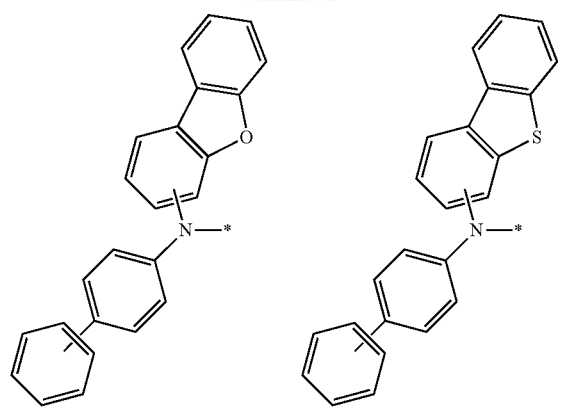
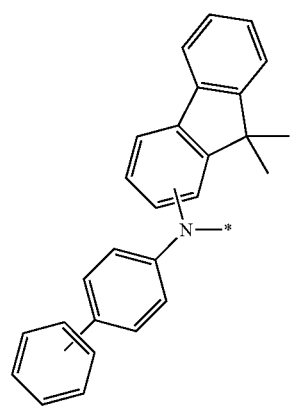
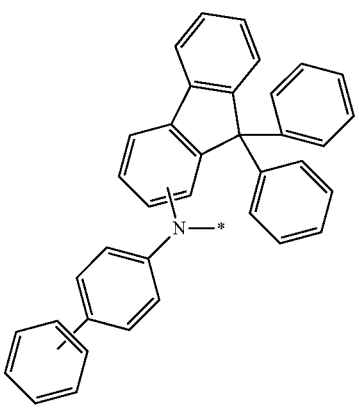
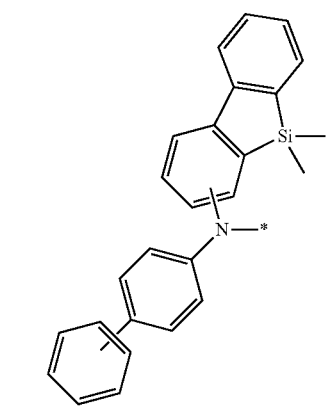
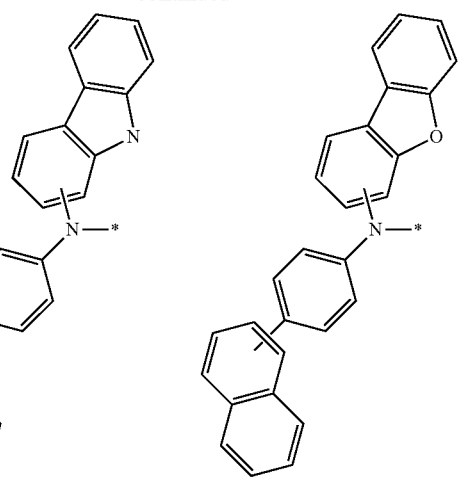
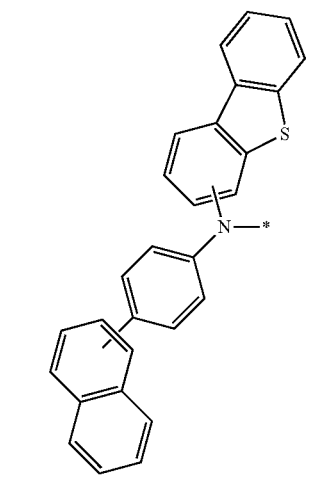
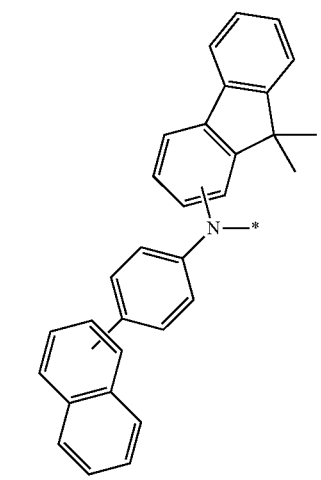

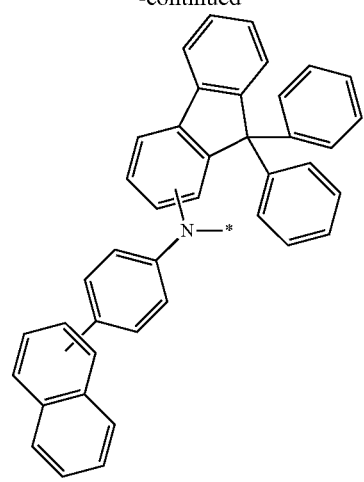
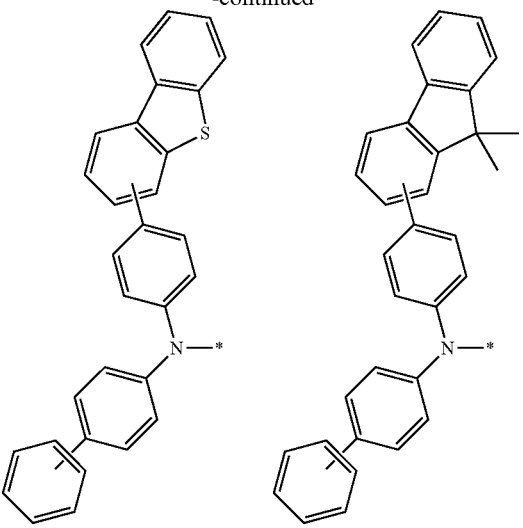
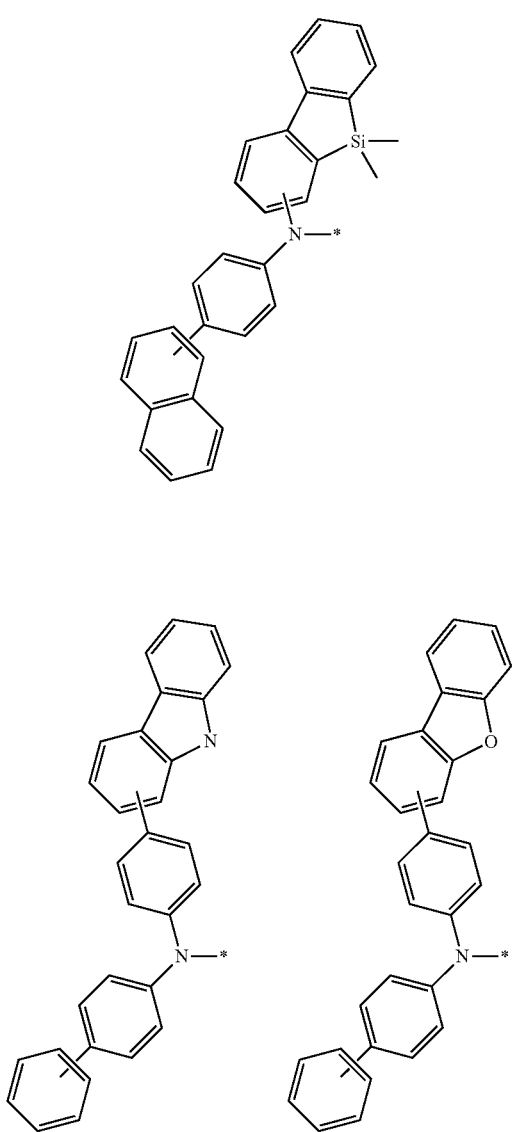
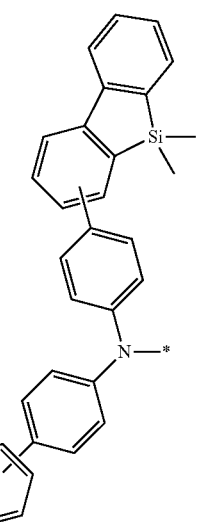
In Group II, * is a linking point.
In an implementation, the second compound may be represented by, e.g., Chemical Formula 2A.
In an implementation, the second compound may be represented by, e.g., Chemical Formula 2A-2.
In an implementation, the second compound may be, e.g., a compound of Group 2.

[Group 2]
[2-1]
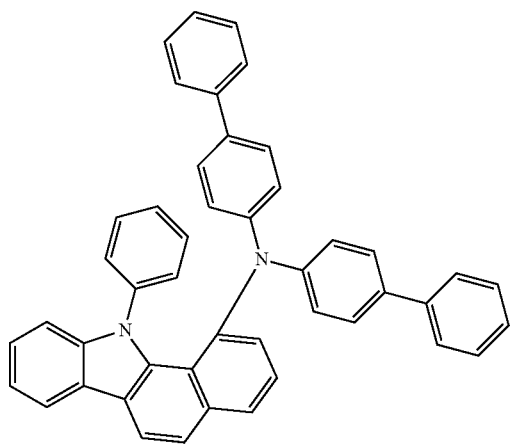
[2-2]
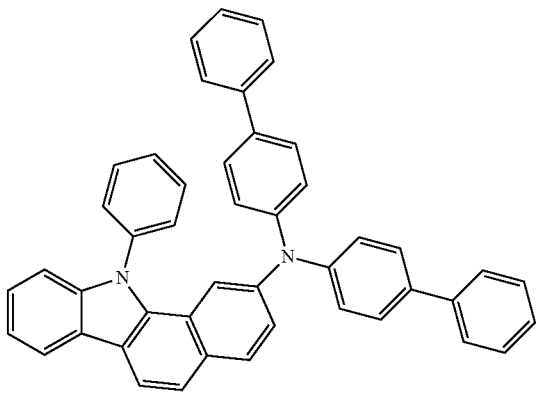
[2-3]
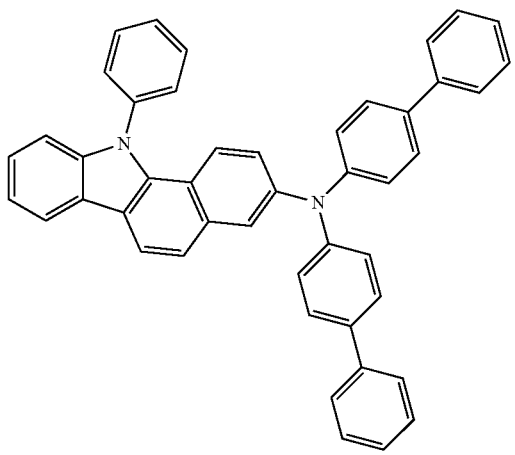
[2-4]
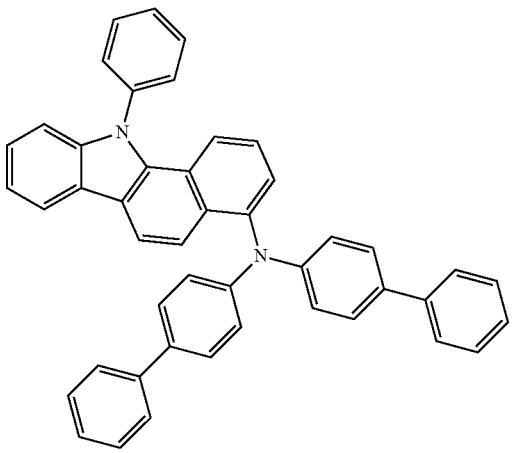
[2-5]
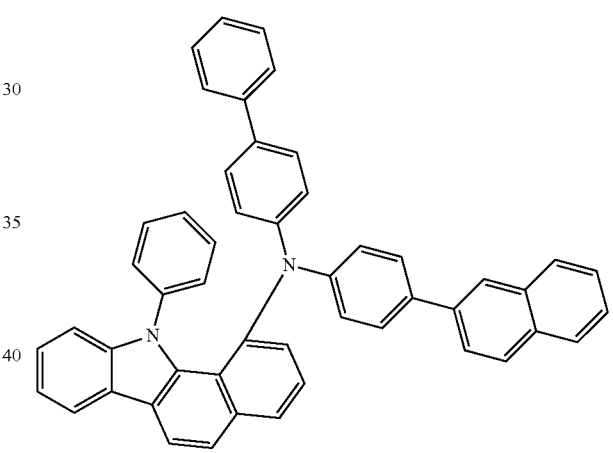
[2-6]
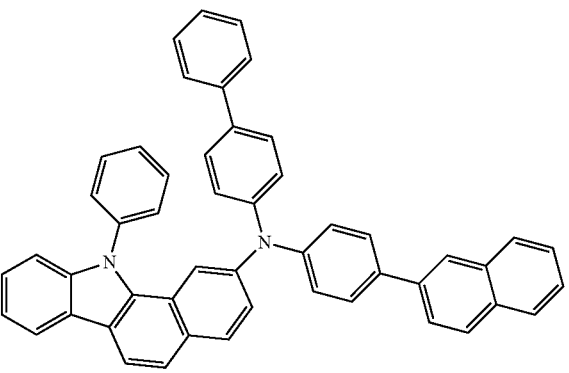

[2-7]
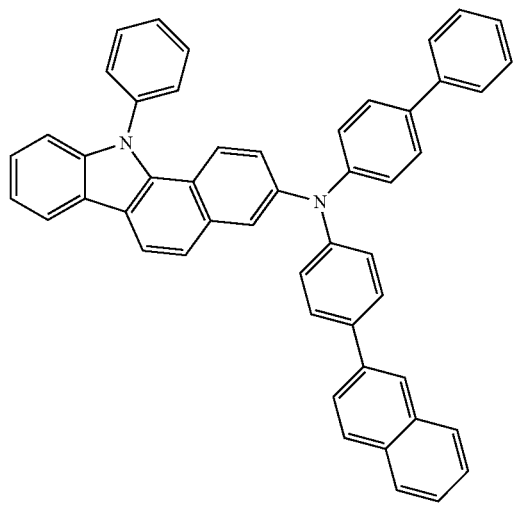
[2-8]
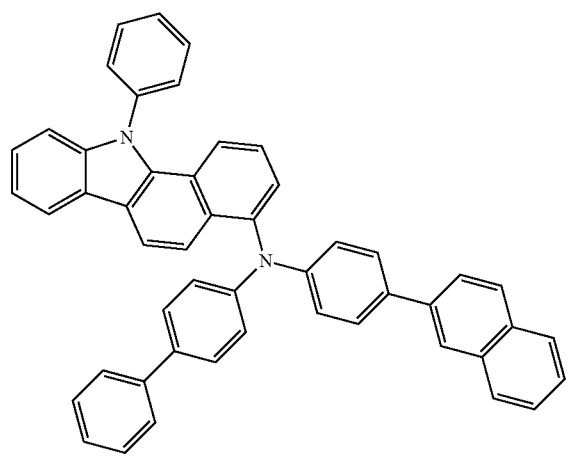
[2-9]
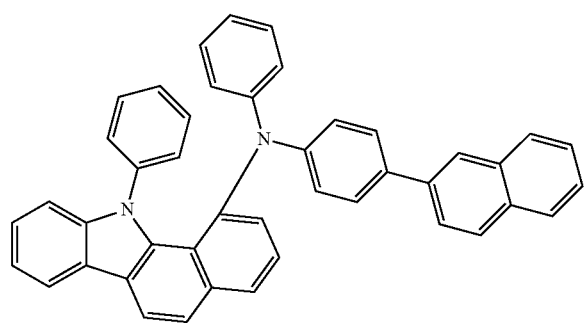
[2-10]
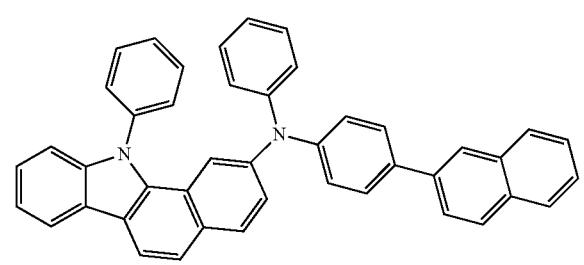
[2-11]
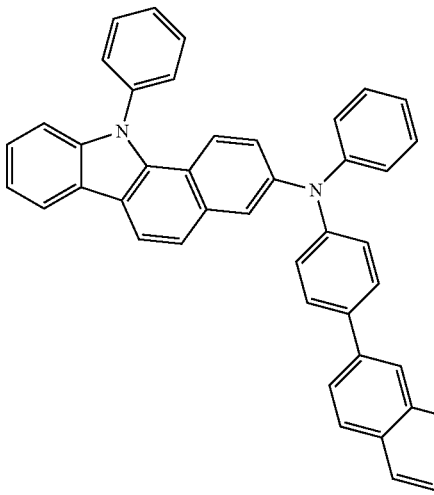
[2-12]
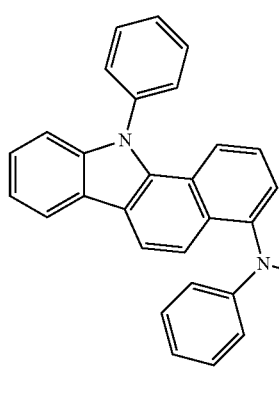
[2-13]
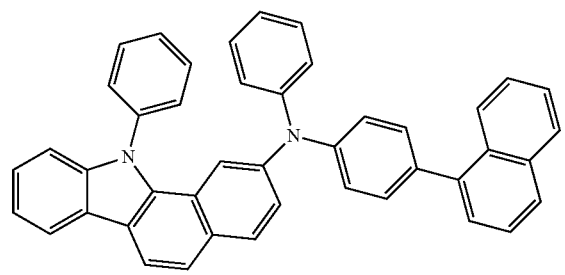
[2-14]
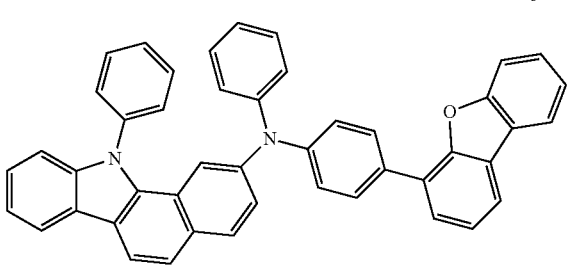

[2-15]
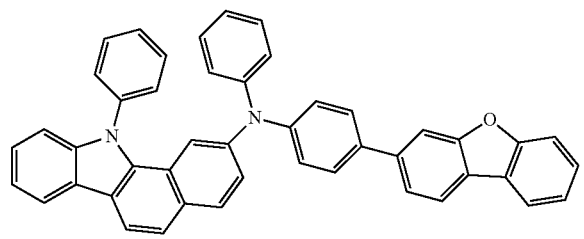
[2-16]
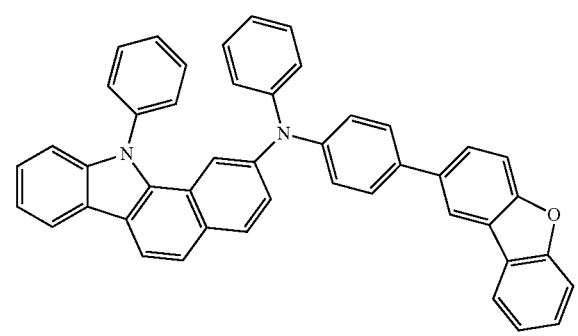
[2-17]
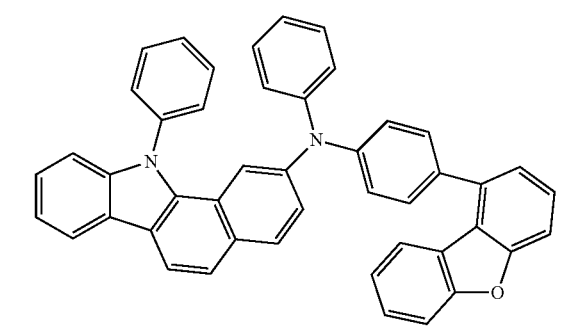
[2-18]
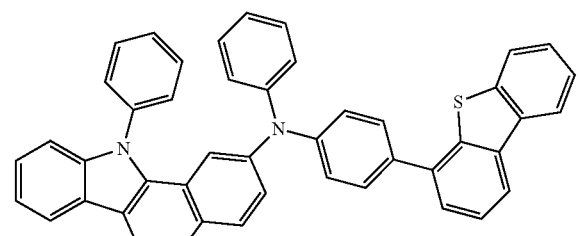
[2-19]
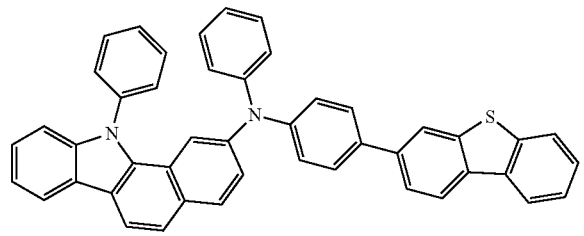
[2-20]
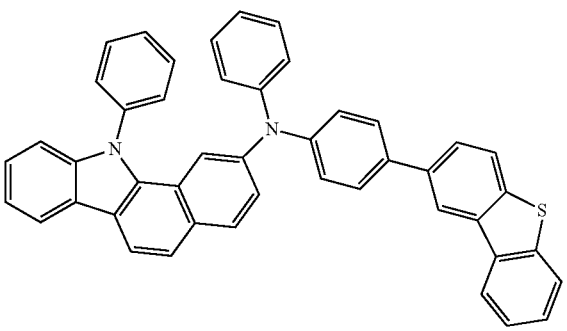
[2-21]
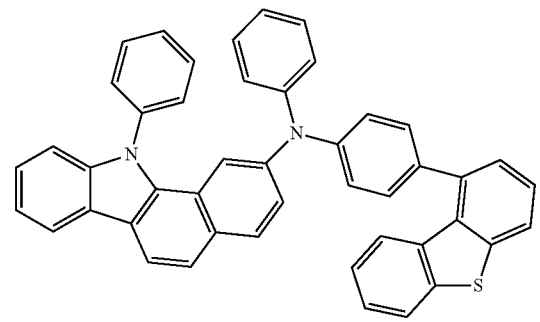
[2-22]
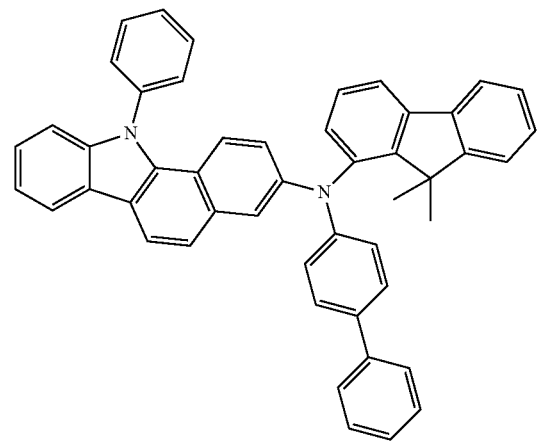
[2-23]
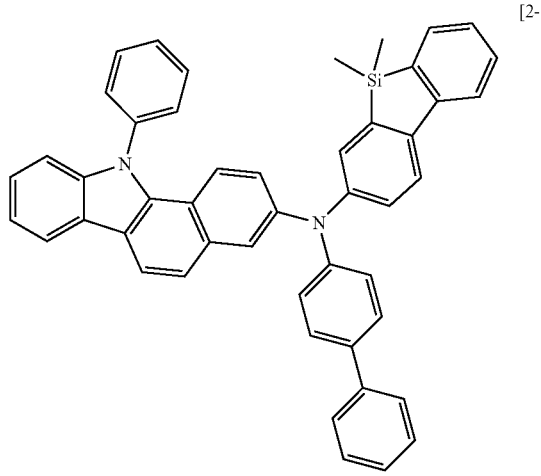

[2-24]
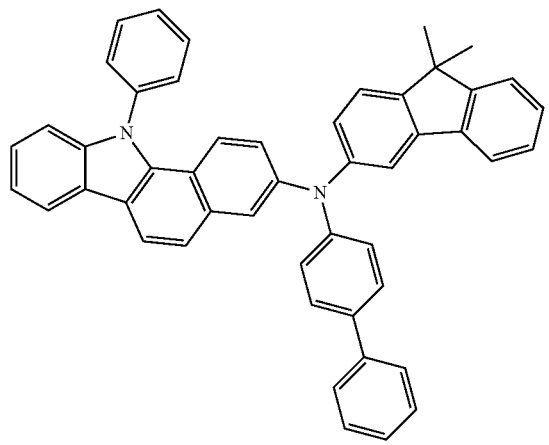
[2-27]
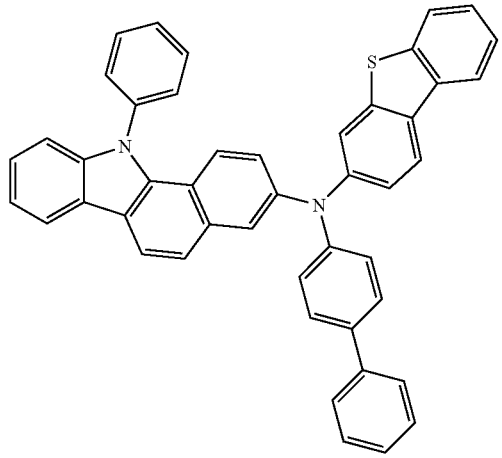
[2-25]
[2-28]
[2-26]
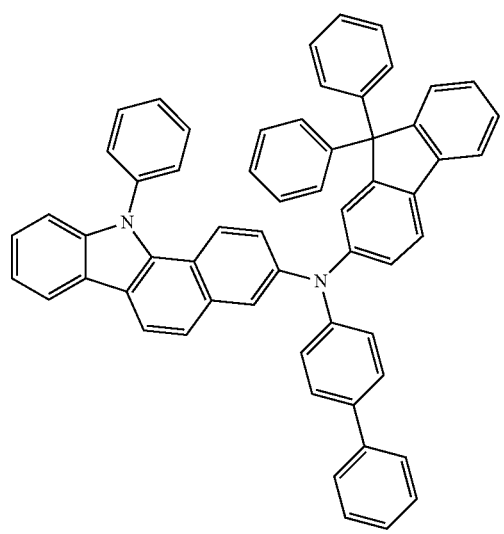
[2-29]
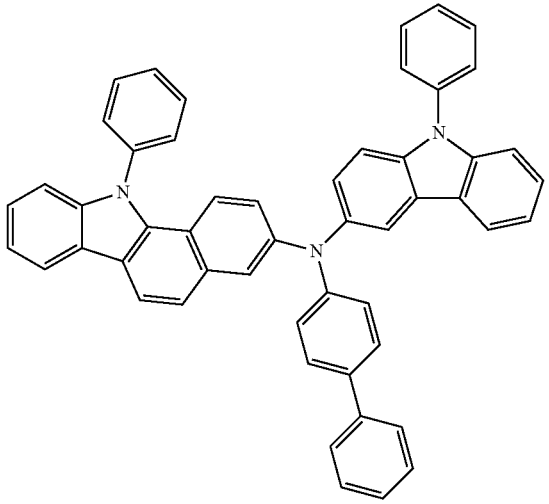

[2-30]
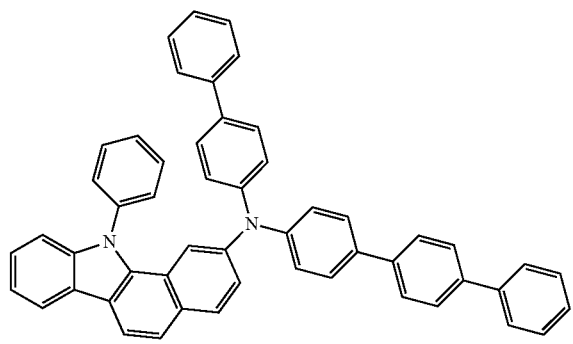
[2-31]
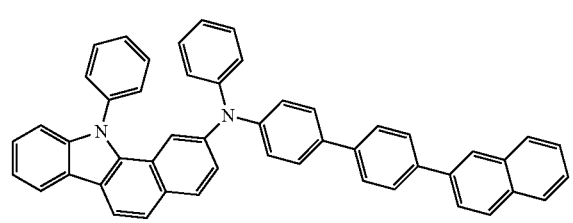
[2-32]
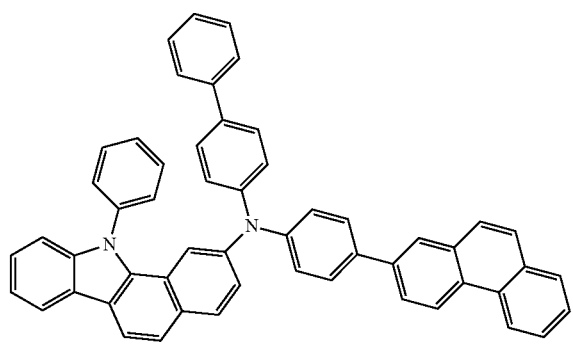
[2-33]
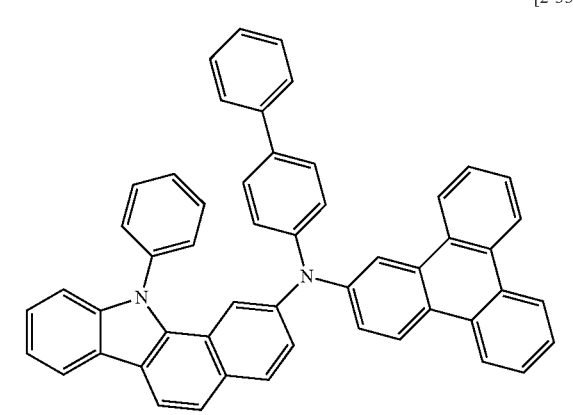
[2-34]
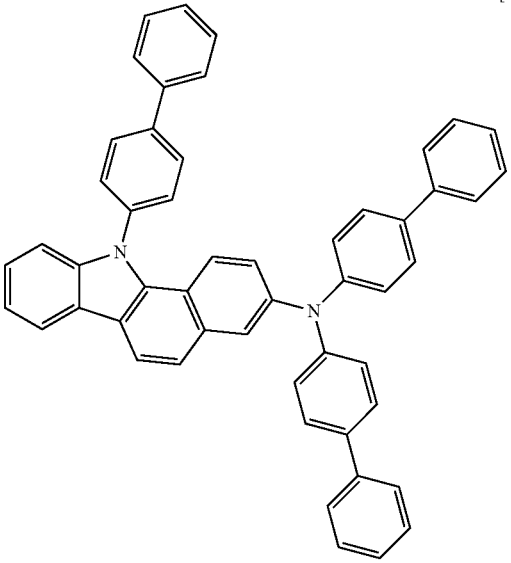
[2-35]
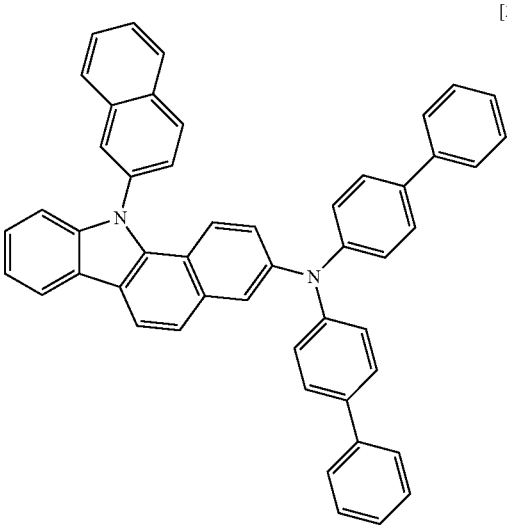
[2-36]
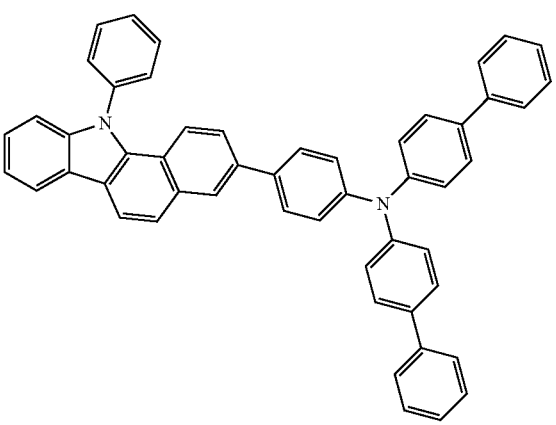

[2-37]
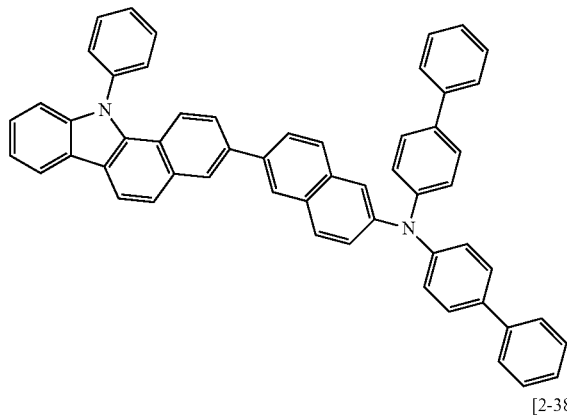
[2-38]
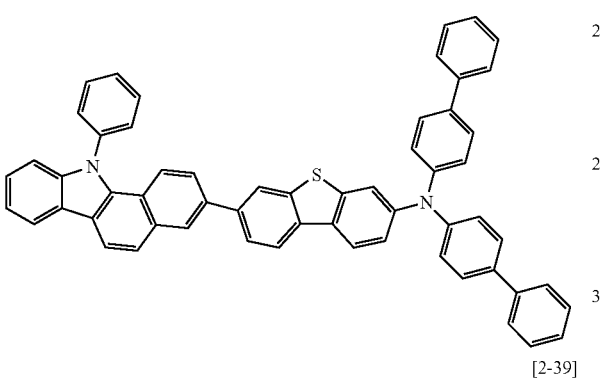
[2-39]
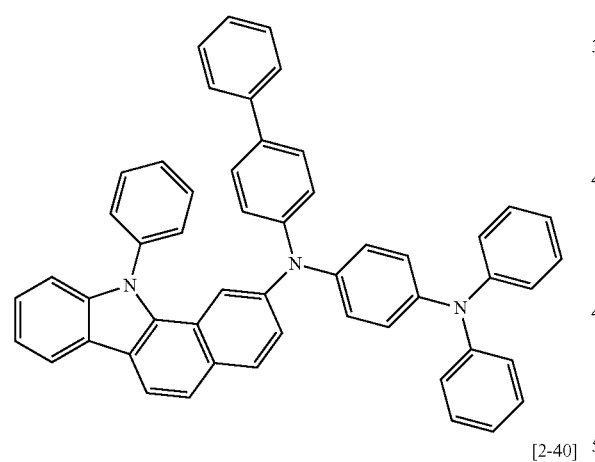
[2-40]
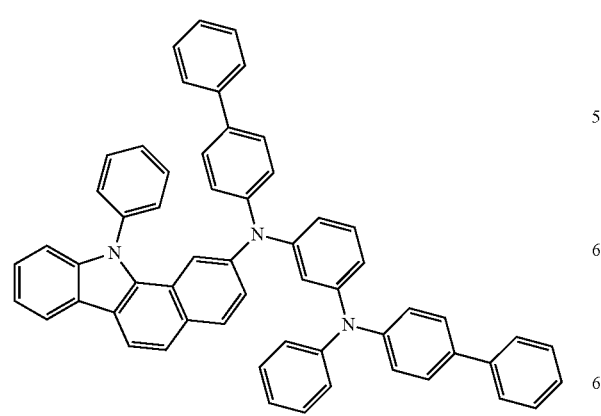
[2-41]
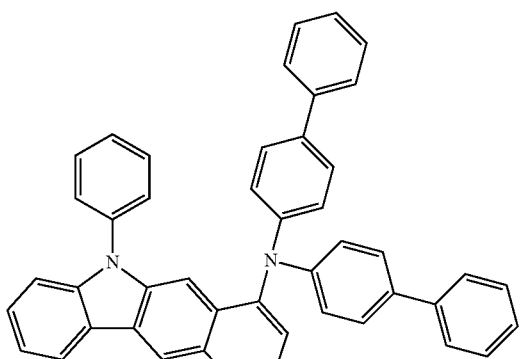
[2-42]
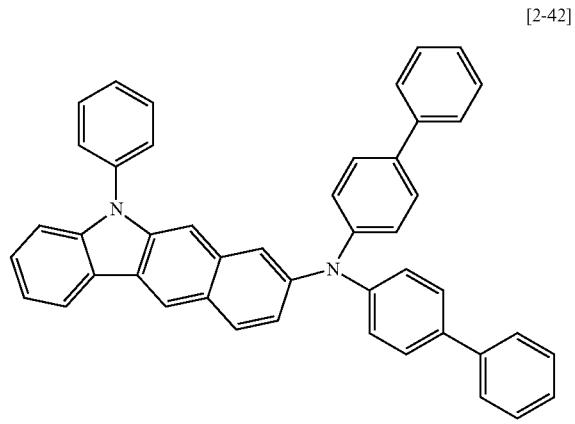
[2-43]
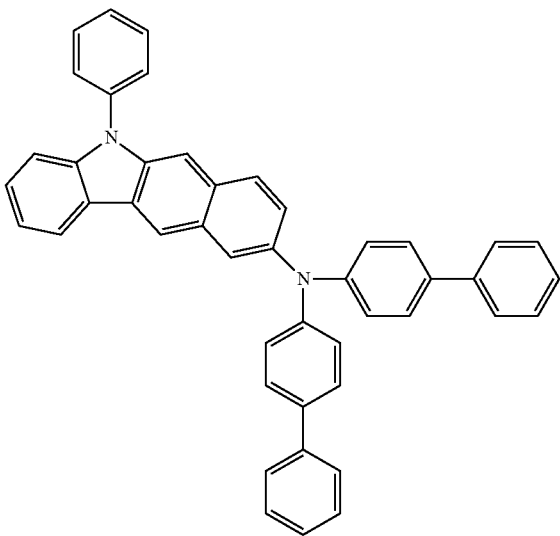

[2-44]
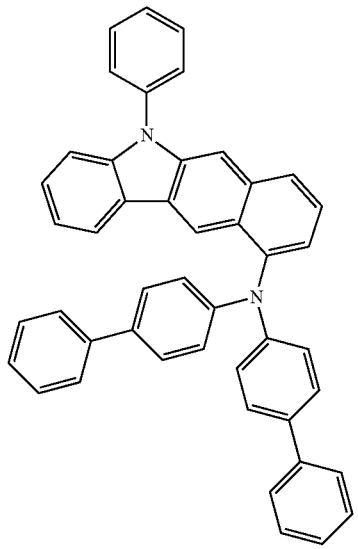
[2-45]
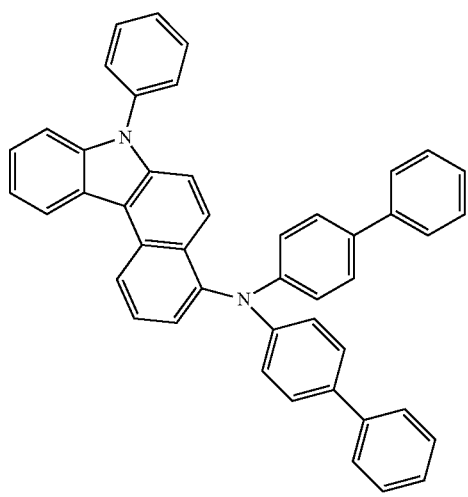
[2-46]
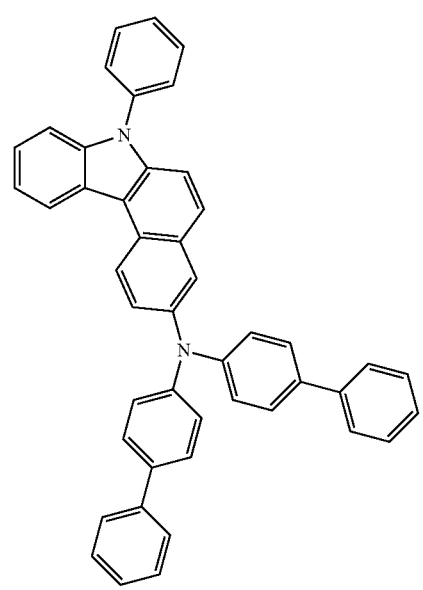
[2-47]
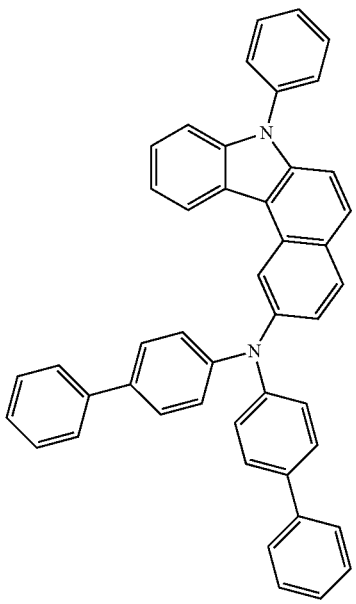
[2-48]
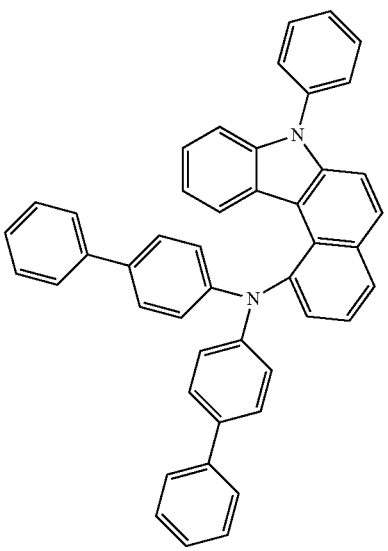
[2-49]
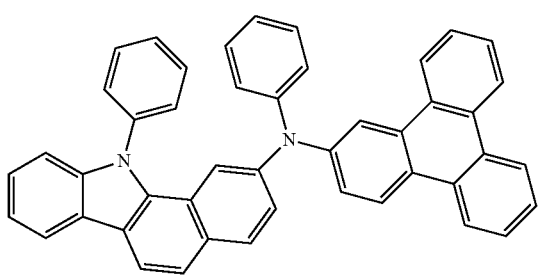

[2-50]
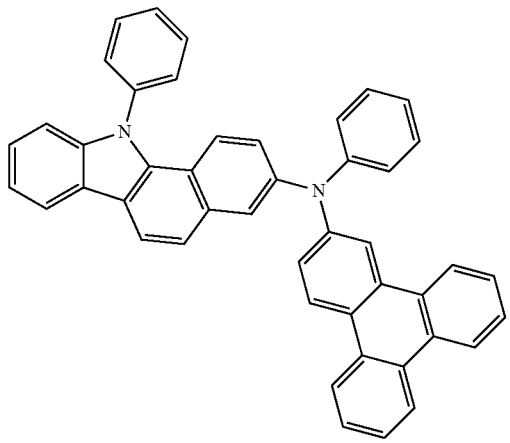
[2-51]
[2-52]
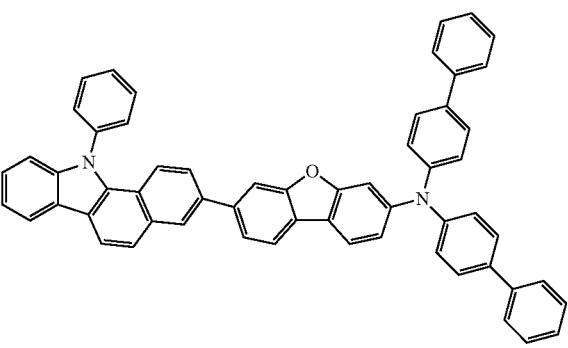
[2-53]
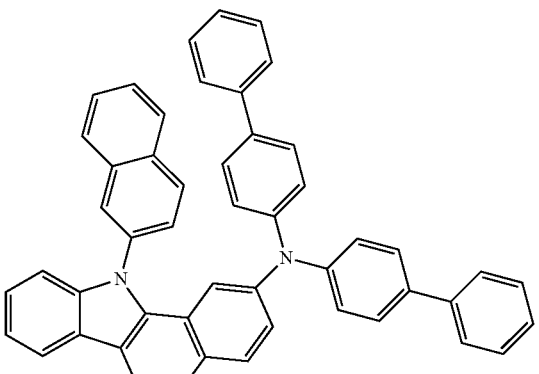
[2-54]
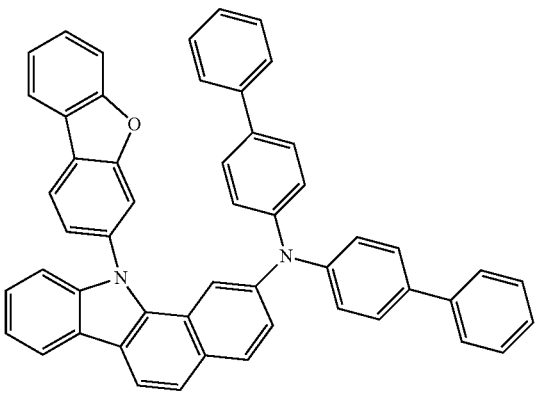
[2-55]
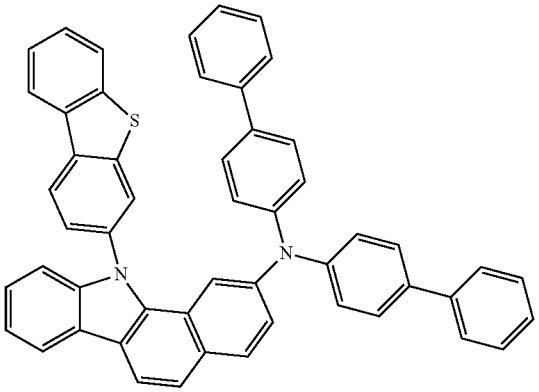
[2-56]
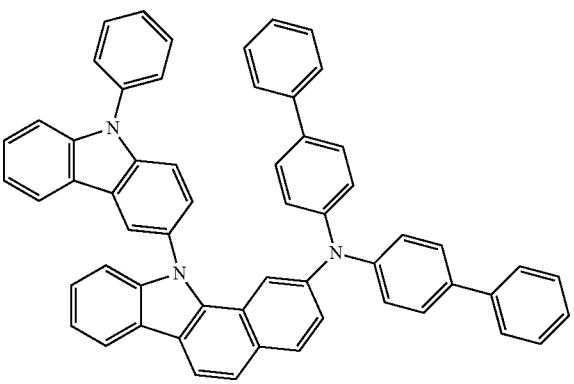

[2-57]
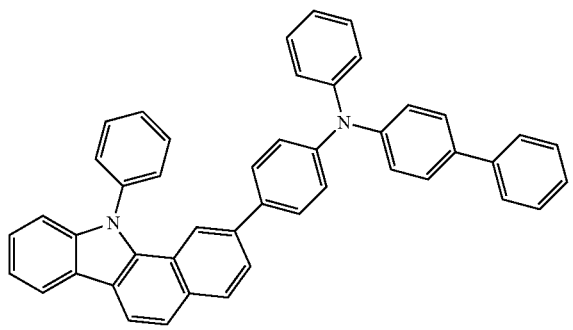
[2-61]
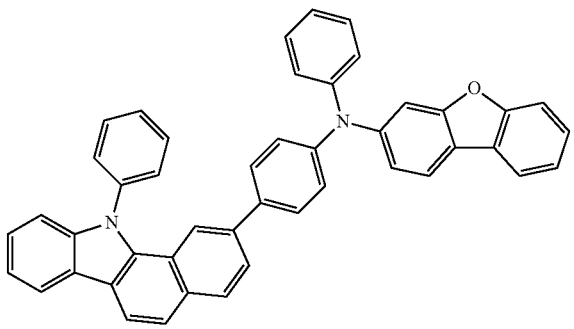
[2-58]
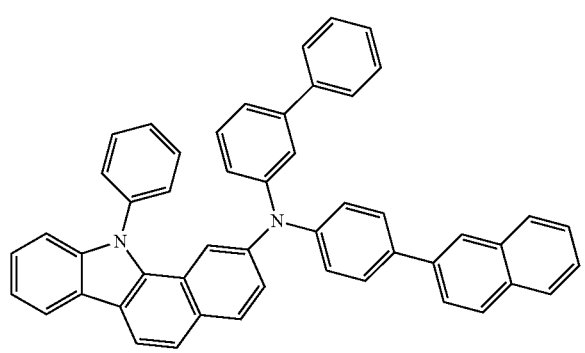
[2-62]
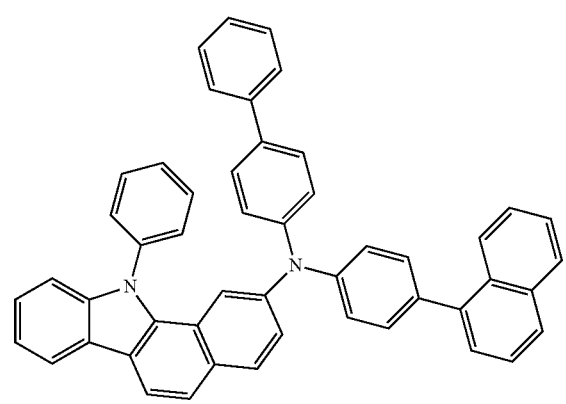
[2-59]
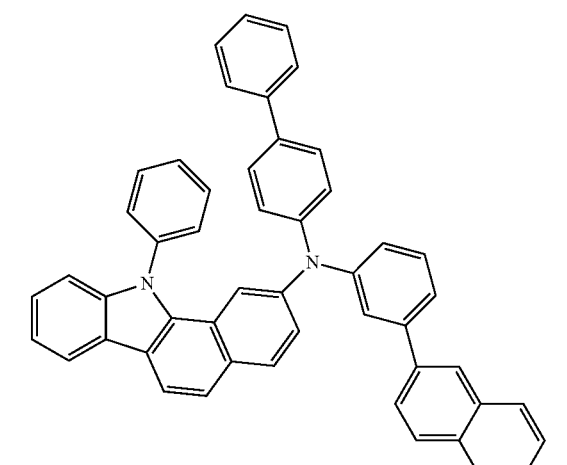
[2-63]
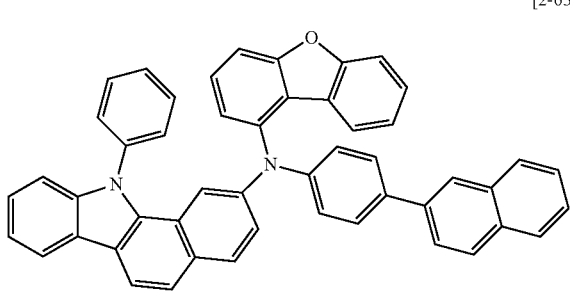
[2-60]
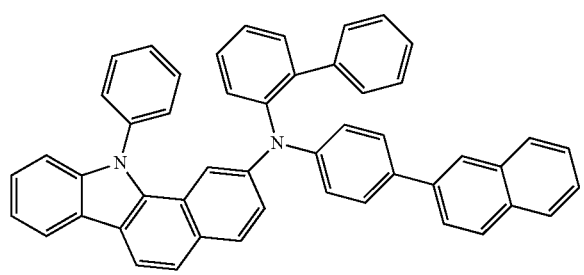
[2-64]
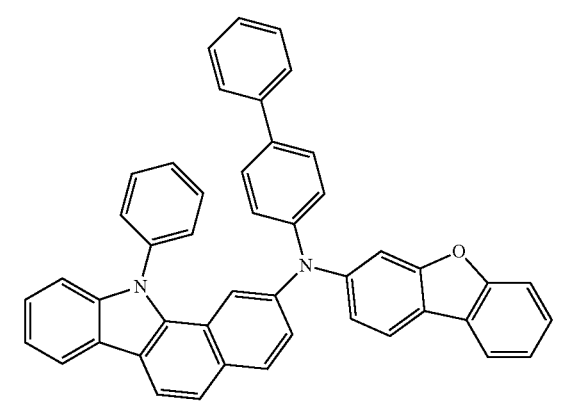

-continued

[2-65]

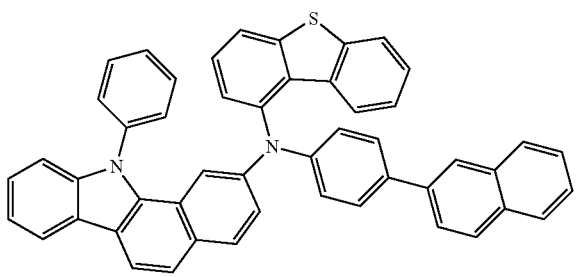

[2-66]

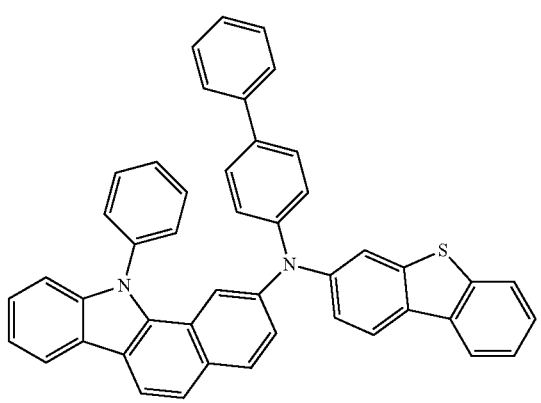

The first compound and the second compound may be included (e.g., mixed) in a weight ratio of, e.g., about 1:99 to about 99:1. Within the above range, bipolar characteristics may be implemented by adjusting an appropriate weight ratio using the electron transport capability of the first compound and the hole transport capability of the second compound, so that efficiency and life-span may be improved. Within the above range, the first compound and the second compound may be, e.g., included in a weight ratio of about 10:90 to 90:10, about 20:80 to 80:20, about 20:80 to 70:30, about 20:80 to 60:40 or about 30:70 to about 60:40. In an implementation, the first compound and the second compound may be included in a weight ratio of about 40:60 to 60:40, e.g., about 50:50.

In an implementation, the first compound and the second compound may each be a host of a light emitting layer, e.g., a phosphorescent host.

The aforementioned composition for an organic optoelectronic device may be formed into a film by a dry film forming method such as chemical vapor deposition.

Hereinafter, an organic optoelectronic device including the aforementioned composition for an organic optoelectronic device is described.

The organic optoelectronic device may be a suitable device to convert electrical energy into photoenergy and vice versa, e.g., an organic photoelectric device, an organic light emitting diode, an organic solar cell, or an organic photoconductor drum.

Herein, an organic light emitting diode as one example of an organic optoelectronic device is described referring to drawings.

Figure 2:
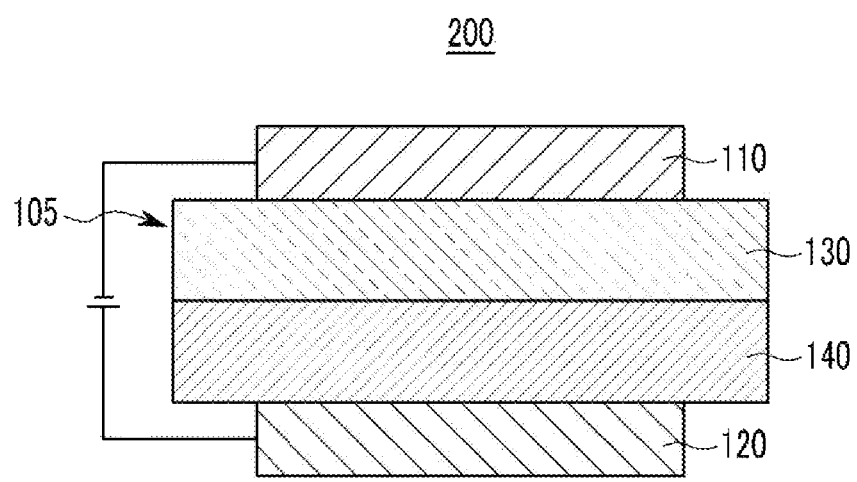

FIGS. 1 and 2 are cross-sectional views showing organic light emitting diodes according to embodiments.

Referring to FIG. 1, an organic light emitting diode 100 according to an embodiment may include, e.g., an anode 120 and a cathode 110 facing each other and at least one organic layer 105 between the anode 120 and cathode 110.

The anode 120 may be made of a conductor having a large work function to help hole injection, and may be, e.g., a metal, a metal oxide or a conductive polymer. The anode 120 may be, e.g., a metal such as nickel, platinum, vanadium, chromium, copper, zinc, gold, or the like or an alloy thereof; a metal oxide such as zinc oxide, indium oxide, indium tin oxide (ITO), indium zinc oxide (IZO), and the like; a combination of a metal and an oxide such as ZnO and Al or $SnO_2$ and Sb; or a conductive polymer such as poly(3-methylthiophene), poly(3,4-(ethylene-1,2-dioxy)thiophene) (PEDOT), polypyrrole, or polyaniline.

The cathode 110 may be made of a conductor having a small work function to help electron injection, and may be, e.g., a metal, a metal oxide, or a conductive polymer. The cathode 110 may be for example a metal such as magnesium, calcium, sodium, potassium, titanium, indium, yttrium, lithium, gadolinium, aluminum silver, tin, lead, cesium, barium, or the like, or an alloy thereof; or a multi-layer structure material such as LiF/Al, $LiO_2$/Al, LiF/Ca, or $BaF_2$/Ca.

The organic layer 105 may include the aforementioned composition for an organic optoelectronic device.

The organic layer 105 may include, e.g., a light emitting layer 130, and the light emitting layer 130 may include, e.g., the aforementioned composition for an organic optoelectronic device.

The light emitting layer 130 may include, e.g., the aforementioned composition for an organic optoelectronic device as a phosphorescent host.

In addition to the aforementioned host, the light emitting layer may further include one or more additional compounds.

The light emitting layer may further include a dopant. The dopant may be, e.g., a phosphorescent dopant. In an implementation, the dopant may be, e.g., a red, green or blue phosphorescent dopant.

The composition for an organic optoelectronic device further including a dopant may be, e.g., a red light emitting composition.

A dopant is a material that emits light by being mixed in a small amount with a compound or composition for an organic optoelectronic device. In an implementation, the dopant may be a material such as a metal complex that emits light by multiple excitation into a triplet or more. The dopant may be, e.g., an inorganic, organic, or organic-inorganic compound, and may include one or two or more.

An example of the dopant may include a phosphorescent dopant, and examples of the phosphorescent dopant may include, e.g., an organometallic compound including Ir, Pt, Os, Ti, Zr, Hf, Eu, Tb, Tm, Fe, Co, Ni, Ru, Rh, Pd, or a combination thereof. The phosphorescent dopant may be, e.g., a compound represented by Chemical Formula Z.

$L^2MX$  [Chemical Formula Z]

In Chemical Formula, M may be, e.g., a metal, $L^2$ and X may each independently be, e.g., ligands forming a complex compound with M.

The M may be, e.g., Ir, Pt, Os, Ti, Zr, Hf, Eu, Tb, Tm, Fe, Co, Ni, Ru, Rh, Pd or a combination thereof and $L^2$ and X may be, e.g., a bidenate ligand.

The organic layer may further include an auxiliary layer in addition to the light emitting layer.

The auxiliary layer may be, e.g., a hole auxiliary layer 140.

Referring to FIG. 2, an organic light emitting diode 200 may further include a hole auxiliary layer 140 in addition to the light emitting layer 130. The hole auxiliary layer 140 may help further increase hole injection and/or hole mobility and may block electrons between the anode 120 and the light emitting layer 130.

The hole auxiliary layer 140 may include, e.g., a compound of Group A.

In an implementation, the hole auxiliary layer 140 may include a hole transport layer between the anode 120 and the light emitting layer 130 and a hole transport auxiliary layer between the light emitting layer 130 and the hole transport layer, and a compound of Group A may be included in the hole transport auxiliary layer.

[Group A]

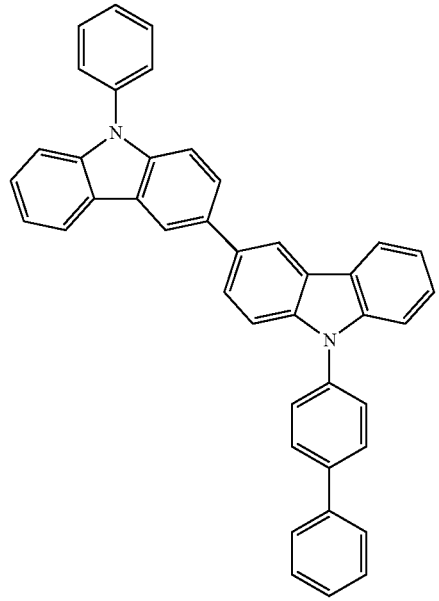

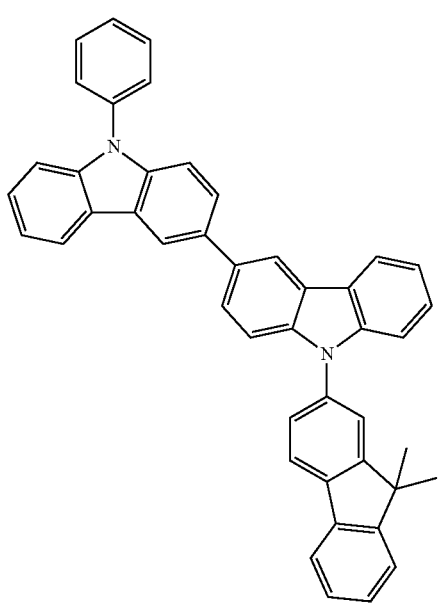

-continued

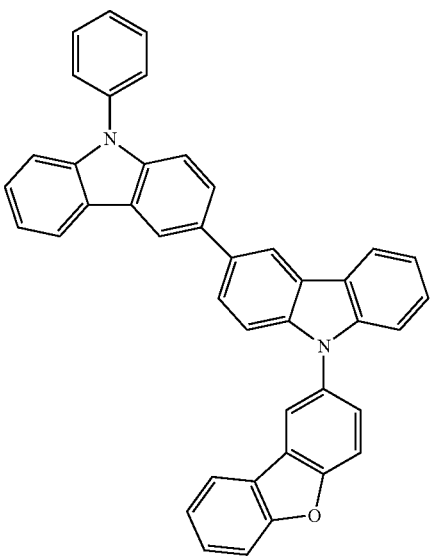

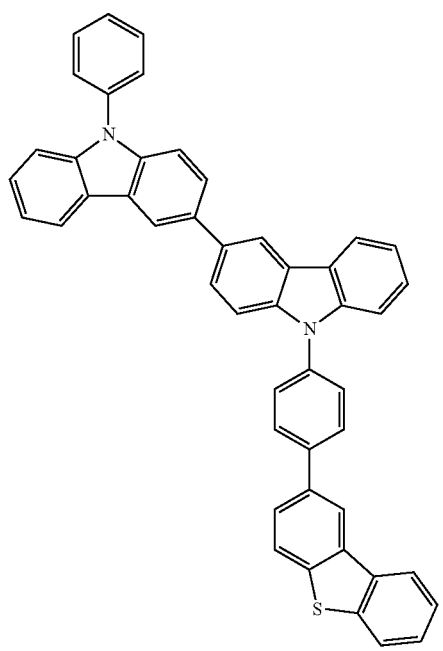

-continued
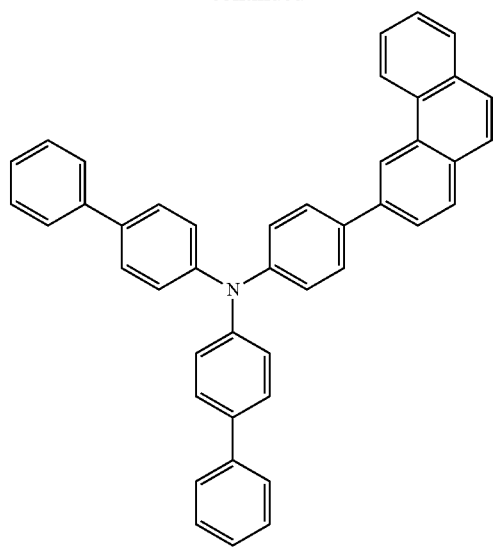
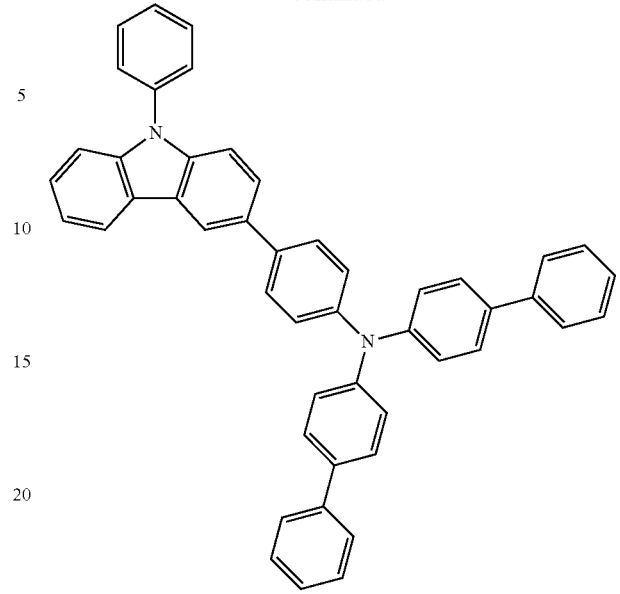
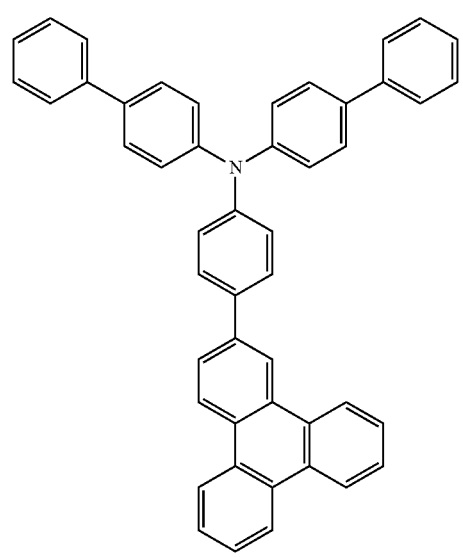
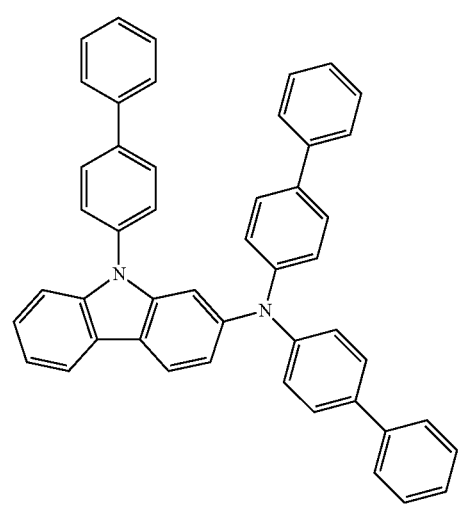
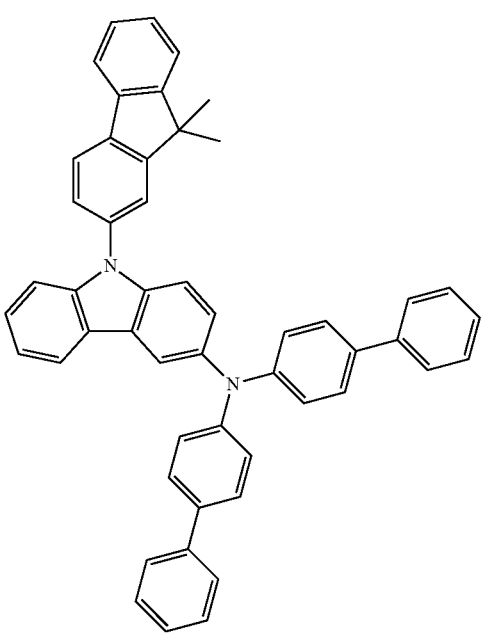

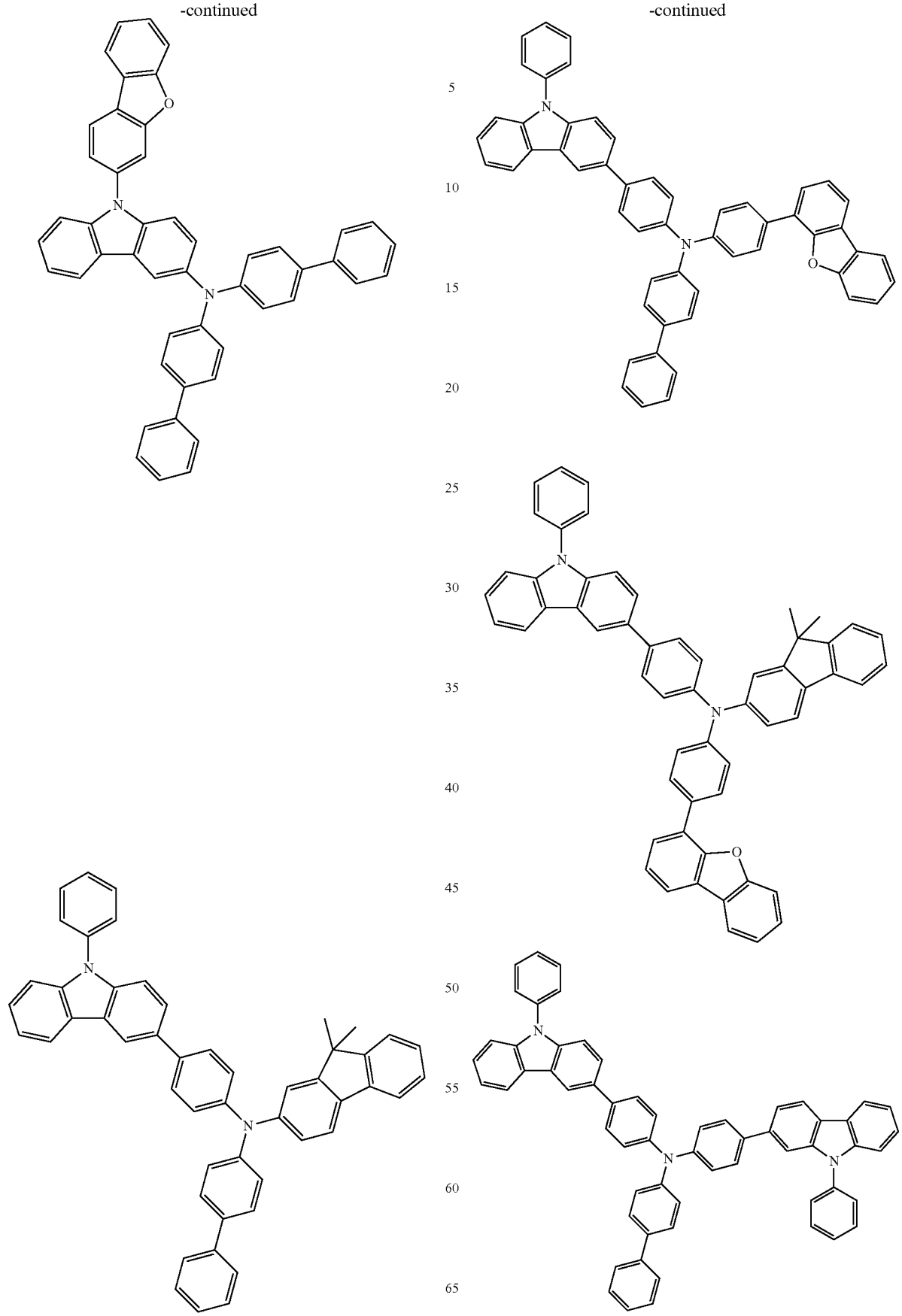

63
-continued
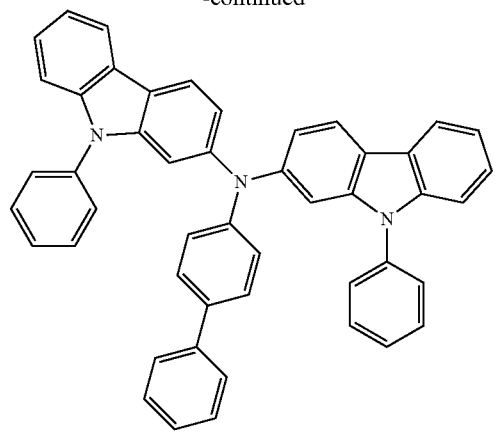
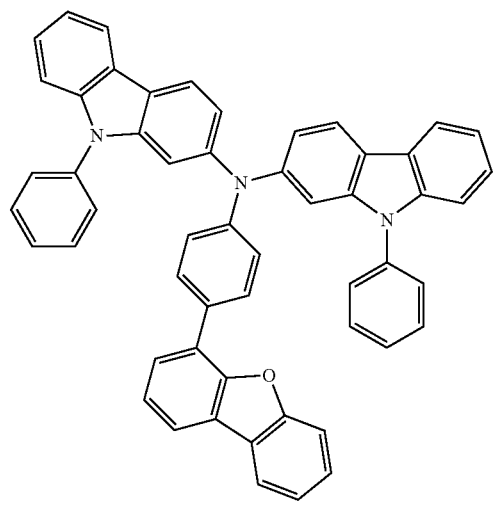
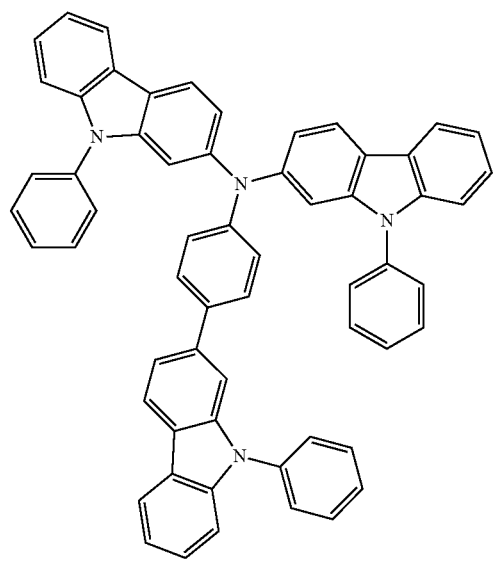
64
-continued
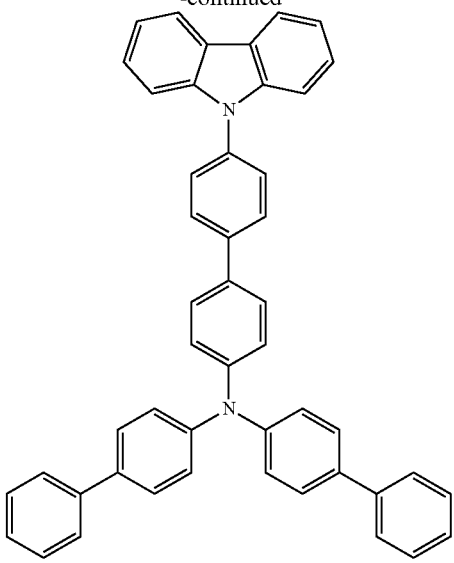
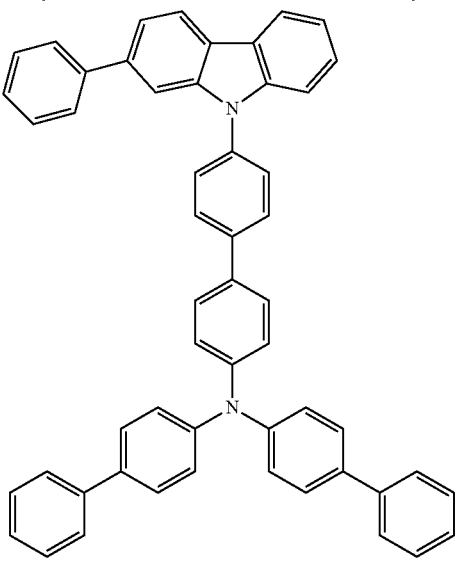
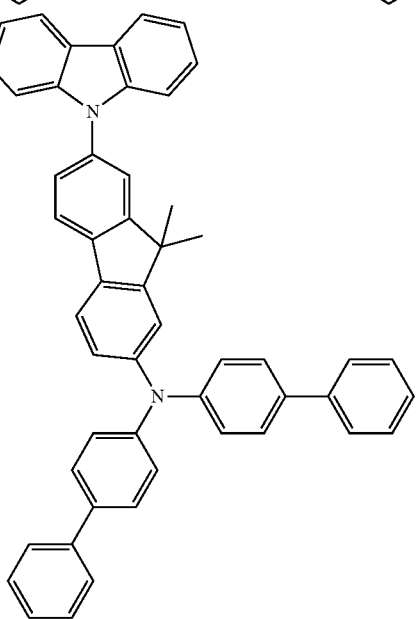

65
-continued
66
-continued
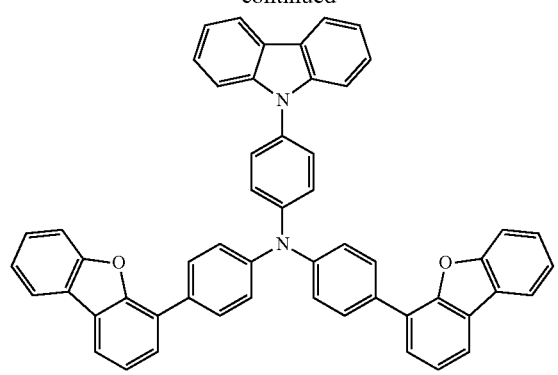
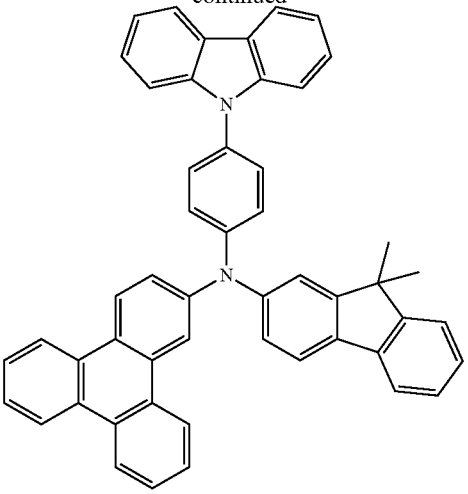
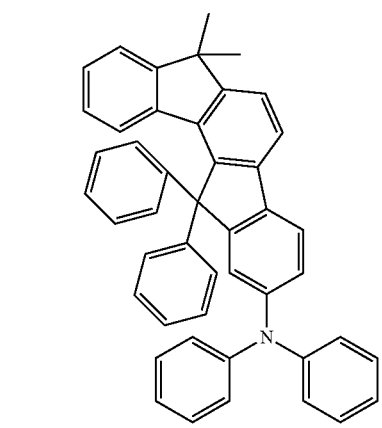
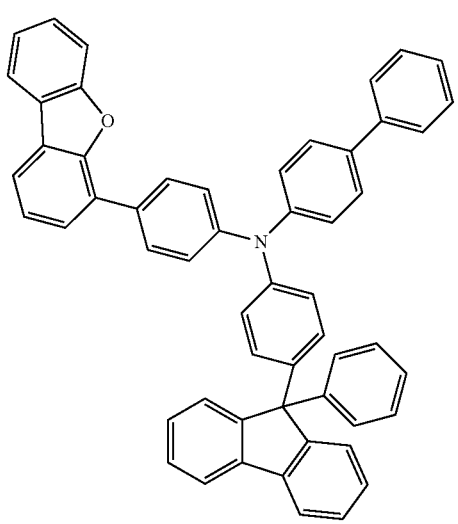

67
-continued
68
-continued
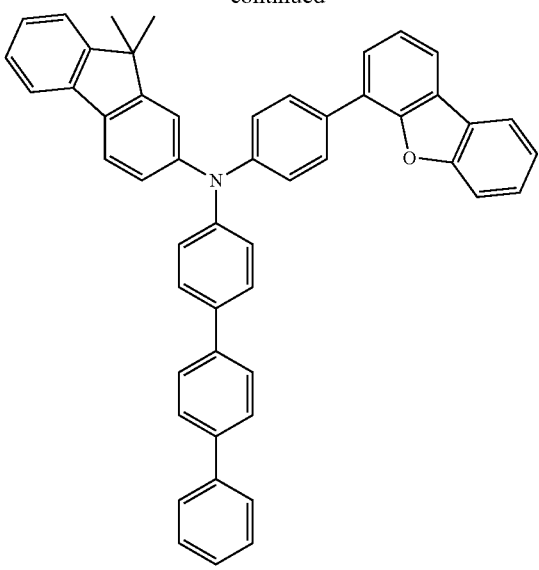
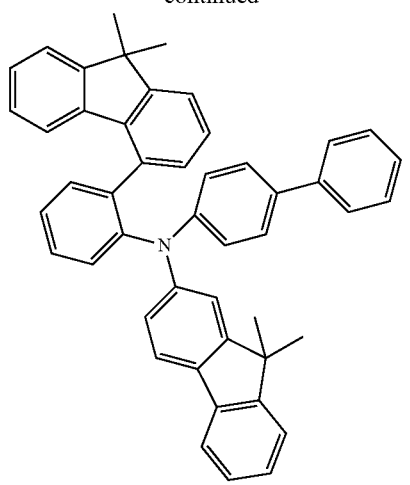
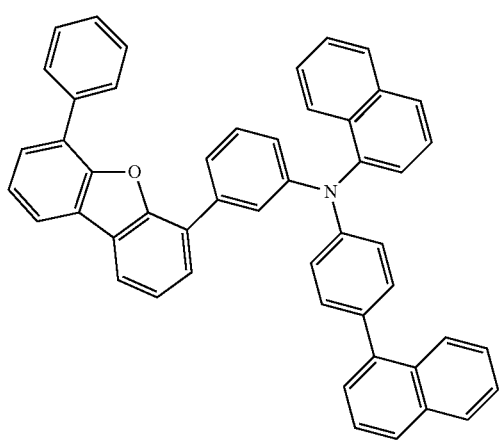
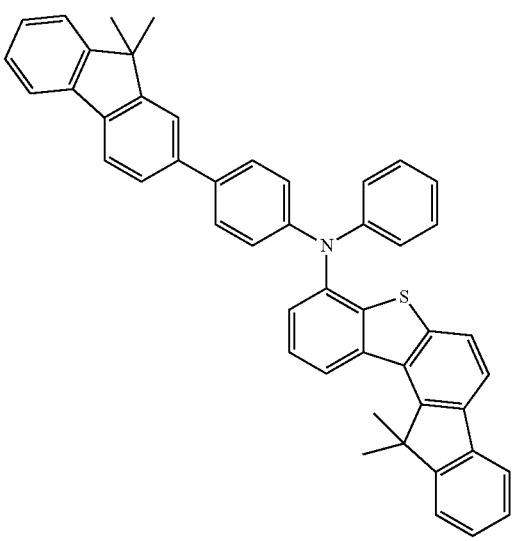
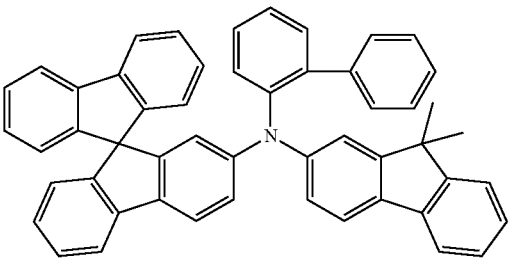

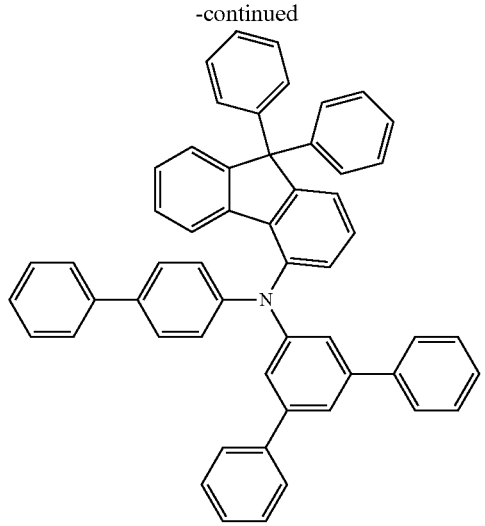
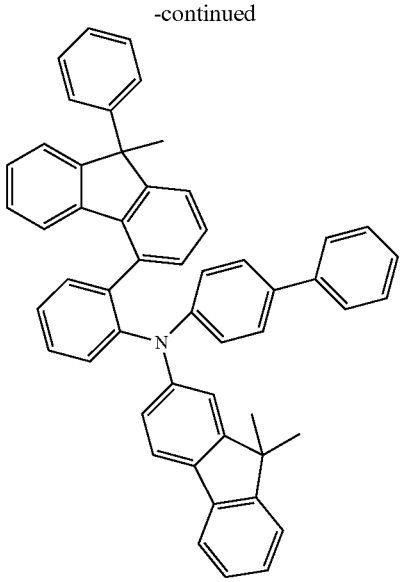
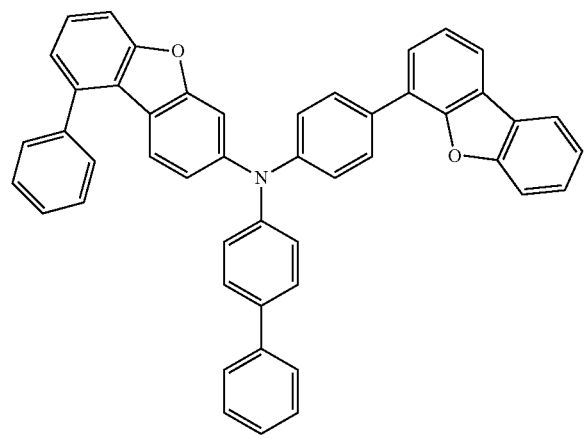
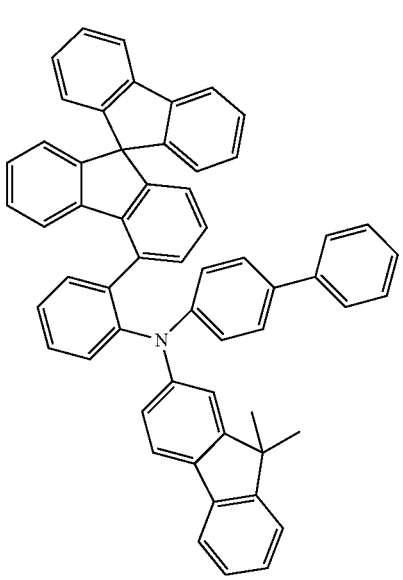
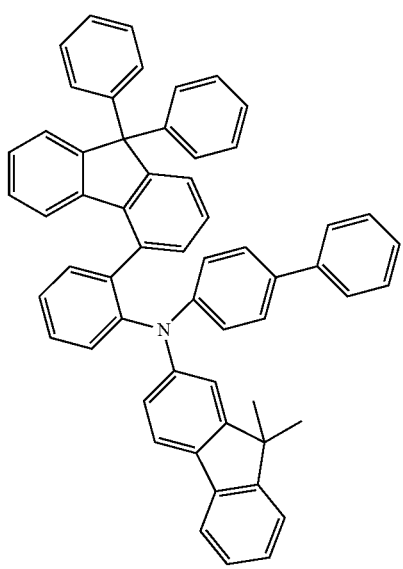

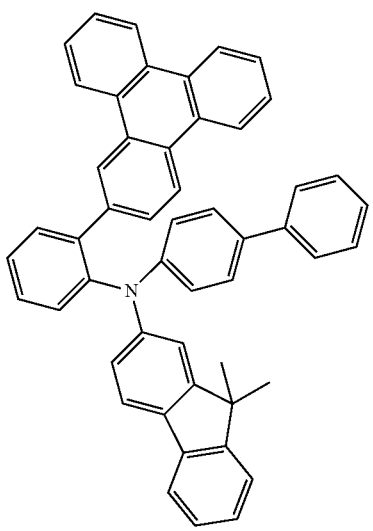
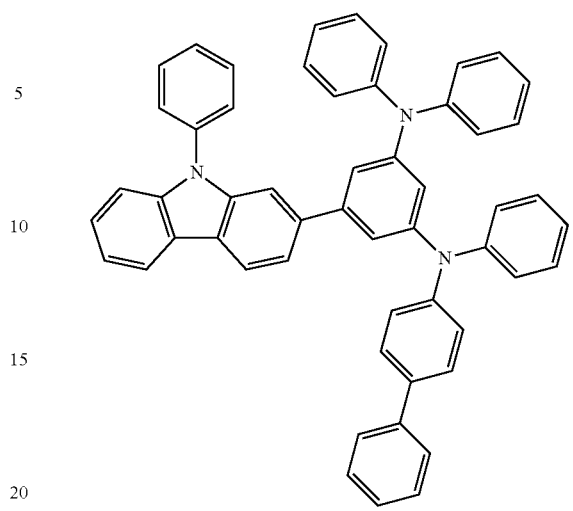
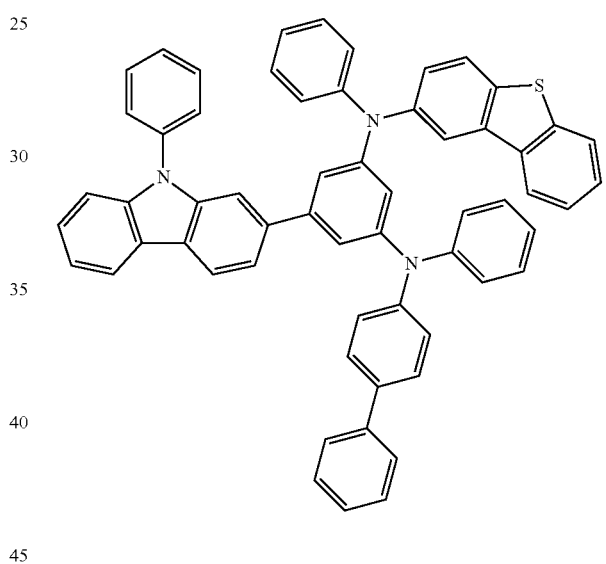
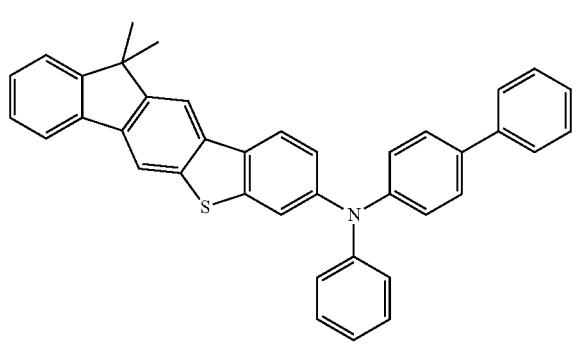
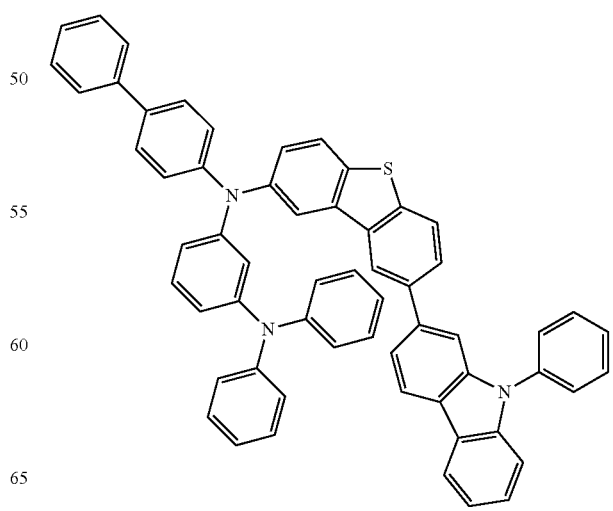

73
-continued
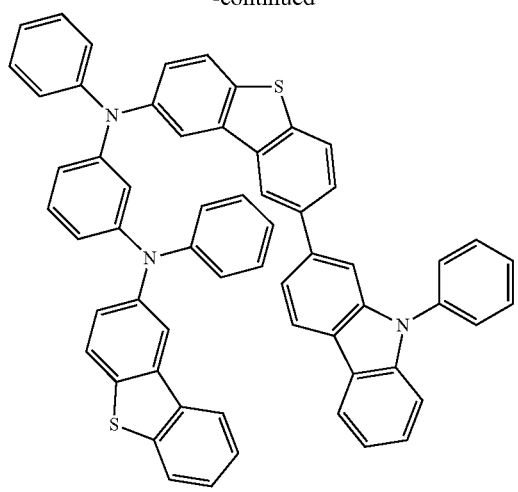
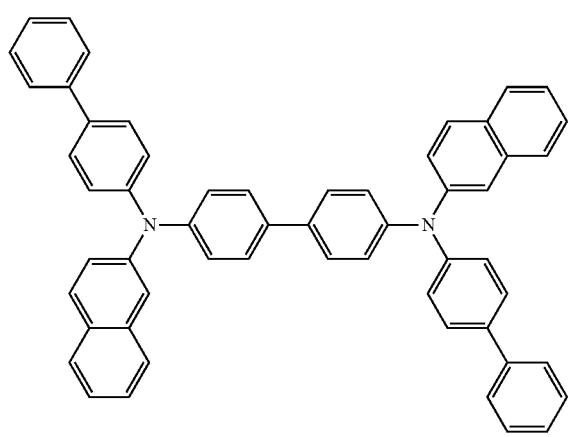
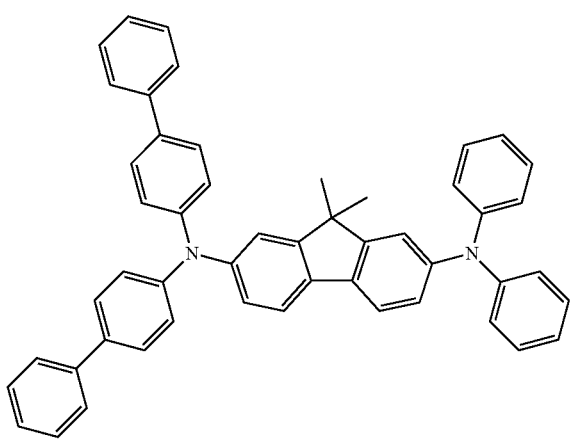
74
-continued
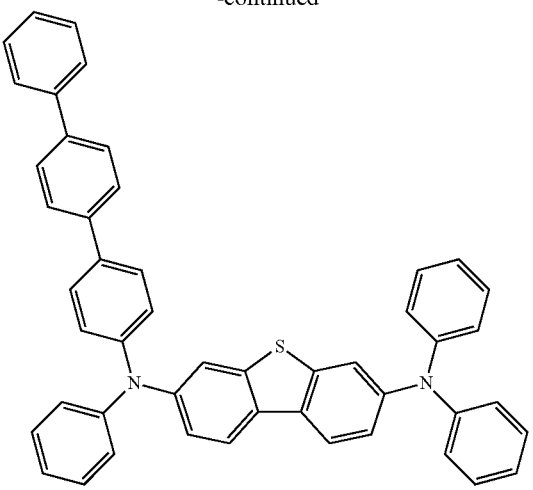
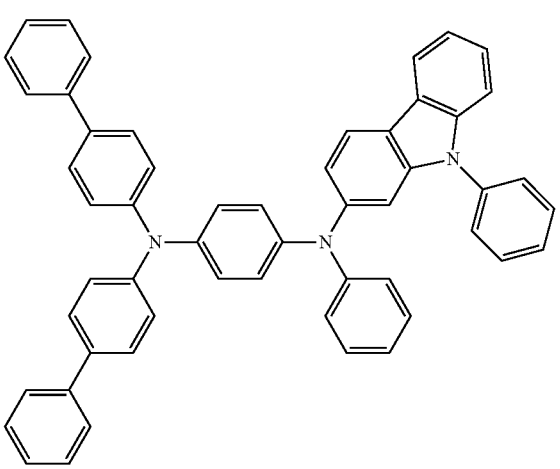
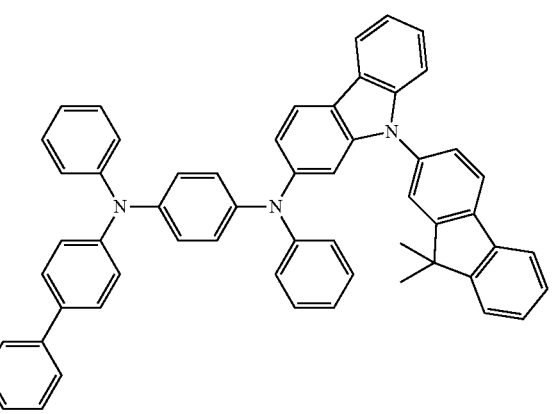

75
-continued
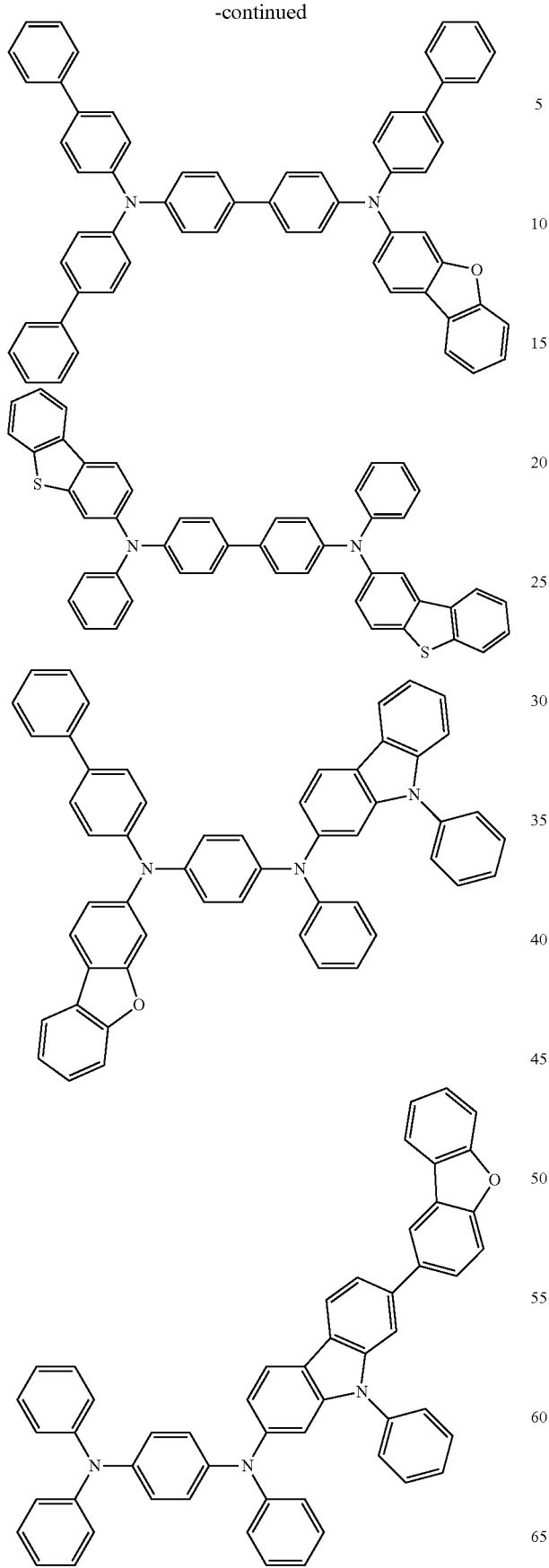
76
-continued
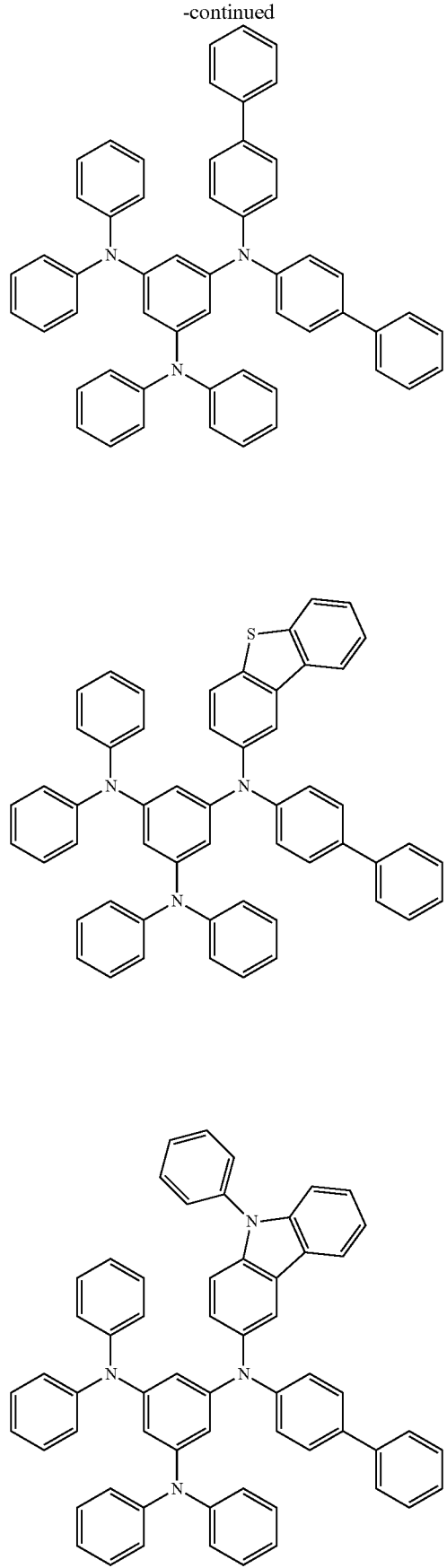

77
-continued
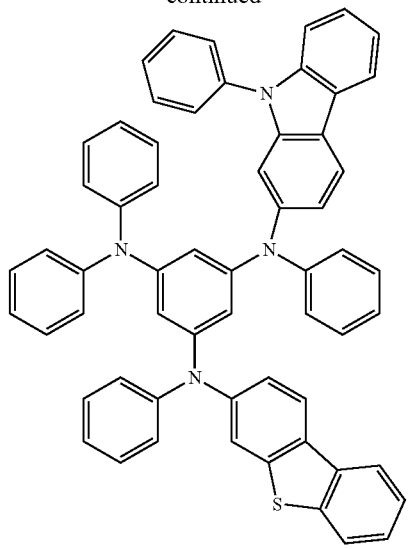
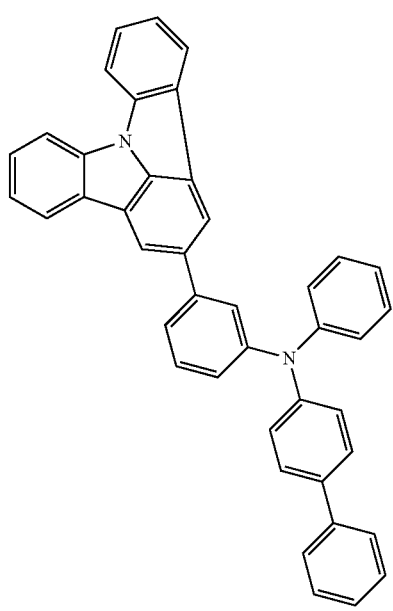
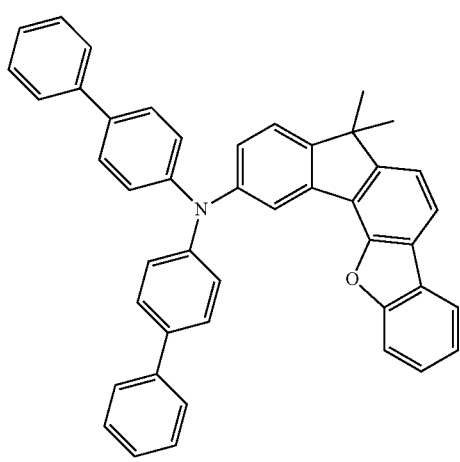
78
-continued
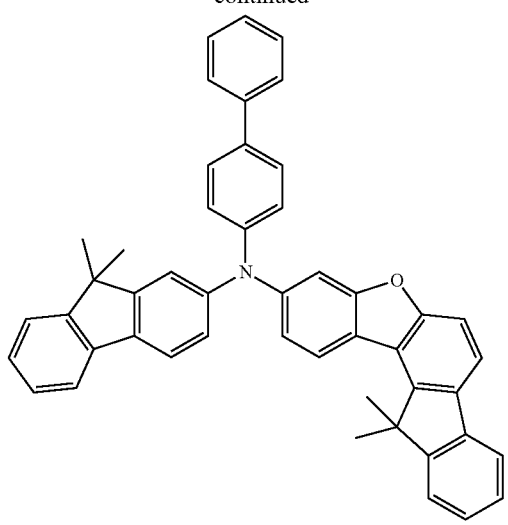
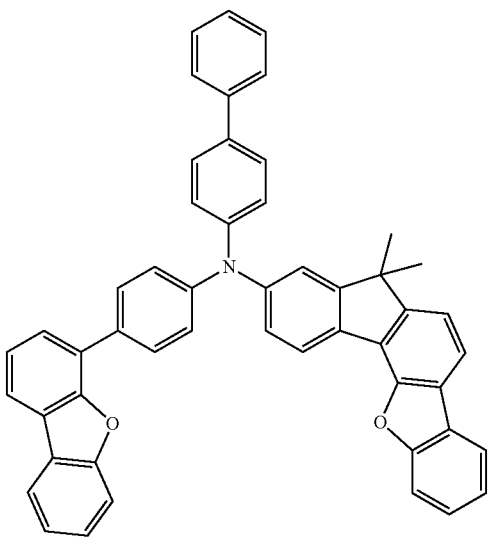
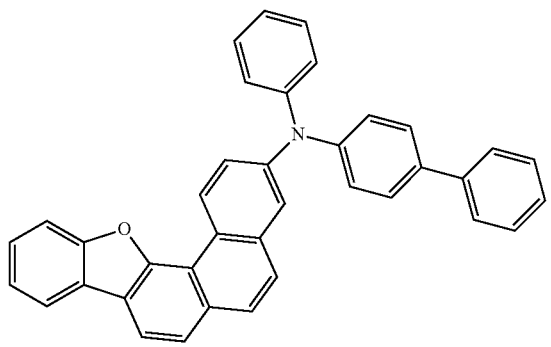

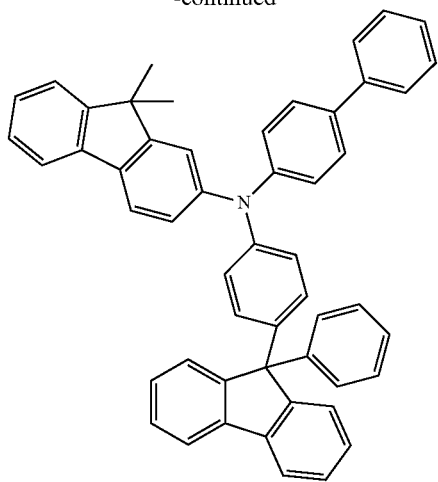
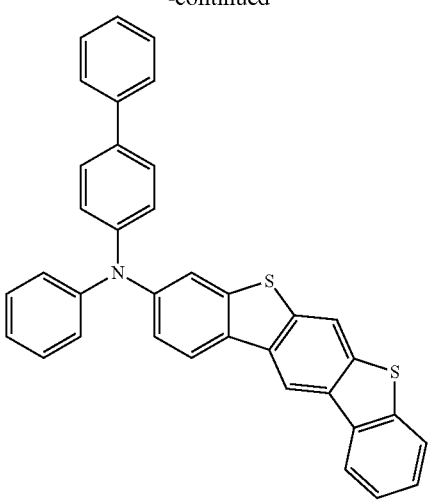
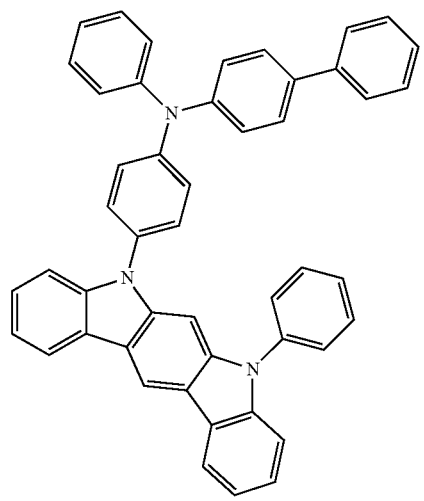
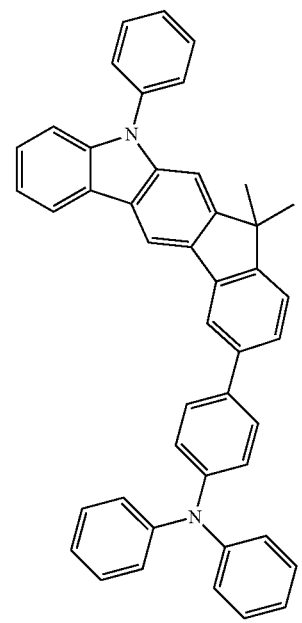
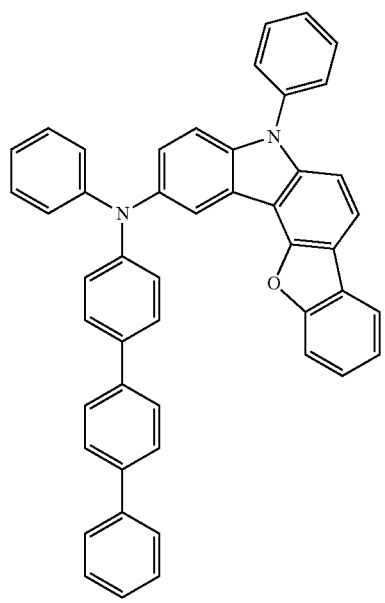
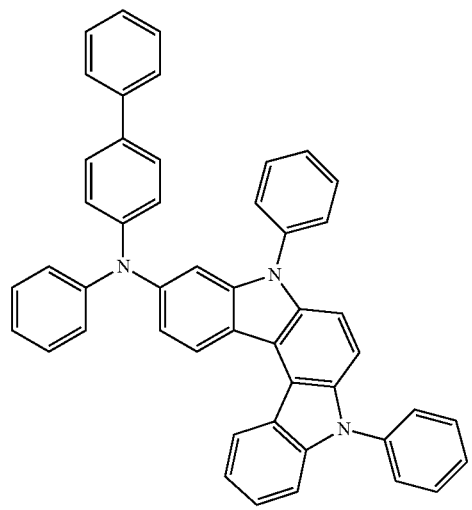

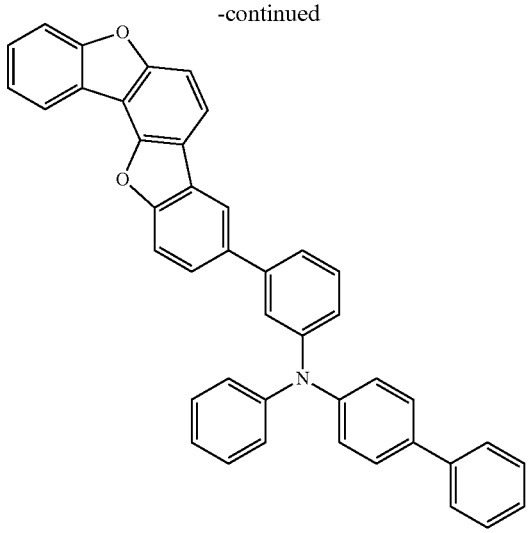

In an implementation, in the hole transport auxiliary layer, other suitable compounds may be used in addition to the aforementioned compounds.

In an implementation, an organic light emitting diode may further include an electron transport layer, an electron injection layer, or a hole injection layer as the organic layer 105.

The organic light emitting diodes 100 and 200 may be manufactured by forming an anode or a cathode on a substrate, forming an organic layer using a dry film formation method such as a vacuum deposition method (evaporation), sputtering, plasma plating, and ion plating, and forming a cathode or an anode thereon.

The organic light emitting diode may be applied to an organic light emitting display device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Hereinafter, starting materials and reactants used in examples and synthesis examples were purchased from Sigma-Aldrich Co. Ltd., TCI Inc., Tokyo chemical industry or P&H tech as far as there is no particular comment or were synthesized by suitable methods.

(Preparation of Composition for Organic Optoelectronic Device)

The compounds described below were synthesized through the following steps.

Synthesis of First Compound

Synthesis Example 1: Synthesis of Compound 1-38

[Reaction Scheme 1]

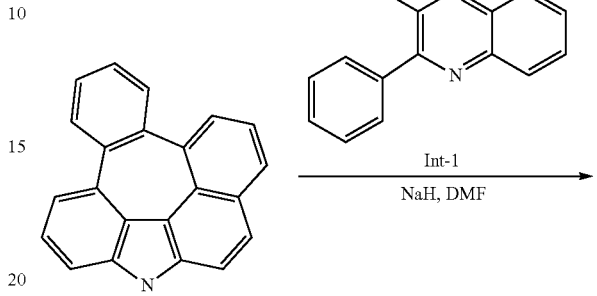

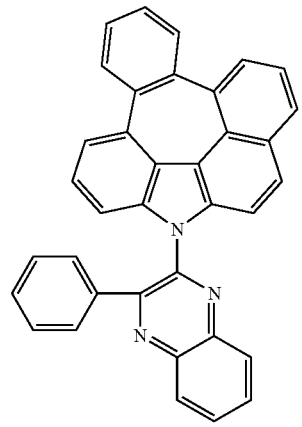

1-38

12 g (41 mmol) of 1H-3-azadibenzo[g,ij]naphth[2,1,8-cde]azulene (CAS No. 2306215-72-3), 10.41 g (43 mmol) of Intermediate Int-1, dimethyl formamide (200 ml), and xylene (150 ml) were put in a round-bottomed flask and then, stirred under a nitrogen atmosphere at ambient temperature. Subsequently, 3.3 g (82 mmol) of sodium hydride was slowly added thereto and then, stirred at ambient temperature for 12 hours. When a reaction was completed, methanol and distilled water were added to the reactant at 0° C. and then, stirred and filtered, and a solid obtained therefrom was washed with distilled water. The solid was dissolved in toluene and then, filtered through silica gel pad, and a filtrate therefrom was concentrated under a reduced pressure and recrystallized in toluene, obtaining 15 g (Yield: 74%) of Compound 1-38.

Synthesis Example 2: Synthesis of Compound 1-10

Synthesis of Second Compound

Synthesis Example 3: Synthesis of Compound 2-2

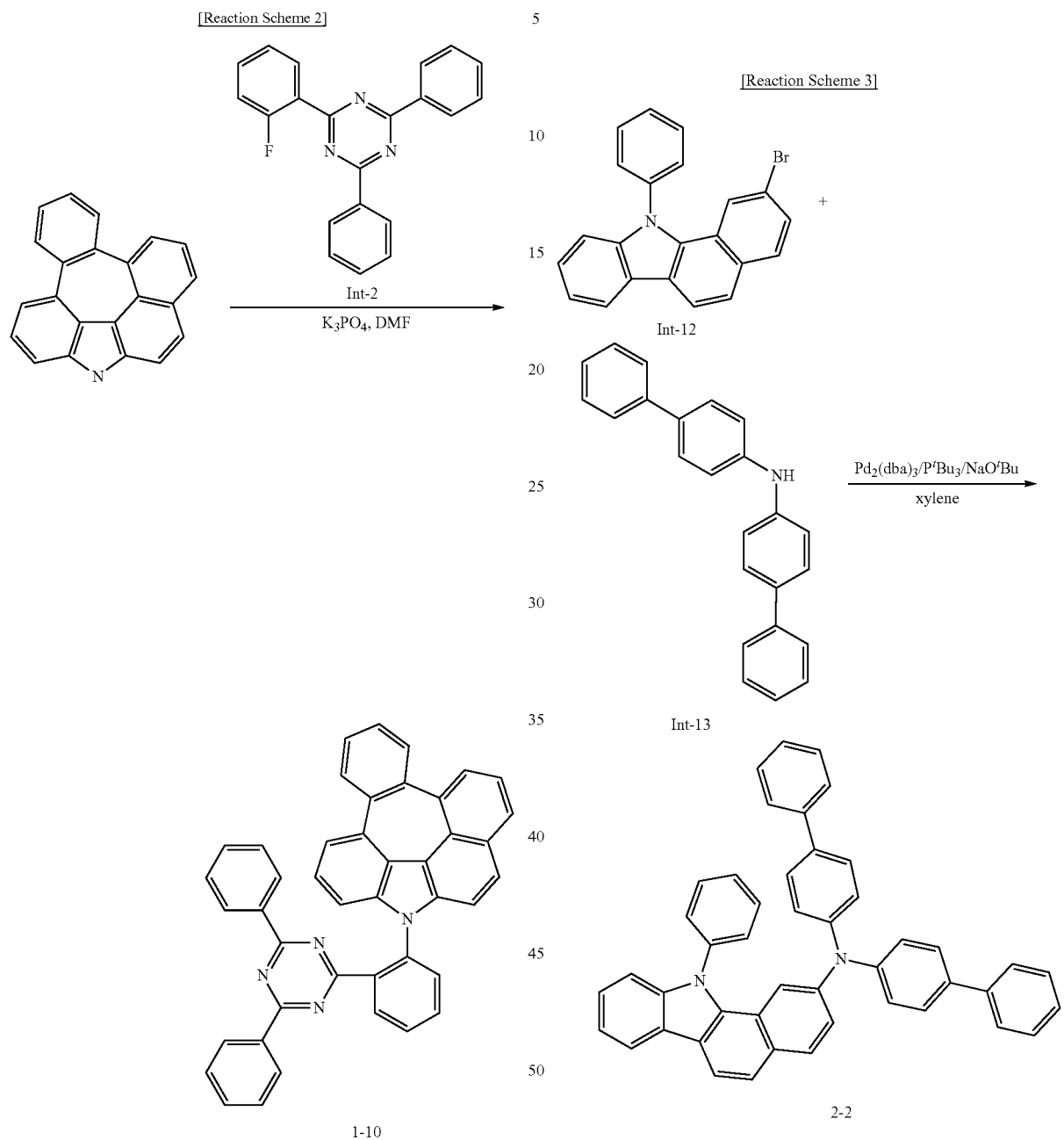

10 g (34 mmol) of 1H-3-azadibenzo[g,ij]naphth[2,1,8-cde]azulene (CAS No. 2306215-72-3), 11.8 g (36 mmol) of Intermediate Int-2, 14.6 g (69 mmol) of $K_3PO_4$, dimethyl formamide (170 ml), and xylene (170 ml) were put in a round-bottomed flask and then stirred. When a reaction was completed, the resultant was concentrated under reduced a pressure and then, extracted by adding methylene chloride (MC) and distilled water thereto. An extract therefrom was concentrated under a reduced pressure and recrystallized in MC and hexane, obtaining 19.1 g (Yield: 93%) of Compound 1-10.

Int-12 (23.2 g, 62.5 mmol), Int-13 (21.1 g, 65.6 mmol), sodium t-butoxide (NaOtBu) (9.0 g, 93.8 mmol), $Pd_2(dba)_3$ (3.4 g, 3.7 mmol), and tri t-butylphosphine ($P(tBu)_3$) (4.5 g, 50% in toluene) were added to xylene (300 mL) and then, heated under reflux for 12 hours under a nitrogen atmosphere. After removing the xylene, 200 mL of methanol was added to the obtained mixture to crystallize a solid, and the solid was filtered, dissolved in toluene, and filtered with silica gel/Celite, and then, an appropriate amount of the solvent was concentrated, obtaining Compound 2-2 (29 g, 76%).

LC/MS calculated for: $C_{46}H_{32}N_2$ Exact Mass: 612.26 found for 612.32 [M+H]

Synthesis Examples 4 to 11

Each Compound according to the Examples was synthesized according to the same method as used to synthesize Compound 2-2 of Synthesis Example 3 except that Int-13 was changed into Int-C as shown in Table 1.

TABLE 1

| Synthesis Examples | Int-C | Final product | Amount (yield) | Property data of final products |
|---|---|---|---|---|
| Synthesis Example 4 | 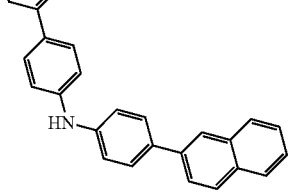<br>Int-14 | 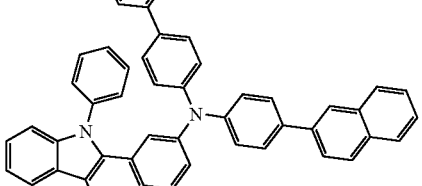<br>2-6 | 10.25 g (78%) | LC/MS calculated for: C46H32N2 Exact Mass: 612.26 found for 612.35 [M + H] |
| Synthesis Example 5 | 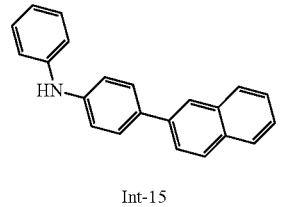<br>Int-15 | 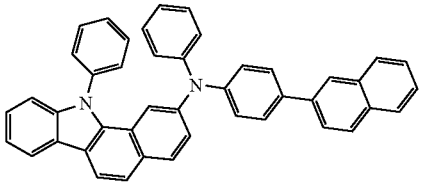 [SMILES: c1ccc(N(c2ccc(-c3ccc4ccccc4c3)cc2)c2ccc3ccc4c5ccccc5n(-c5ccccc5)c4c3c2)cc1]<br>2-10 | 11.10 g (75%) | LC/MS calculated for: C44H30N2 Exact Mass: 586.24 found for 586.31 [M + H] |
| Synthesis Example 6 | 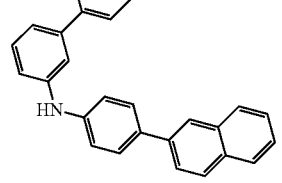<br>Int-16 | 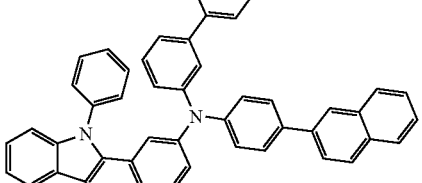<br>2-58 | 12.34 g (77%) | LC/MS calculated for: C50H34N2 Exact Mass: 662.27 found for 662.34 [M + H] |
| Synthesis Example 7 | 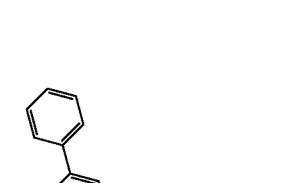<br>Int-17 | 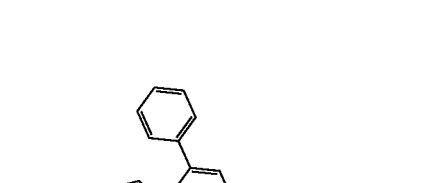<br>2-59 | 9.15 g (70%) | LC/MS calculated for: C50H34N2 Exact Mass: 662.27 found for 662.36 [M + H] |

TABLE 1-continued

| Synthesis Examples | Int-C | Final product | Amount (yield) | Property data of final products |
|---|---|---|---|---|
| Synthesis Example 8 | Int-18 | 2-60 | 9.75 g (75%) | LC/MS calculated for: C50H34N2 Exact Mass: 662.27 found for 662.36 [M + H] |
| Synthesis Example 9 | Int-19 | 2-62 | 10.02 g (85%) | LC/MS calculated for: C50H34N2 Exact Mass: 662.27 found for 662.38 [M + H] |
| Synthesis Example 10 | Int-20 | 2-63 | 11.35 g (77%) | LC/MS calculated for: C50H32N2O Exact Mass: 676.25 found for 676.42 [M + H] |
| Synthesis Example 11 | Int-21 | 2-64 | 11.24 g (81%) | LC/MS calculated for: C50H32N2O Exact Mass: 676.25 found for 676.35 [M + H] |

Manufacture of Organic Light Emitting Diode

Example 1

A glass substrate coated with ITO (Indium tin oxide) was washed with distilled water. After washing with the distilled water, the glass substrate was ultrasonically washed with isopropyl alcohol, acetone, or methanol, dried and then, moved to a plasma cleaner, cleaned by using oxygen plasma for 10 minutes, and moved to a vacuum depositor. This obtained ITO transparent electrode was used as an anode, Compound A doped with 1% NDP-9 (available from Novaled) was vacuum-deposited on the ITO substrate to form a 1,400 Å-thick hole transport layer, and Compound B was deposited on the hole transport layer to form a 600 Å-thick hole transport auxiliary layer. On the hole transport auxiliary layer, a 400 Å-thick light emitting layer was formed by vacuum-depositing Compound 1-38 of Synthesis Example 1 and Compound 2-6 of Synthesis Example 4 as a host simultaneously and doping 2 wt % of [Ir(piq)$_2$acac] as a dopant. Subsequently, Compound C was deposited on the light emitting layer to form a 50 Å-thick electron transport auxiliary layer, and Compound D and LiQ were simultaneously vacuum deposited at a weight ratio of 1:1 to form a 300 Å-thick electron transport layer. On the electron transport layer, Liq and Al were sequentially vacuum-deposited to be 15 Å thick and 1,200 Å thick, manufacturing an organic light emitting diode having the following structure.

ITO/Compound A (1% NDP-9 doping, 1,400 Å)/Compound B (600 Å)/EML [Compound 1-38: Compound 2-6: [Ir(piq)$_2$acac] (2 wt %)] (400 Å)/Compound C (50 Å)/Compound D: Liq (300 Å)/LiQ (15 Å)/Al (1,200 Å).

Compound A: N-(biphenyl-4-yl)-9,9-dimethyl-N-(4-(9-phenyl-9H-carbazol-3-yl)phenyl)-9H-fluoren-2-amine
Compound B: N,N-di([1,1'-biphenyl]-4-yl)-7,7-dimethyl-7H-fluoreno[4,3-b]benzofuran-10-amine
Compound C: 2-(3-(3-(9,9-dimethyl-9H-fluoren-2-yl)phenyl)phenyl)-4,6-diphenyl-1,3,5-triazine
Compound D: 8-(4-(4,6-di(naphthalen-2-yl)-1,3,5-triazin-2-yl)phenyl)quinoline Examples 2 to 4 and Comparative Examples 1 to 3

Diodes of Examples 2 to 4, and Comparative Examples 1 to 3 were manufactured in the same manner as in Example 1 except that the host was changed as described in Table 2.
Evaluation: Effect of Life-Span Increase Effect
Life-span characteristics of the organic light emitting diodes according to Examples 1 to 4 and Comparative Examples 1 to 3 were evaluated. Specific measurement methods are as follows, and the results are shown in Table 2.
(1) Measurement of Life-Span
T97 life-spans of the organic light emitting diodes according to Example 1 to Example 4, and Comparative Example 1 to Comparative Example 3 were measured as a time when their luminance decreased down to 97% relative to the initial luminance (cd/m$^2$) after emitting light at 9,000 cd/m$^2$ as the initial luminance (cd/m$^2$) and measuring their luminance decrease depending on a time with a Polanonix life-span measurement system.
(2) Calculation of T97 Life-Span Ratio (%)
In Table 2, it was evaluated based on the T97 life-span of Comparative Example 2.

TABLE 2

| | First host | Second host | First host: second host (wt %:wt %) | T97 life-span ratio (%) |
|---|---|---|---|---|
| Example 1 | 1-38 | 2-6 | 5:5 | 270 |
| Example 2 | 1-10 | 2-6 | 5:5 | 279 |
| Example 3 | 1-38 | 2-62 | 5:5 | 250 |
| Example 4 | 1-10 | 2-62 | 5:5 | 258 |
| Comparative Example 1 | 1-38 | — | 10:0 | 135 |
| Comparative Example 2 | 1-10 | — | 10:0 | 100 |
| Comparative Example 3 | 1-10 | V-1 | 5:5 | 50 |

Referring to Table 2, the compounds according to the Examples exhibited significantly improved life-span compared with the Comparative Examples.
One or more embodiments may provide a composition for an organic optoelectronic device capable of implementing a low driving organic optoelectronic device having high efficiency.
Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A composition for an organic optoelectronic device, the composition comprising:
a first compound represented by Chemical Formula 1, and a second compound represented by a combination of Chemical Formula 2 and Chemical Formula 3,

[Chemical Formula 1]

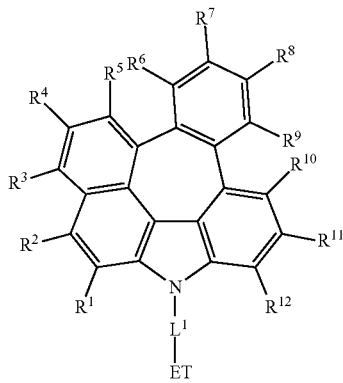

wherein, in Chemical Formula 1,
$R^1$ to $R^{12}$ are each independently hydrogen, deuterium, a cyano group, a halogen, a substituted or unsubstituted C1 to C30 alkyl group, or a substituted or unsubstituted C6 to C30 aryl group,
$L^1$ is a single bond or a substituted or unsubstituted C6 to C30 arylene group, and
ET is a substituted or unsubstituted pyridinyl group, a substituted or unsubstituted pyrimidinyl group, a substituted or unsubstituted triazinyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzofuranpyrimidinyl group, or a substituted or unsubstituted benzothiophenepyrimidinyl group;

[Chemical Formula 2]

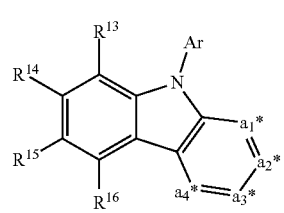

[Chemical Formula 3]

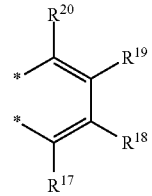

wherein, in Chemical Formula 2 and Chemical Formula 3,
Ar is a substituted or unsubstituted C6 to C30 aryl group or a substituted or unsubstituted C2 to C30 heterocyclic group, two adjacent ones of a1* to a4* of Chemical Formula 2 are linking carbons linked at * of Chemical Formula 3, the remaining two of a1* to a4* of Chemical Formula 2, not linked at * of Chemical Formula 3, are $CR^a$, $R^a$ and $R^{13}$ to $R^{20}$ are each independently hydrogen, deuterium, a cyano group, a substituted or unsubstituted amine group, a substituted or unsubstituted C1 to C30 alkyl group, a substituted or unsubstituted C6 to C30 aryl group, or a substituted or unsubstituted C2 to C30 heterocyclic group, and at least one of $R^{17}$ to $R^{20}$ is a group represented by Chemical Formula a,

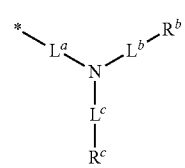

[Chemical Formula a]

wherein, in Chemical Formula a, $L^a$, $L^b$, and $L^c$ are each independently a single bond, a substituted or unsubstituted C6 to C20 arylene group, or a substituted or unsubstituted C2 to C20 heterocyclic group, $R^b$ and $R^c$ are each independently a substituted or unsubstituted C6 to C30 aryl group or a substituted or unsubstituted C2 to C30 heterocyclic group, and

* is a linking point.

2. The composition as claimed in claim 1, wherein ET of Chemical Formula 1 is a substituted or unsubstituted pyrimidinyl group, a substituted or unsubstituted triazinyl group, a substituted or unsubstituted quinazolinyl group, a substituted or unsubstituted quinoxalinyl group, a substituted or unsubstituted benzofuranpyrimidinyl group, or a substituted or unsubstituted benzothiophenepyrimidinyl group.

3. The composition as claimed in claim 1, wherein ET of Chemical Formula 1 is a group of Group I:

[Group I]

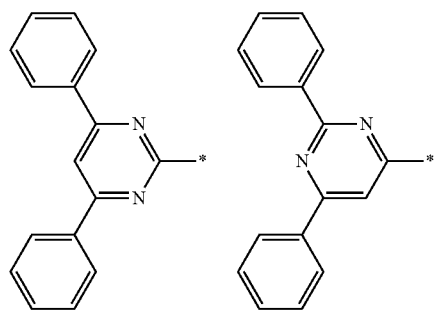

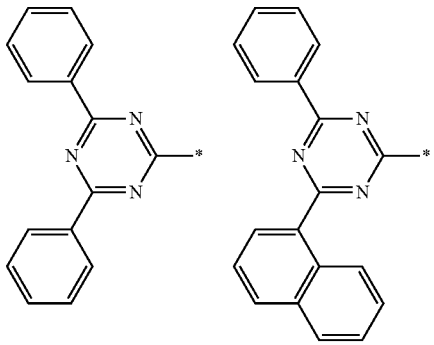

-continued

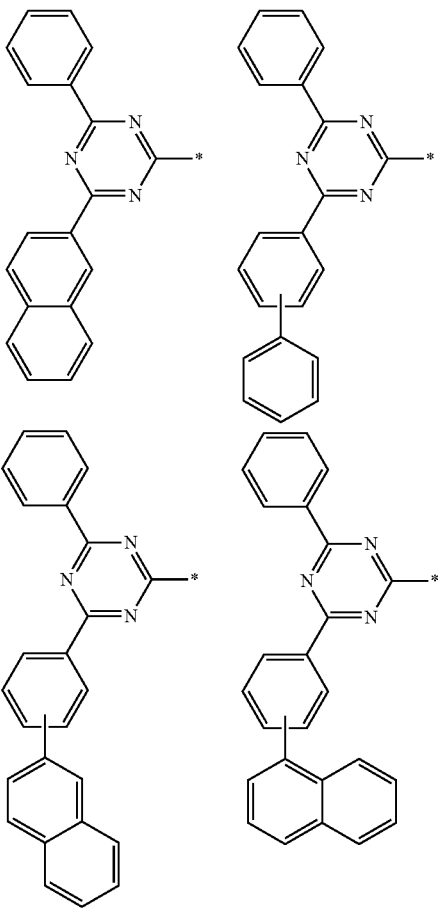

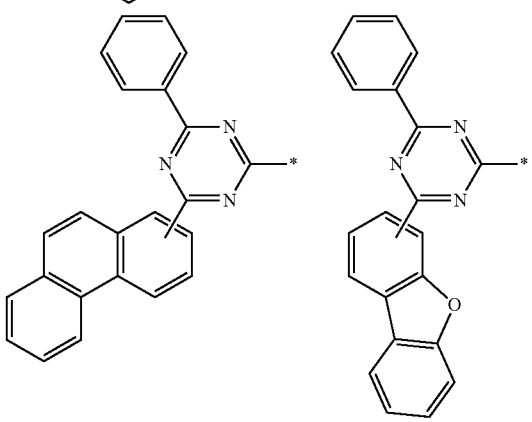

-continued
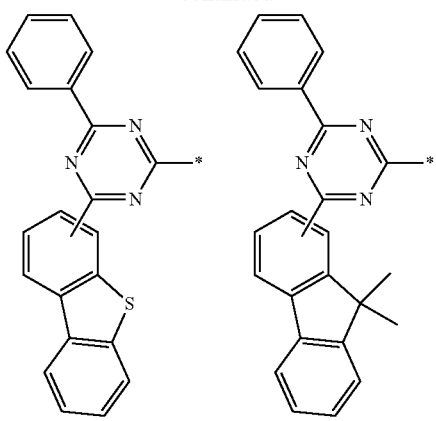
wherein, in Group I, * is a linking point.
4. The composition as claimed in claim 1, wherein the first compound is a compound of Group 1:
[Group 1]
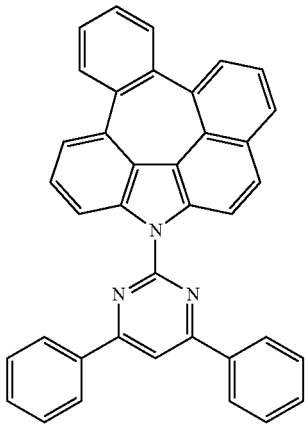
[1-1]
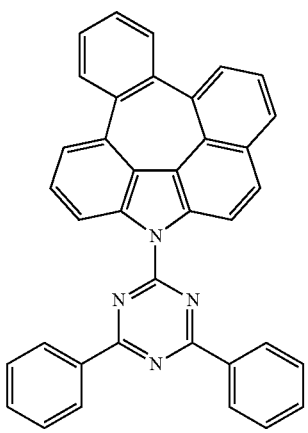
[1-2]
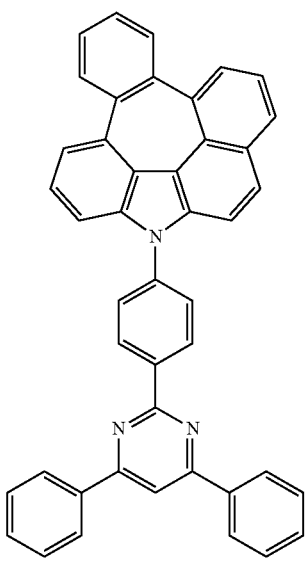
[1-3]

[1-4]
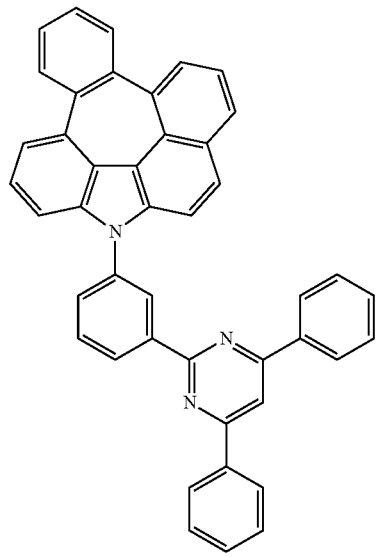
[1-5]
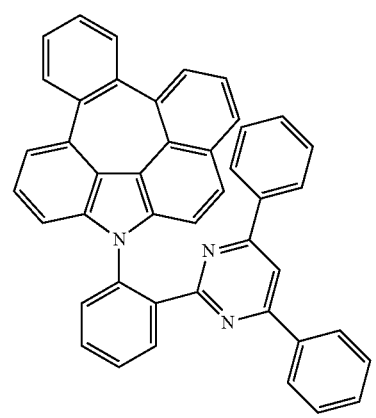
[1-6]
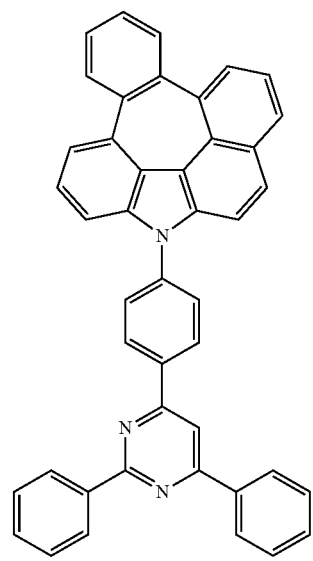
[1-7]
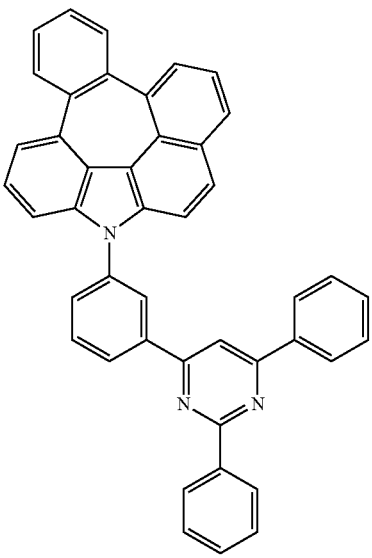
[1-8]
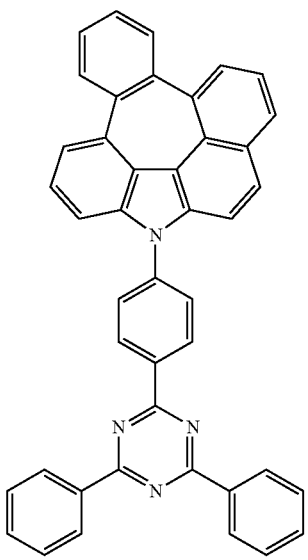

[1-9]
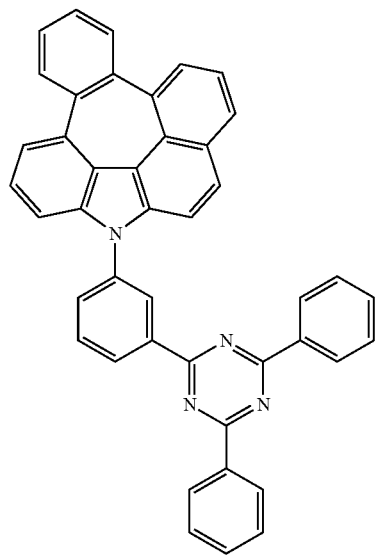
[1-10]
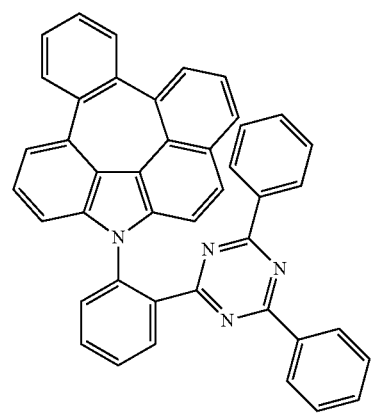
[1-11]
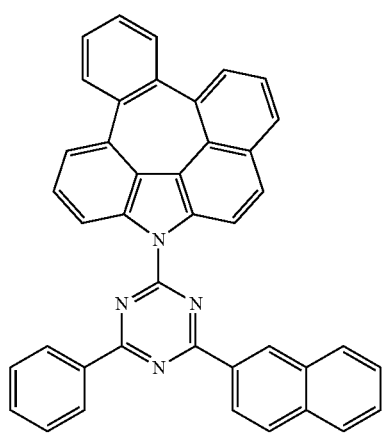
[1-12]
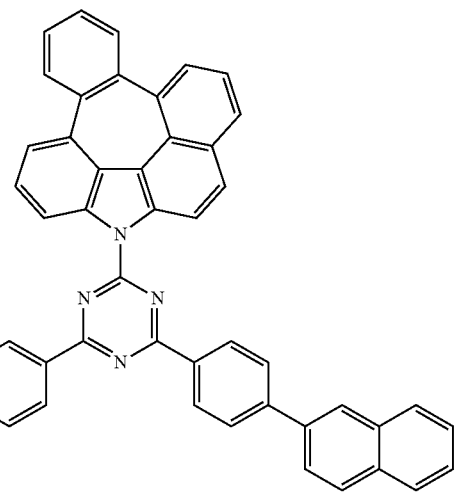
[1-13]
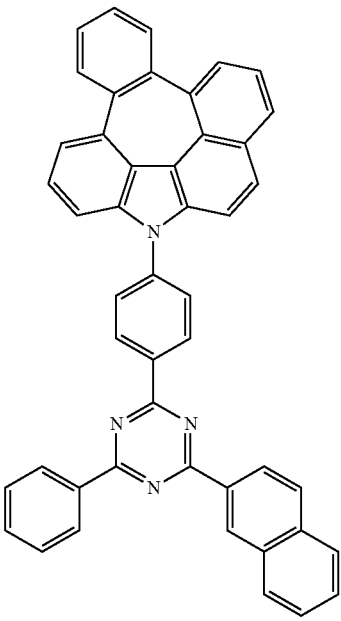
[1-14]
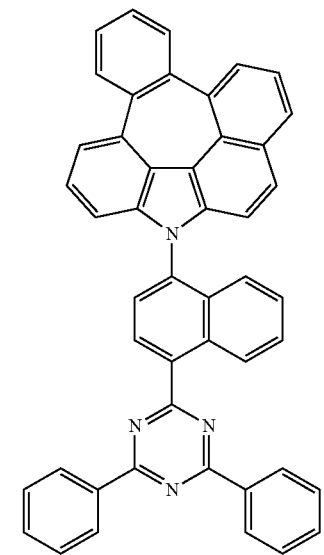

[1-15]
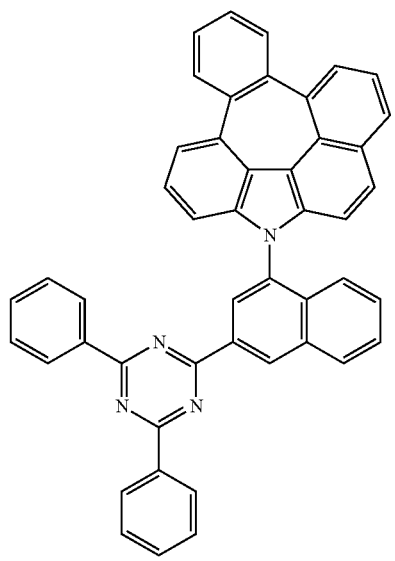
[1-16]
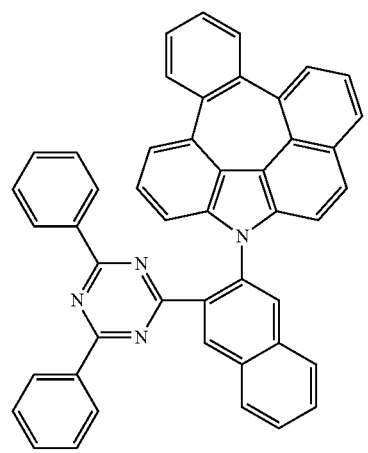
[1-17]
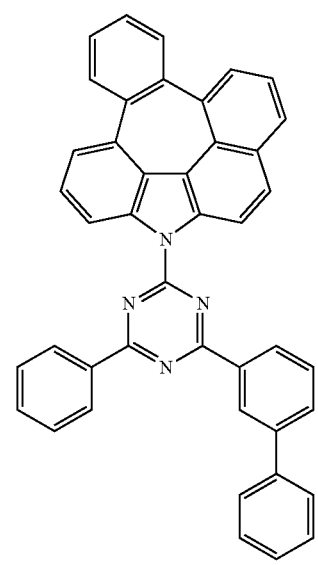
[1-18]
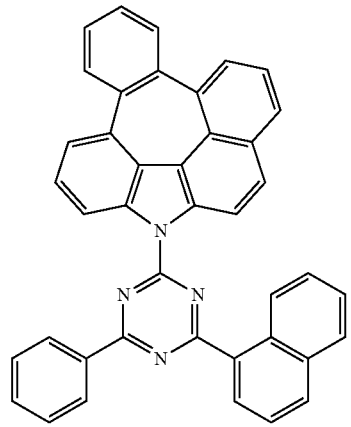
[1-19]
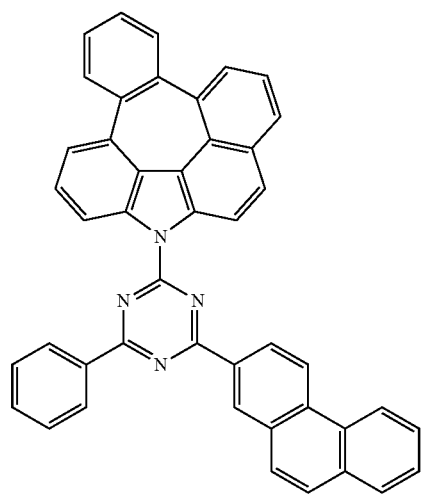
[1-20]
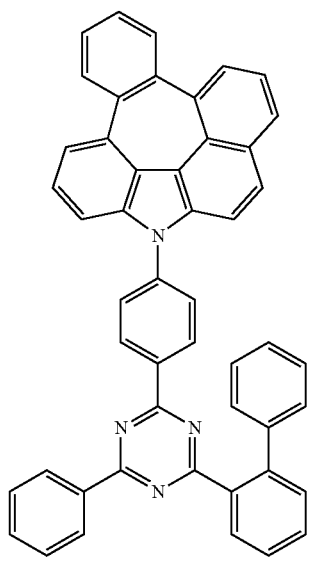

-continued
[1-21]
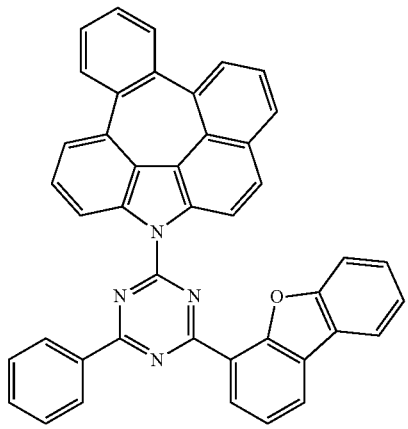
[1-22]
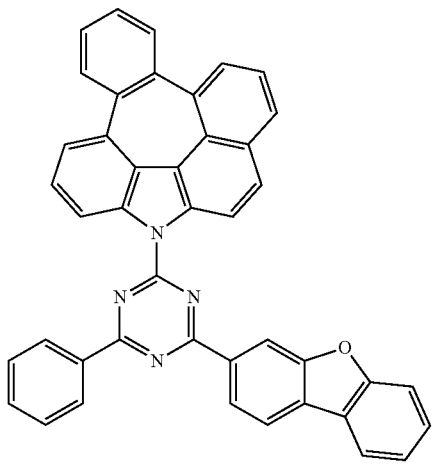
[1-23]
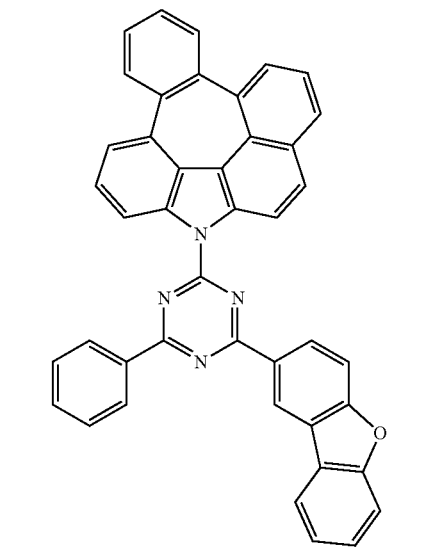
-continued
[1-24]
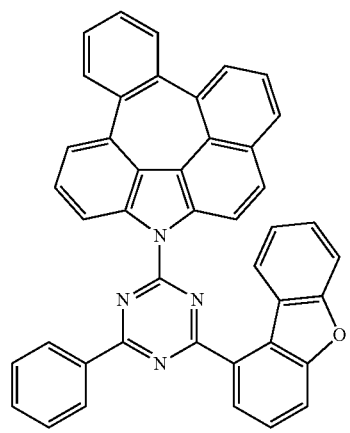
[1-25]
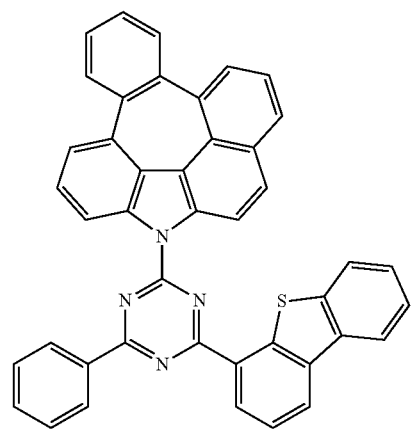
[1-26]
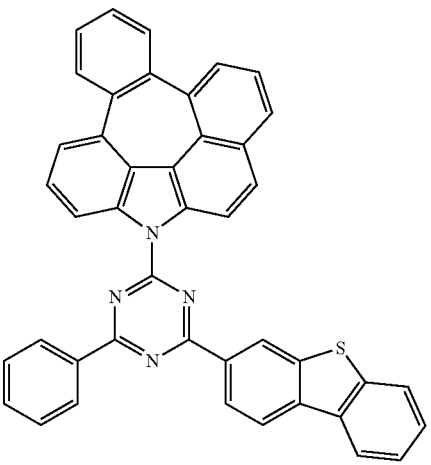

[1-27]
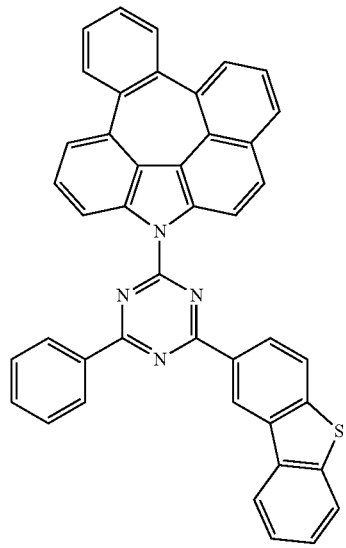
[1-28]
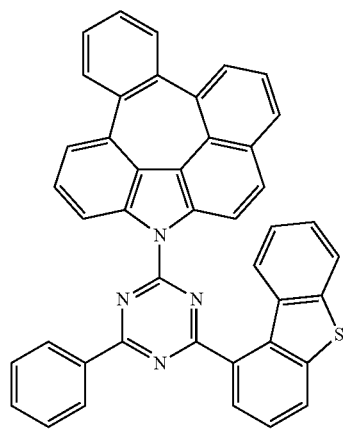
[1-29]
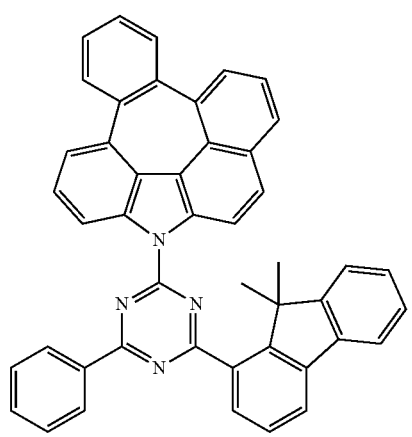
[1-30]
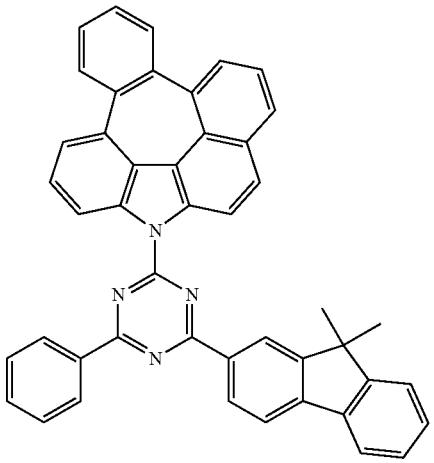
[1-31]
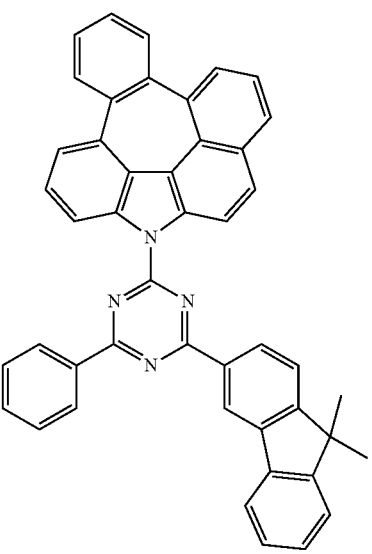
[1-32]
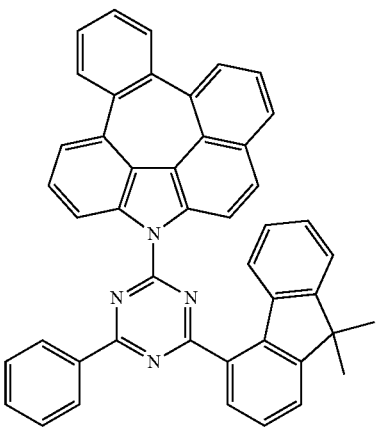

[1-33]
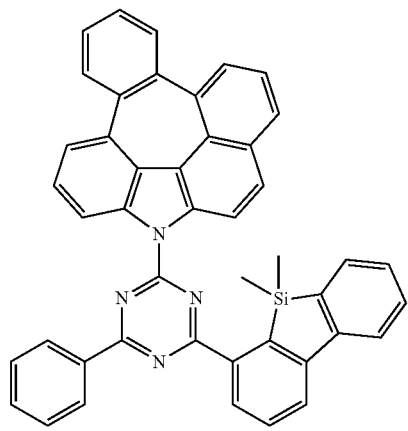
[1-36]
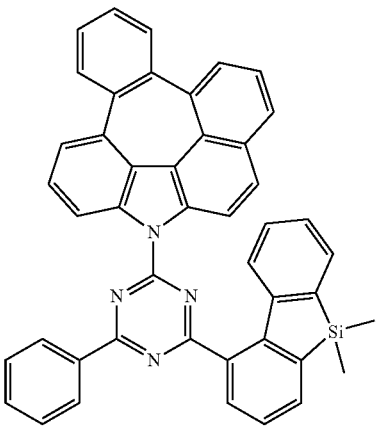
[1-34]
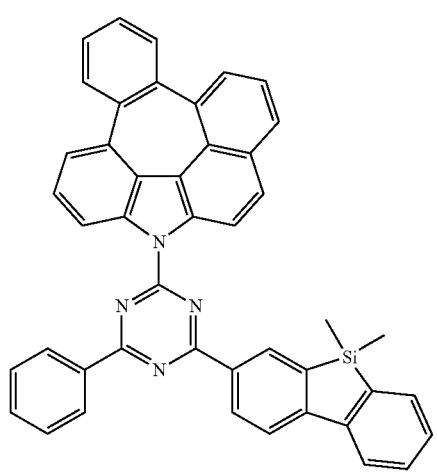
[1-37]
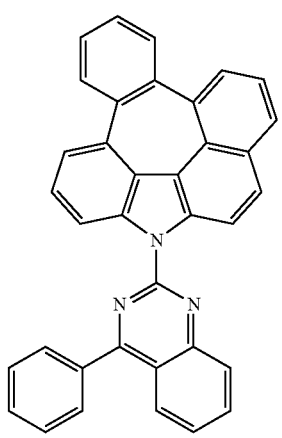
[1-35]
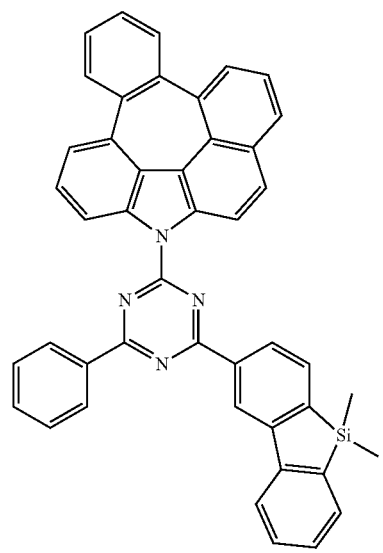
[1-38]
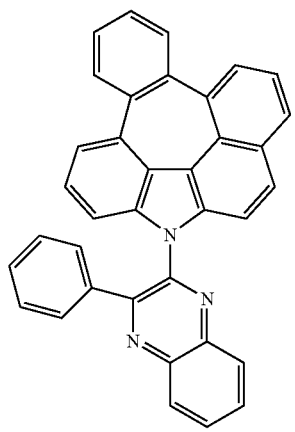

[1-39]

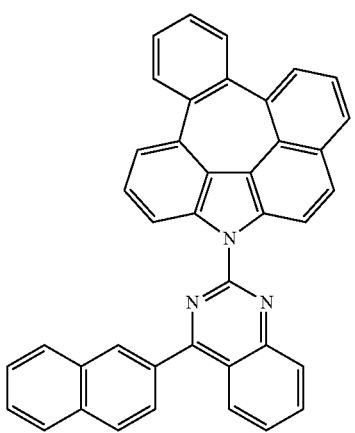

[1-40]

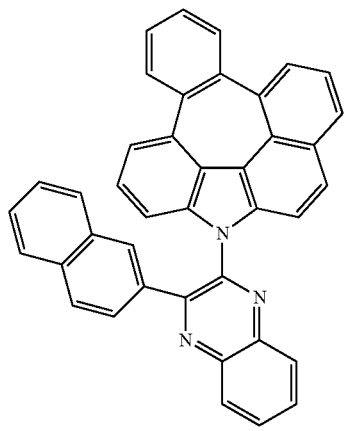

5. The composition as claimed in claim 1, wherein:
the second compound is represented by Chemical Formula 2A, Chemical Formula 2B, or Chemical Formula 2C,

[Chemical Formula 2A]

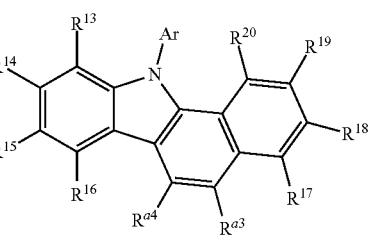

[Chemical Formula 2B]

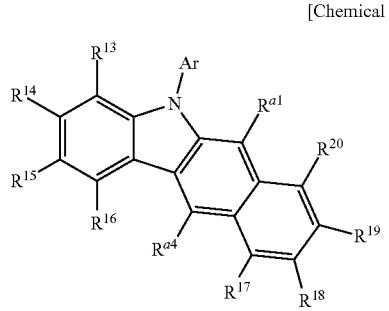

[Chemical Formula 2C]

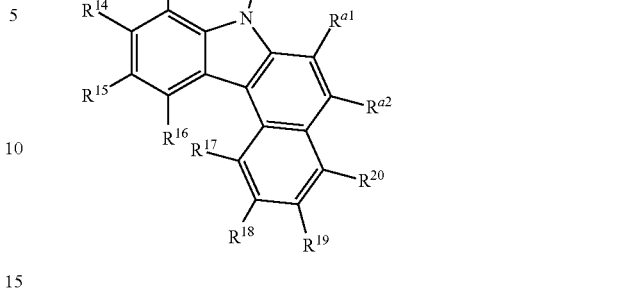

in Chemical Formula 2A to Chemical Formula 2C,

Ar and $R^{13}$ to $R^{20}$ are defined the same as those of Chemical Formulae 2 and 3, and $R^{a1}$ to $R^{a4}$ are each independently defined the same as $R^a$ of Chemical Formula 2.

6. The composition as claimed in claim 1, wherein Chemical Formula a is a group of Group II:

[Group II]

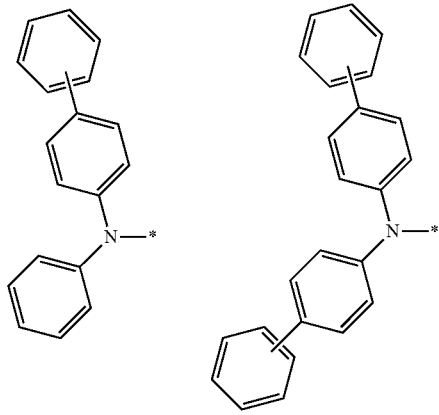

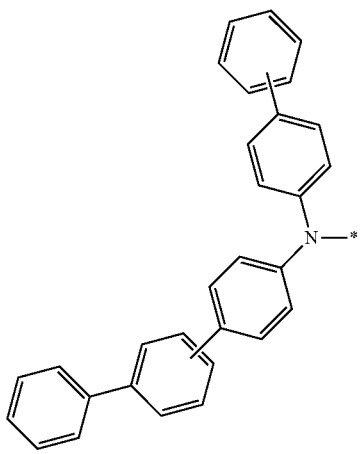

109
-continued
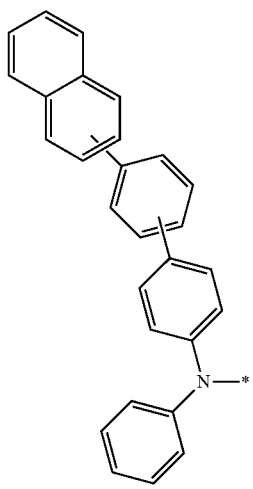
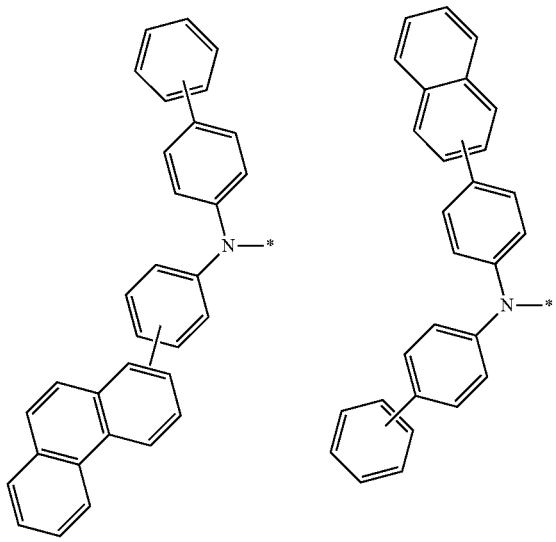
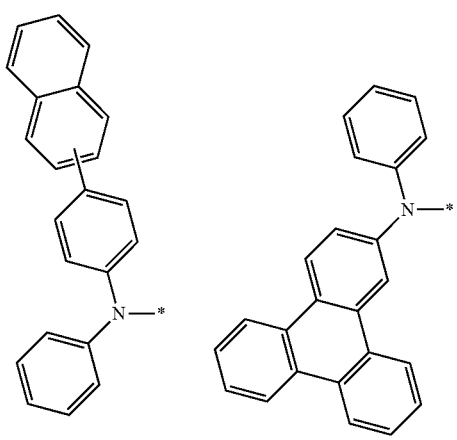
110
-continued
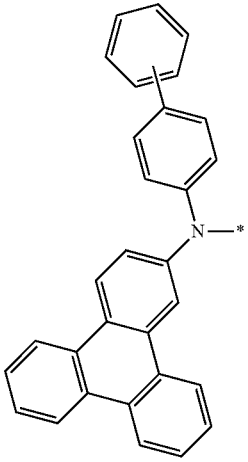 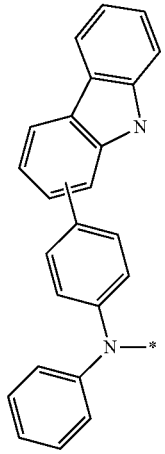
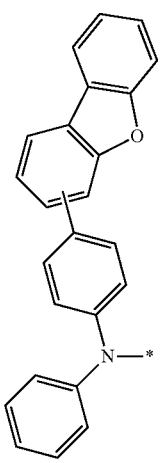 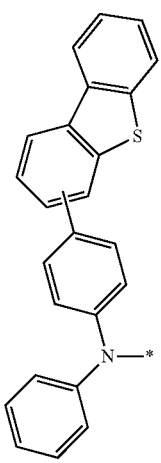 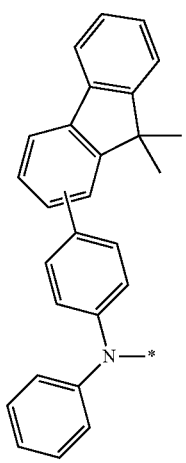
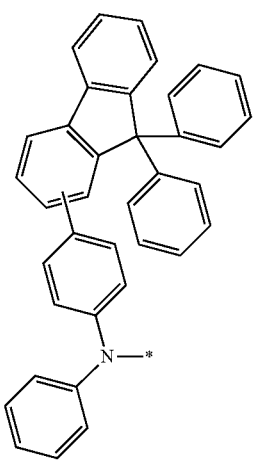 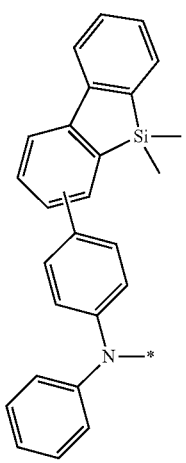

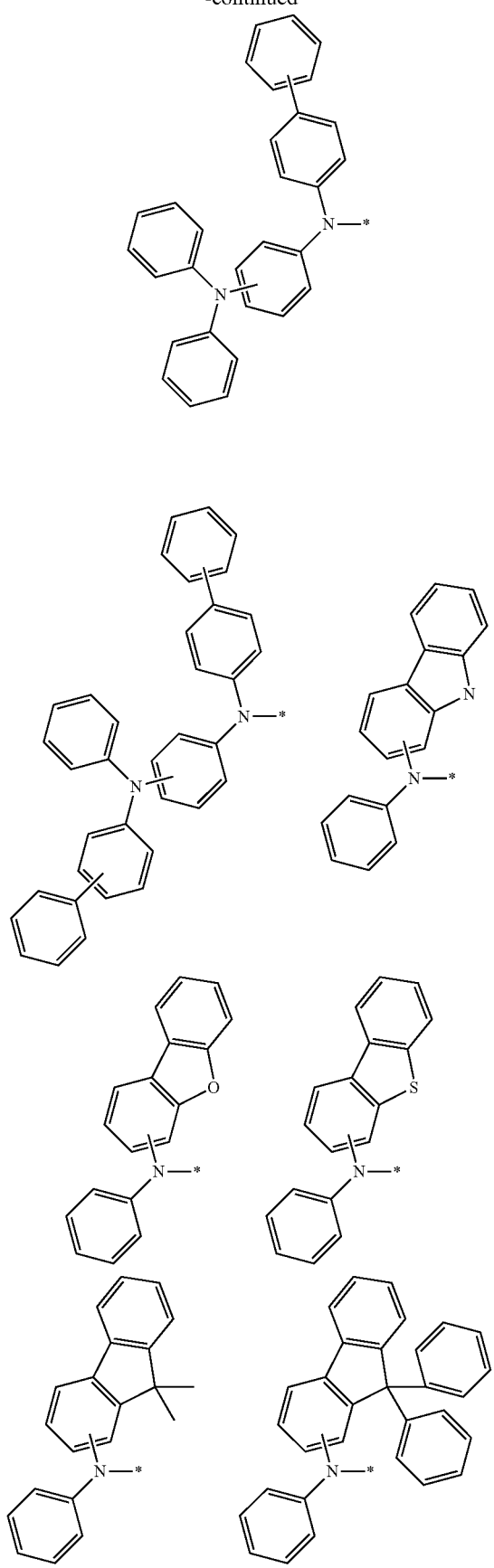

113
-continued
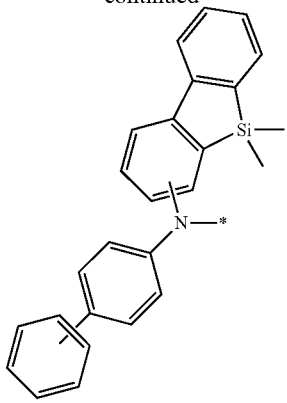
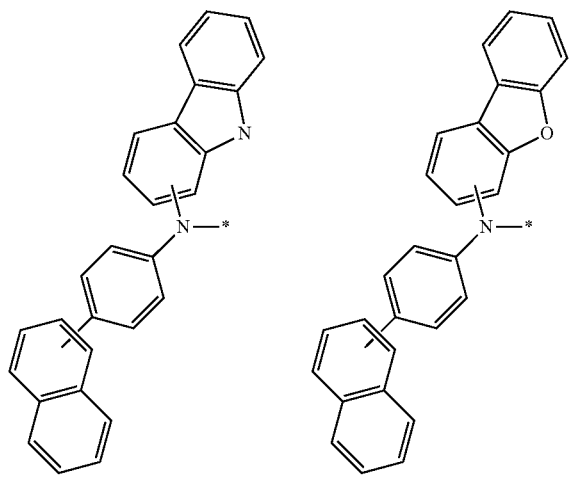
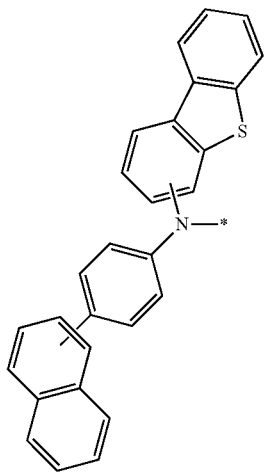
114
-continued
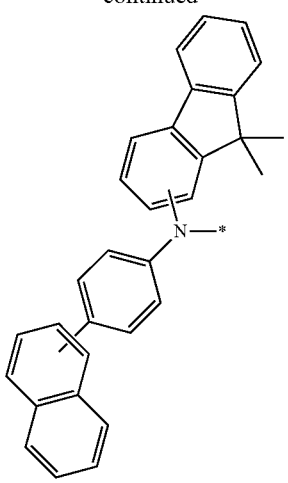
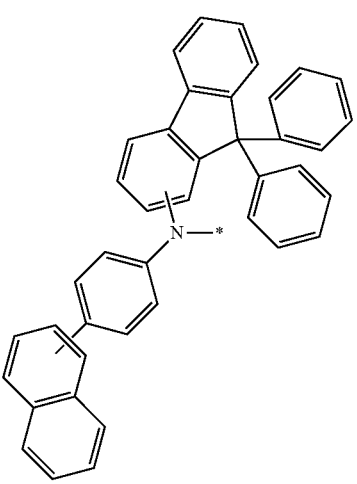
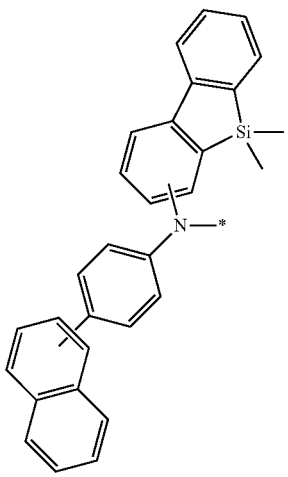

-continued

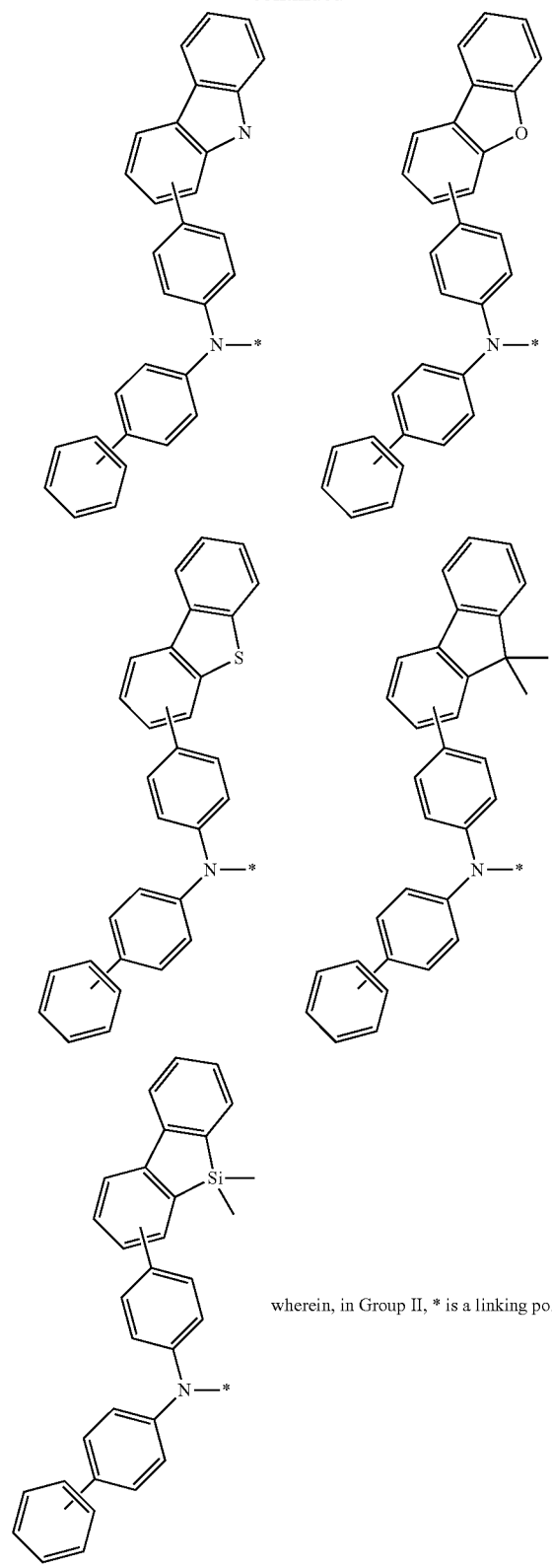

wherein, in Group II, * is a linking point.

7. The composition as claimed in claim 1, wherein:
the second compound is represented by Chemical Formula 2A-1, Chemical Formula 2A-2, Chemical Formula 2A-3, or Chemical Formula 2A-4,

[Chemical Formula 2A-1]

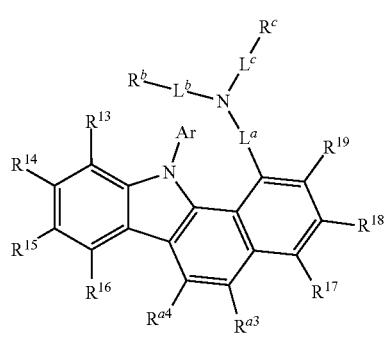

[Chemical Formula 2A-2]

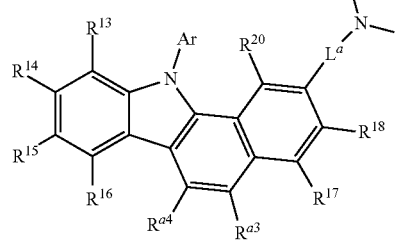

[Chemical Formula 2A-3]

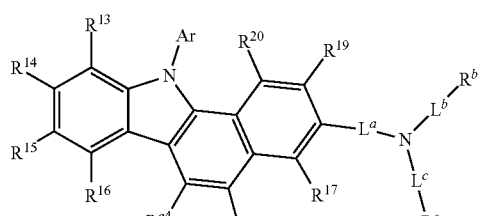

[Chemical Formula 2A-4]

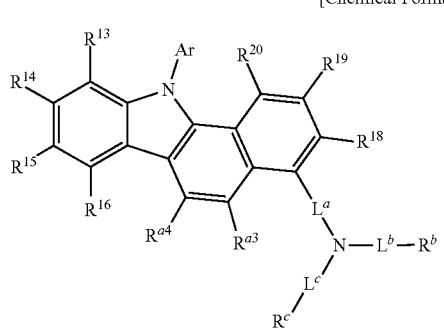

in Chemical Formula 2A-1 to Chemical Formula 2A-4,
Ar is a substituted or unsubstituted phenyl group, a substituted or unsubstituted biphenyl group, a substituted or unsubstituted terphenyl group, a substituted or unsubstituted naphthyl group, a substituted or unsubstituted anthracenyl group, a substituted or unsubstituted phenanthrenyl group, a substituted or unsubstituted triphenylenyl group, a substituted or unsubstituted fluorenyl group, a substituted or unsubstituted dibenzofuranyl group, a substituted or unsubstituted dibenzothiphenyl group, or a substituted or unsubstituted carbazolyl group,
$R^{a3}$, $R^{a4}$ and $R^{13}$ to $R^{20}$ are each independently hydrogen, deuterium, a cyano group, a substituted or unsubstituted C1 to C10 alkyl group, or a substituted or unsubstituted C6 to C12 aryl group, L$^a$ is a single bond, a substituted or unsubstituted phenylene group, a substituted or unsubstituted biphenylene group, a substituted or unsubstituted terphenylene group, a substituted or unsubstituted naphthylene group, a substituted or unsubstituted dibenzofuranylene group, or a substituted or unsubstituted dibenzothiophenylene group, L$^b$ and L$^c$ are each independently a single bond or a substituted or unsubstituted C6 to C12 arylene group, and R$^b$ and R$^c$ are each independently a substituted or unsubstituted phenyl group, a substituted or unsubstituted biphenyl group, a substituted or unsubstituted naphthyl group, a substituted or unsubstituted anthracenyl group, a substituted or unsubstituted phenanthrenyl group, a substituted or unsubstituted triphenylene group, a substituted or unsubstituted fluorenyl group, a substituted or unsubstituted arylamine group, a substituted or unsubstituted carbazolyl group, a substituted or unsubstituted dibenzofuranyl group, a substituted or unsubstituted dibenzothiophenyl group, or a substituted or unsubstituted dibenzosilolyl group.

8. The composition as claimed in claim 7, wherein the second compound is represented by Chemical Formula 2A-2.

9. The composition as claimed in claim 1, wherein the second compound is a compound of Group 2:

[Group 2]

[2-1]

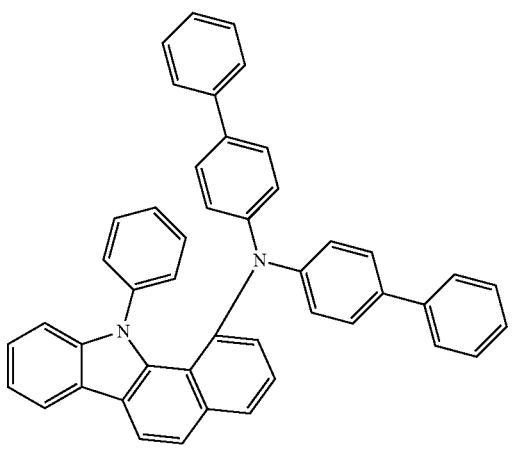

[2-2]

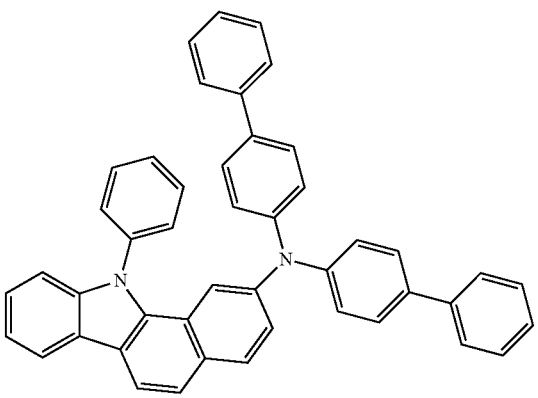

[2-3]

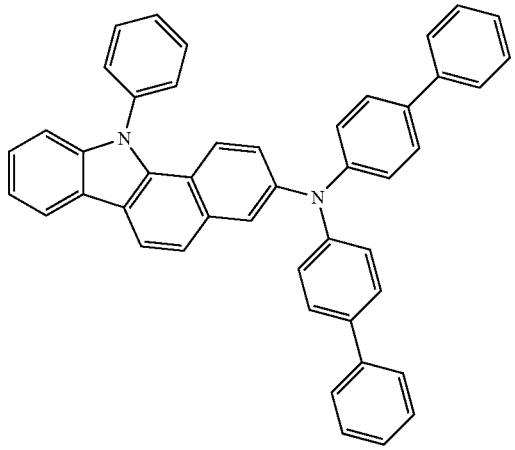

[2-4]

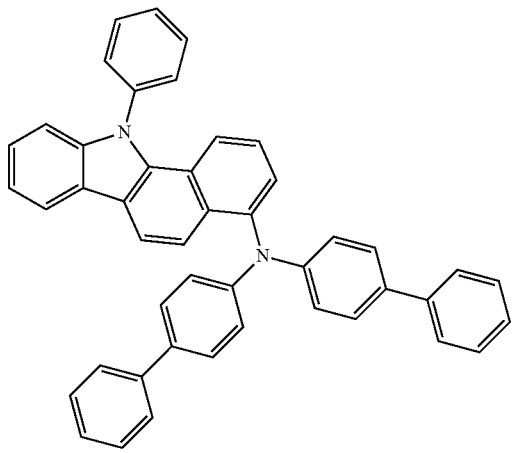

[2-5]

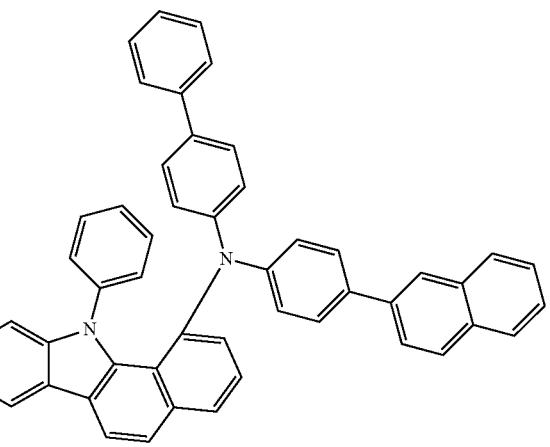

[2-6]
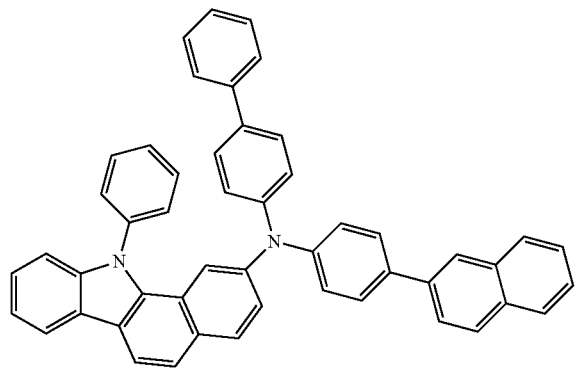
[2-7]
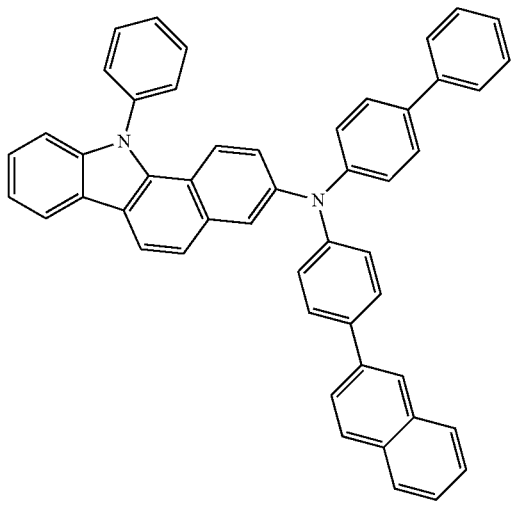
[2-8]
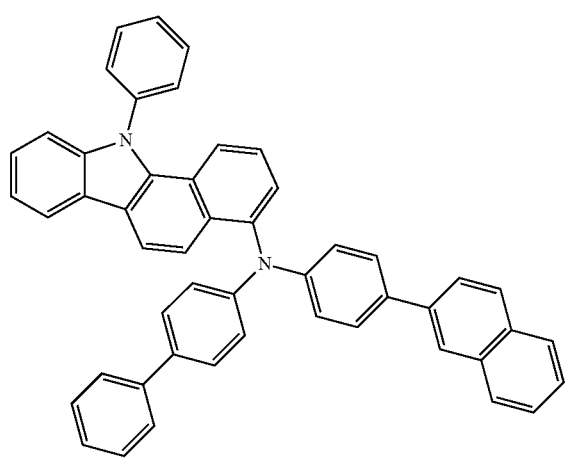
[2-9]
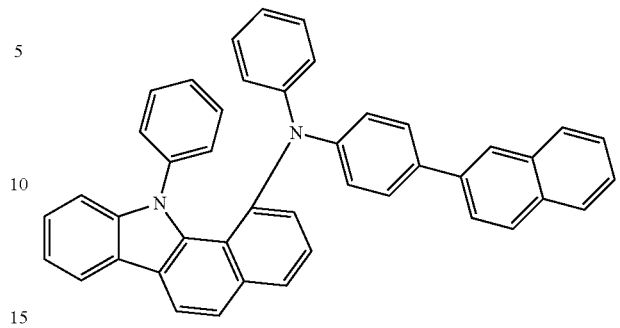
[2-10]
[2-11]
[2-12]

-continued
[2-13]
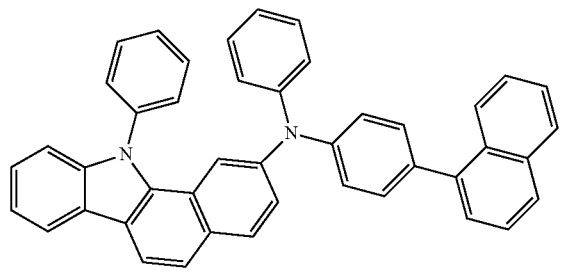
[2-14]
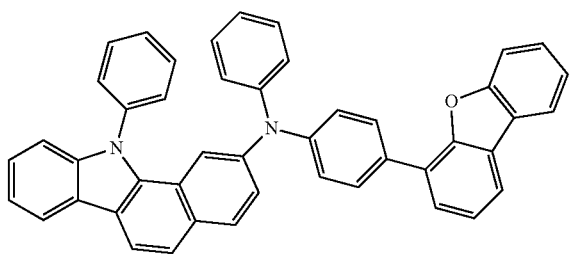
[2-15]
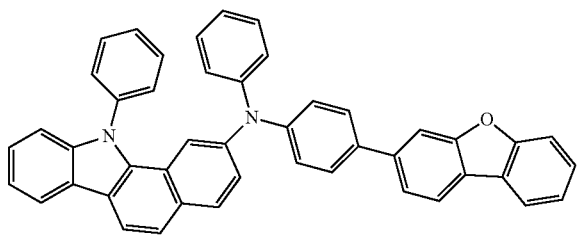
[2-16]
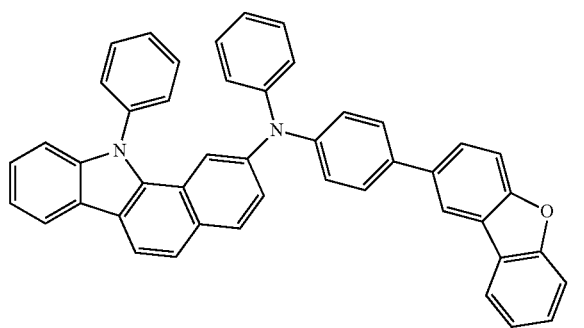
[2-17]
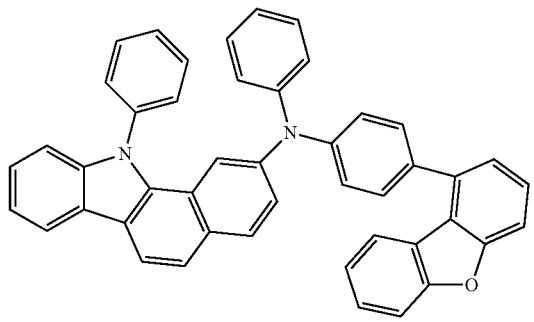
-continued
[2-18]
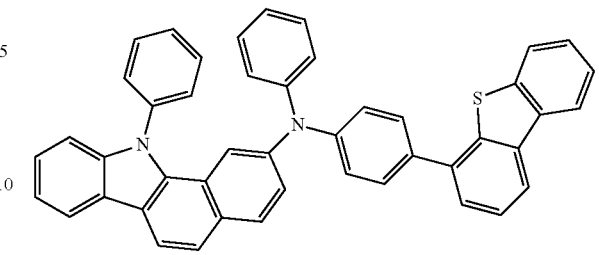
[2-19]
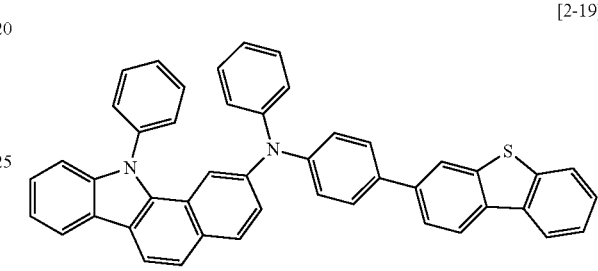
[2-20]
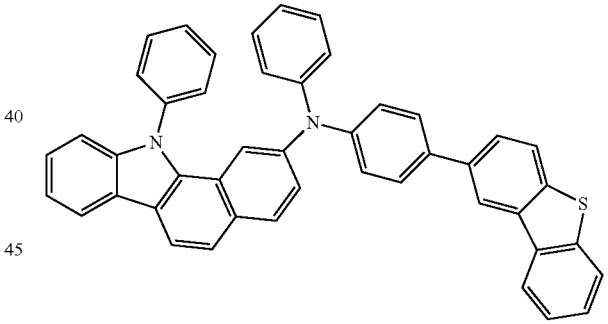
[2-21]
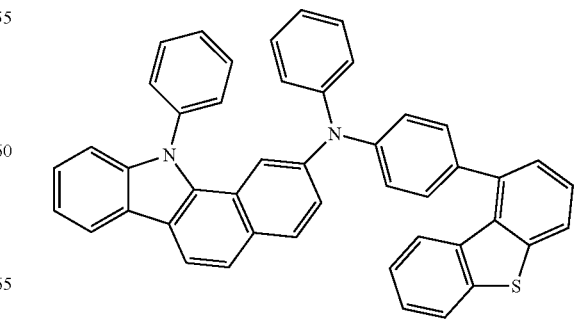

[2-22]
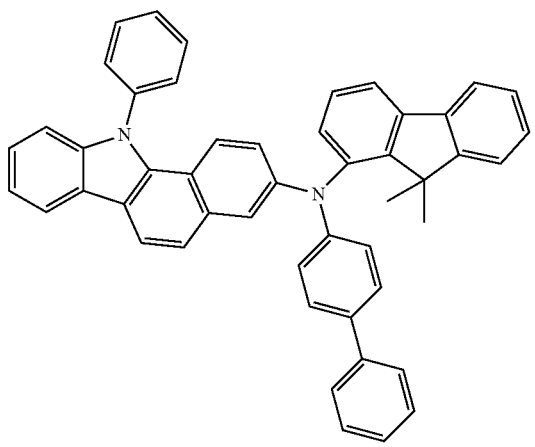
[2-23]
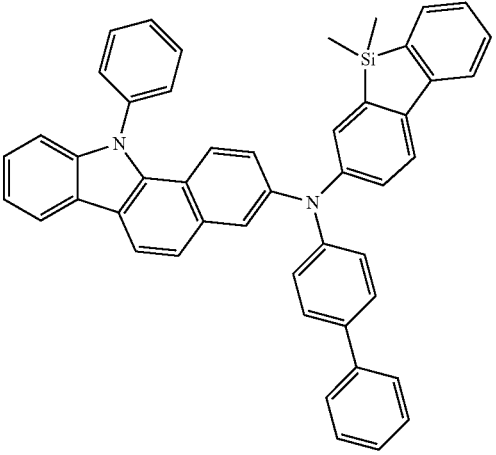
[2-24]
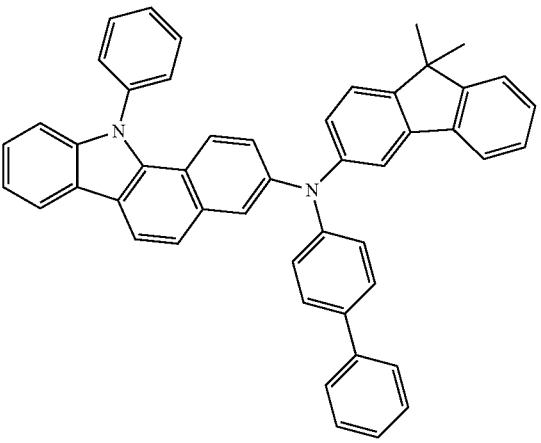
[2-25]
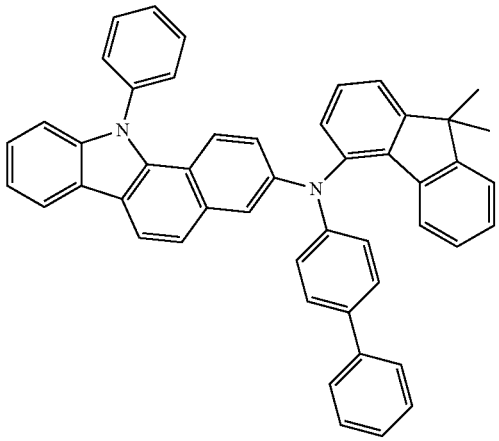
[2-26]
[2-27]
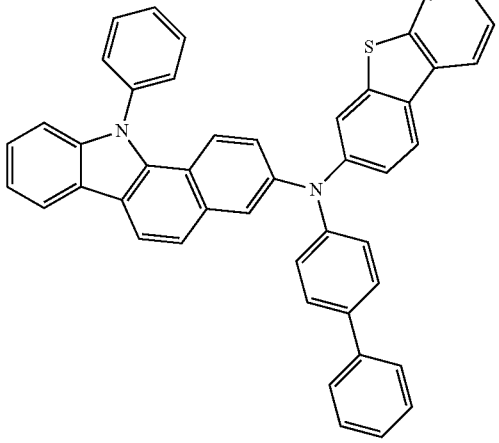

[2-28]
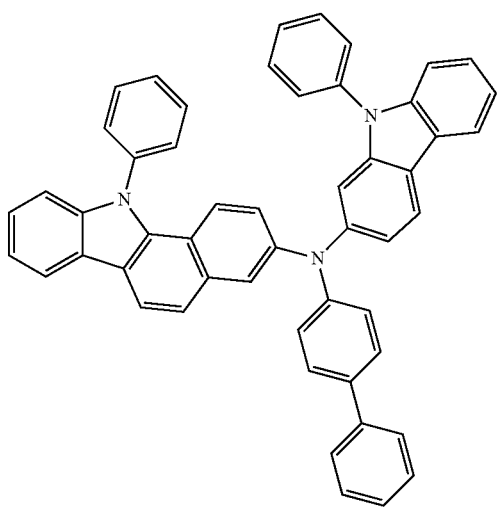
[2-32]
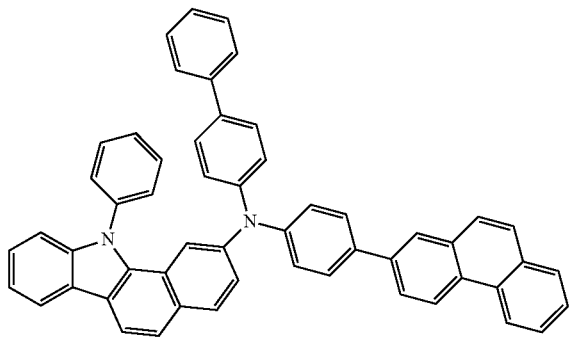
[2-29]
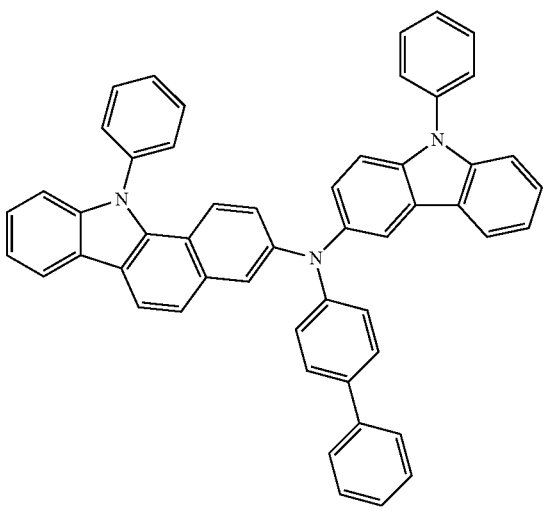
[2-33]
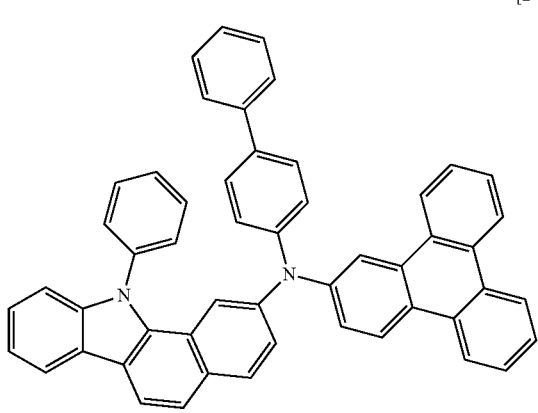
[2-30]
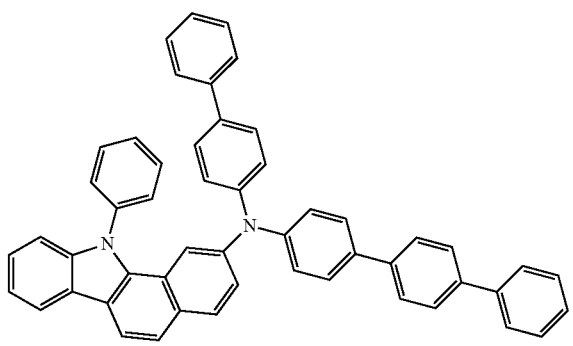
[2-34]
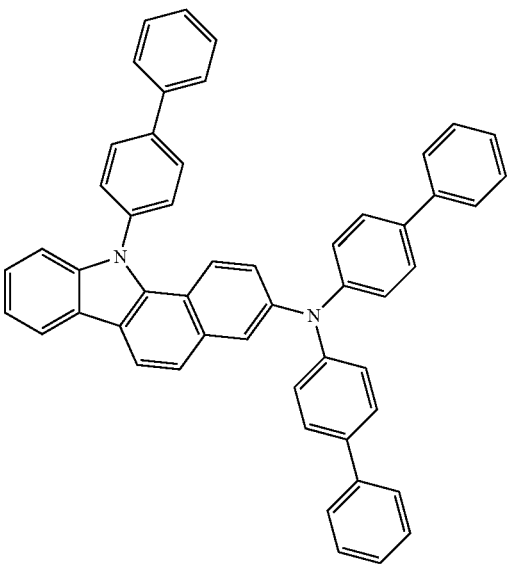
[2-31]

-continued
[2-35]
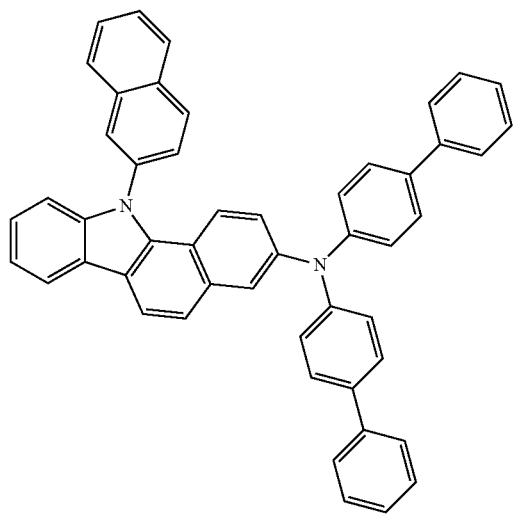
[2-36]
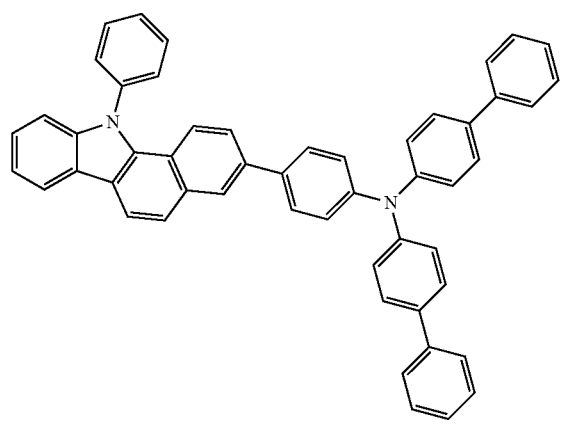
[2-37]
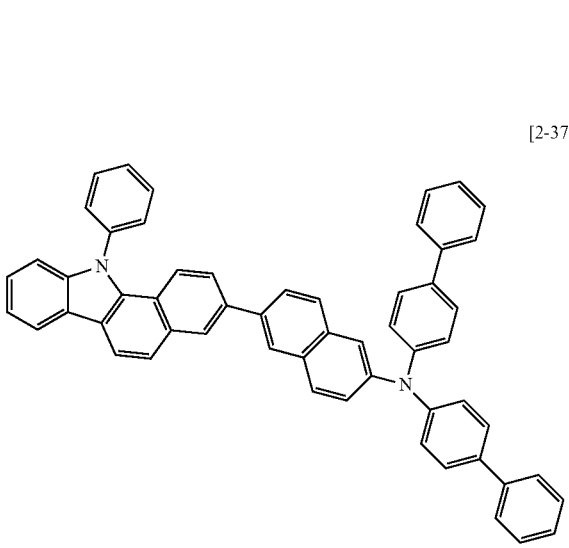
-continued
[2-38]
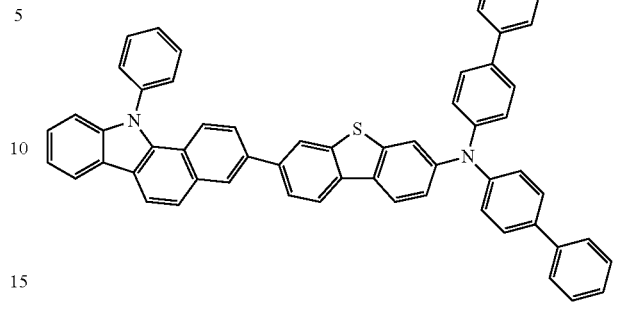
[2-39]
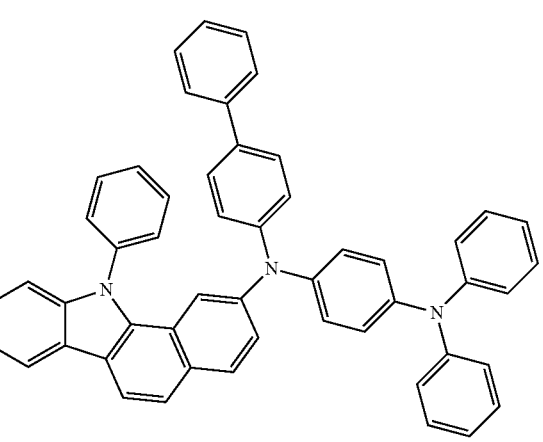
[2-40]
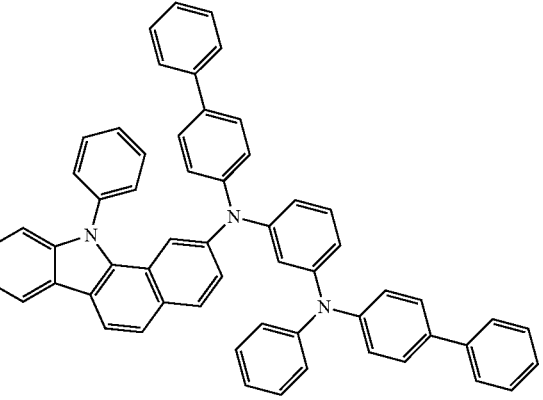
[2-41]
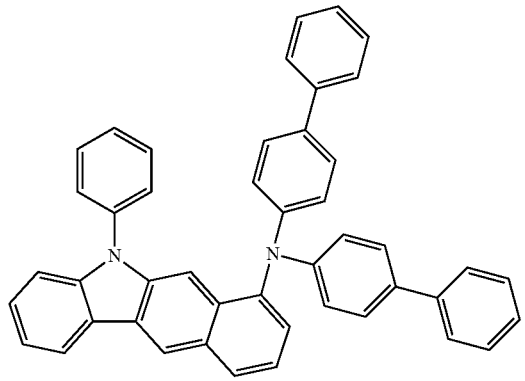

[2-42]
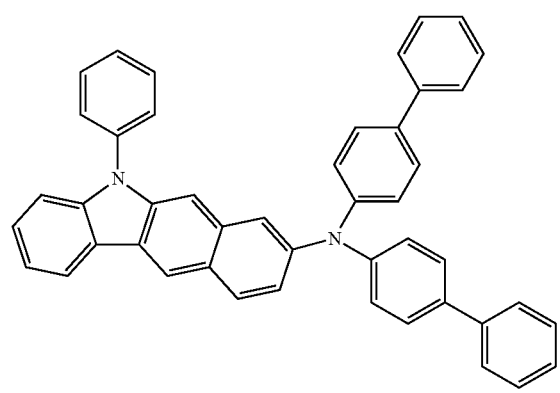
[2-43]
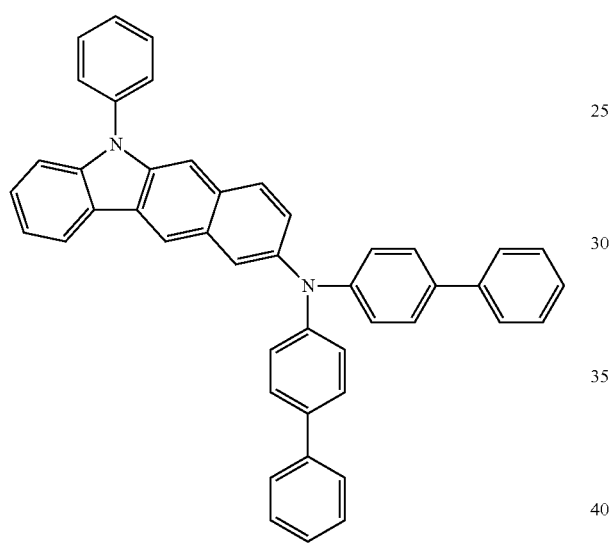
[2-44]
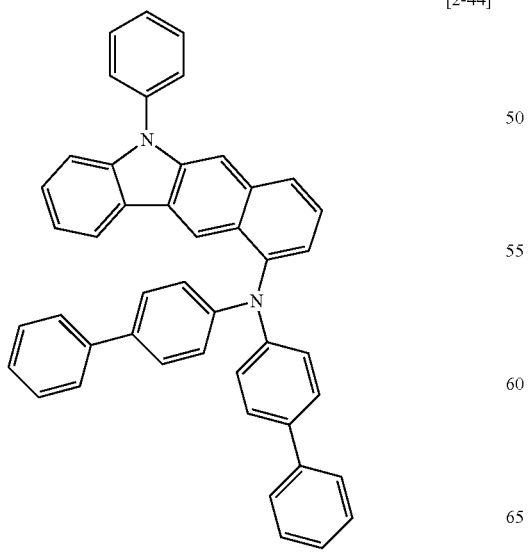
[2-45]
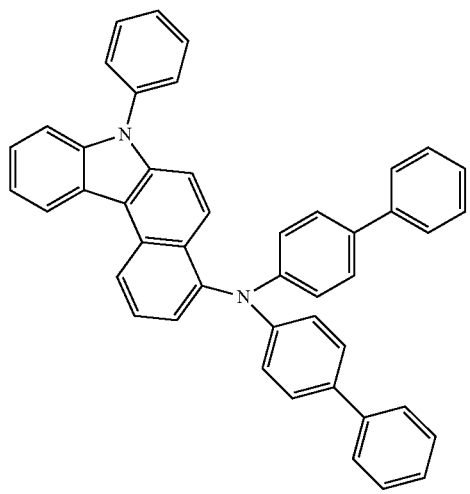
[2-46]
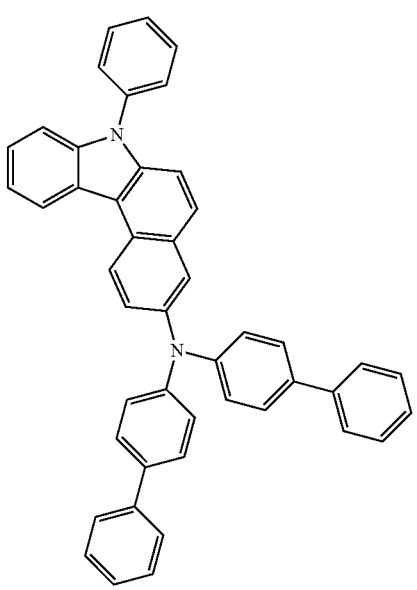
[2-47]
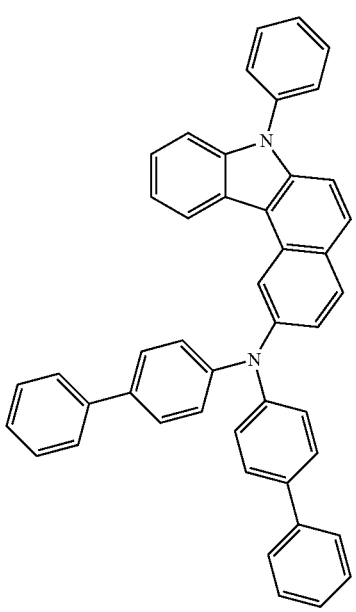

[2-48]
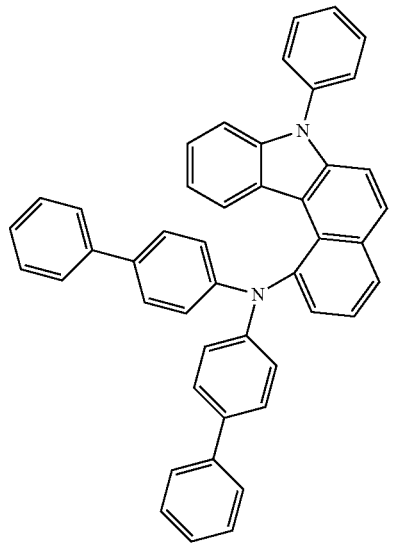
[2-51]
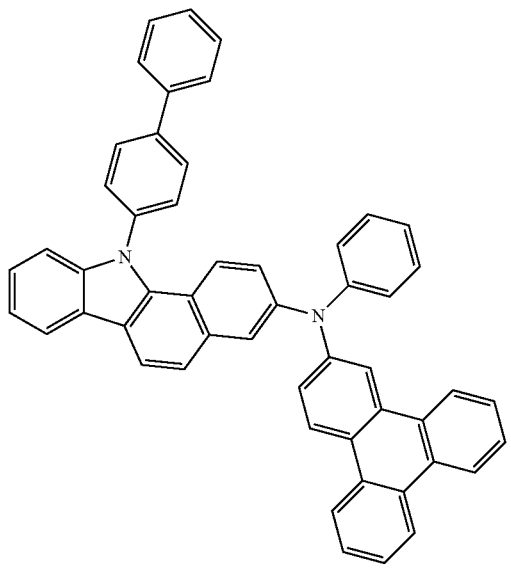
[2-49]
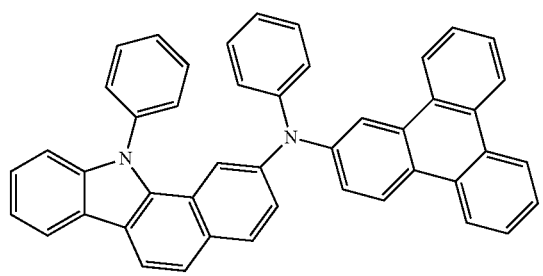
[2-52]
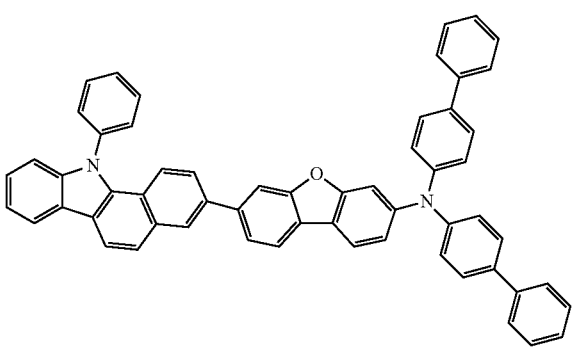
[2-50]
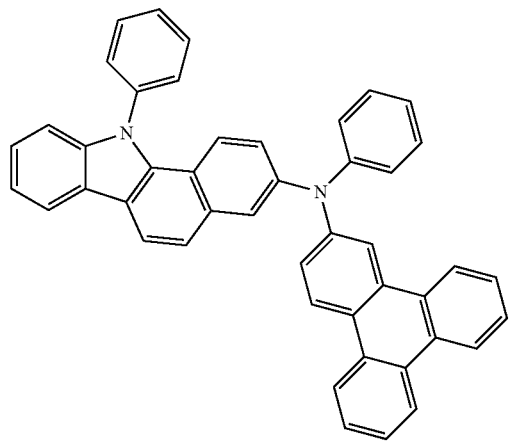
[2-53]
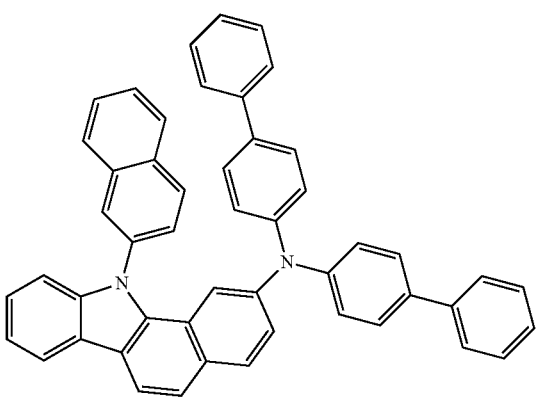

[2-54]
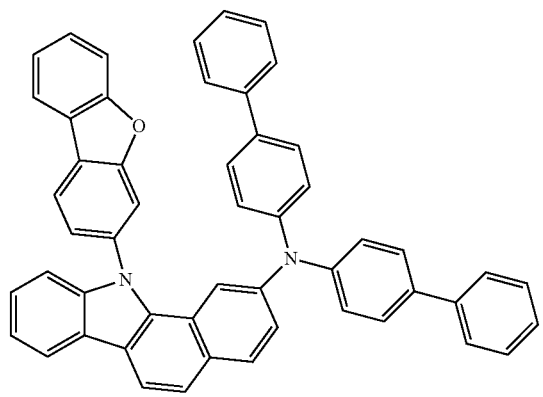
[2-55]
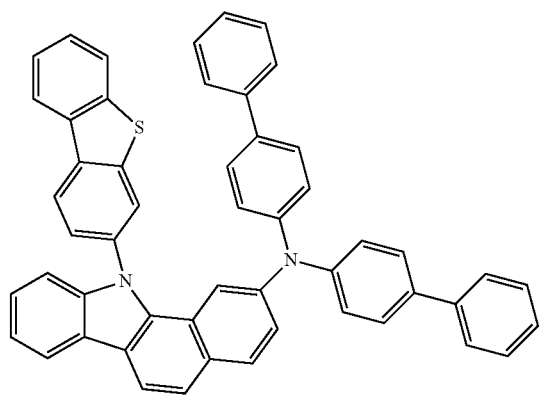
[2-58]
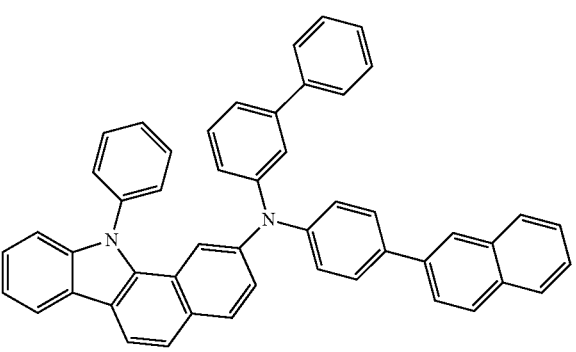
[2-59]
[2-56]
[2-60]
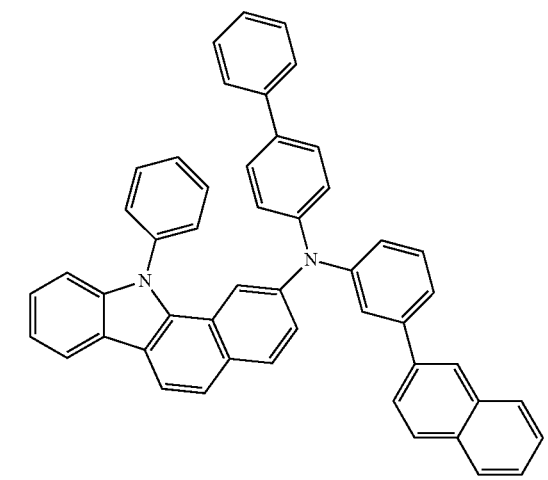
[2-57]
[2-61]
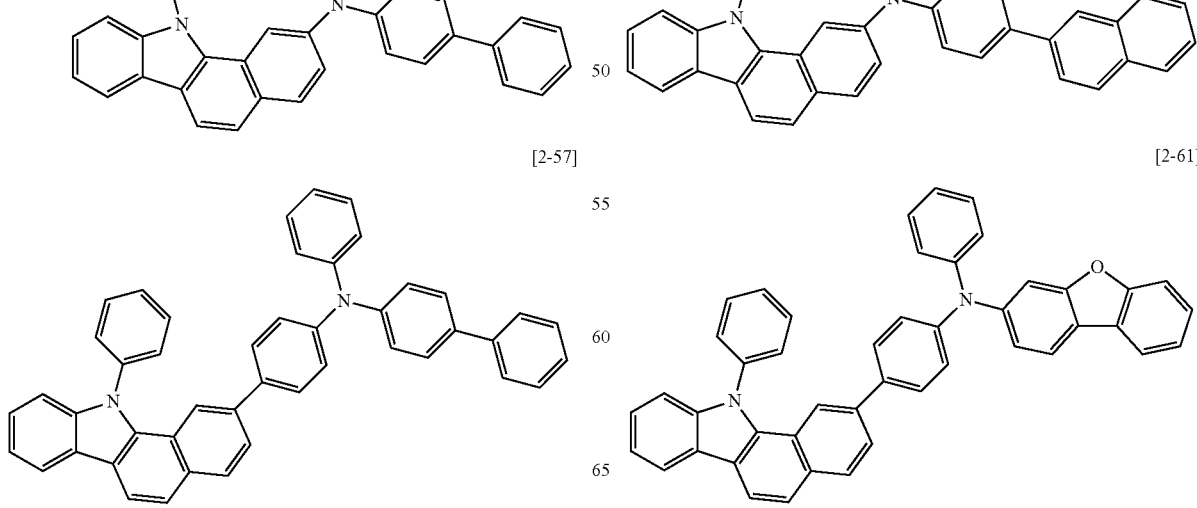

[2-62]
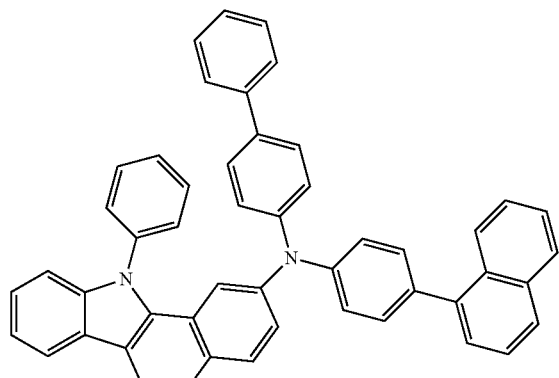

[2-63]
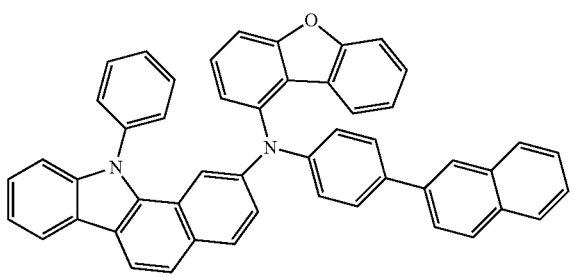

[2-64]
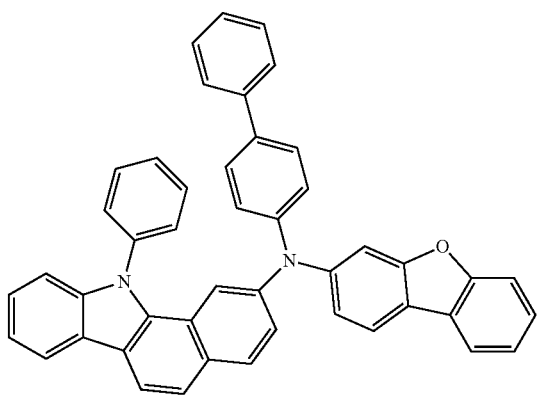 [SMILES: c1ccc(-c2ccc(N(c3ccc4c(c3)oc3ccccc34)c3ccc4ccc5c6ccccc6n(-c6ccccc6)c5c4c3)cc2)cc1]

[2-65]
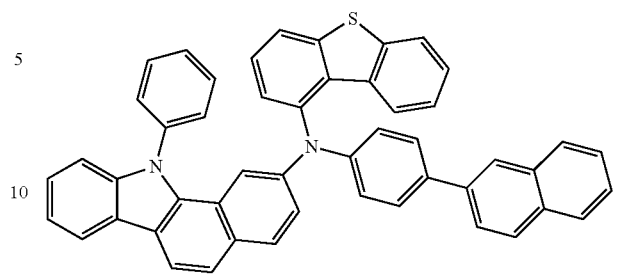

[2-66]
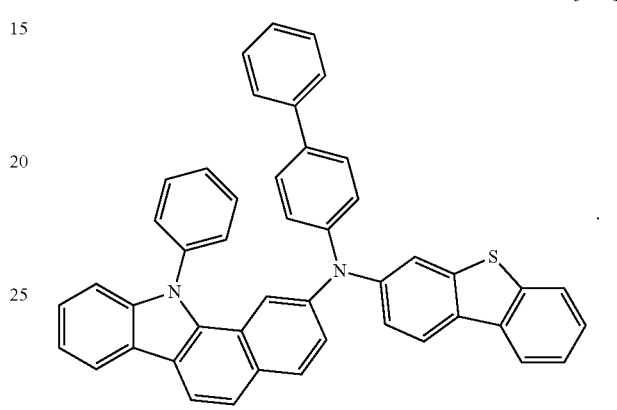

10. An organic optoelectronic device, comprising:
an anode and a cathode facing each other, and
at least one organic layer between the anode and the cathode,
wherein:
the at least one organic layer includes a light emitting layer, and
the light emitting layer includes the composition for an organic optoelectronic device as claimed in claim 1.

11. The organic optoelectronic device as claimed in claim 10, wherein the composition for an organic optoelectronic device is a host of the light emitting layer.

12. The organic optoelectronic device as claimed in claim 10, wherein the composition for an organic optoelectronic device includes the first compound and the second compound in a weight ratio of about 1:99 to 99:1.

13. A display device comprising the organic optoelectronic device as claimed in claim 10.

* * * * *